US006498348B2

(12) United States Patent
Aitken

(10) Patent No.: US 6,498,348 B2
(45) Date of Patent: Dec. 24, 2002

(54) APPARATUS AND METHOD RELATING TO CHARGED PARTICLES

(75) Inventor: Derek Aitken, East Molesey (GB)

(73) Assignee: Superion Limited, Surrey (GB)

( * ) Notice: Subject to any disclaimer, the term of this patent is extended or adjusted under 35 U.S.C. 154(b) by 0 days.

(21) Appl. No.: 09/736,253

(22) Filed: Dec. 15, 2000

(65) Prior Publication Data

US 2002/0043621 A1 Apr. 18, 2002

Related U.S. Application Data

(63) Continuation of application No. PCT/GB99/01879, filed on Jun. 15, 1999.

(30) Foreign Application Priority Data

Jun. 19, 1998 (GB) .............................. 9813327

(51) Int. Cl.$^7$ ............................... H01J 49/00
(52) U.S. Cl. ............................ 250/396 ML; 250/396 R
(58) Field of Search ....................... 250/396 R, 396 ML

(56) References Cited

U.S. PATENT DOCUMENTS

| | | | |
|---|---|---|---|
| 3,141,993 A | * 7/1964 | Hahn | ........................... 315/31 |
| 4,578,589 A | 3/1986 | Aitken | |
| 4,634,931 A | * 1/1987 | Taya et al. | .............. 315/111.81 |
| 4,823,011 A | * 4/1989 | Stengl et al. | ............. 250/491.1 |
| 5,393,984 A | * 2/1995 | Glavish | ............... 250/396 ML |
| 5,969,470 A | * 10/1999 | Druz et al. | .............. 313/359.1 |
| 6,194,730 B1 | * 2/2001 | Chalupka et al. | ........ 250/396 R |

OTHER PUBLICATIONS

The Physics and Technology of Ion Sources, "Ion Extraction", Ed. Ian G. Brown, John Wiley & Sons, Chapter 3, (1989).

"The Use of Isotope Separators for Ion Implantation", Proc. Roy. Soc., J.H. Freeman, A311, pp. 123–130 (1969).
"A Variable Geometry Separator and Low Energy Heavy Ion Accelerated", Proc. Intl. Mass Spectroscopy Conf., Kyoto, Japan, J.H. Freeman, pp. 420–430 (1969).
"Special Extraction Systems", The Physics and Technology of Ion Sources, R. Keller, Ed. Ian G. Brown, John Wiley & Sons, Chapter 3, pp. 46–50 (1989).
"Effect of Extended Fringing Fields on Ion–Focusing Properties in Deflecting Magnets", H. Enge, Rev. Sci. Inst., vol. 35, No. 9, pp. 278–287 (1964).
Introduction to Electron and Ion Optics, P. Dahl, Academic Press, pp. 51–52 (1973).
Introduction to Electron and Ion Optics, P. Dahl, Academic Press, p. 68 (1973).
"Low Energy Beam Extraction in terms of Magnetic Field, Electric Field and Ion Optics", H. Ito and N. Bryan, Proc. $11_{th}$ Int. Conf. Ion Imp. Tech., Austin, Texas, pp. 323–326, (1996).

(List continued on next page.)

Primary Examiner—Kiet T. Nguyen
(74) Attorney, Agent, or Firm—Pillsbury Winthrop LLP

(57) ABSTRACT

The present invention provides an apparatus for acting upon charge particles in dependence upon on or more parameters including mass and/or energy and/or charged state of the particles. The apparatus includes an array of elongate magnetic poles extending longitudinally in an elongation direction of the array; an array reference surface extending in the array elongation direction and passing through the array with a magnetic pole on each side of the reference surface; a means for providing charged particles entering into or originating in the field of the magnetic pole array. The magnetic poles are configured in a plane perpendicular to the elongation direction to give parameter dependent change of direction to charged particles moving in array with a direction of movement substantially parallel to the reference surface, whereby parameter dependent selection of charged particles may be achieved by parameter dependent dispersion in a plane transverse to the reference surface.

43 Claims, 29 Drawing Sheets

OTHER PUBLICATIONS

"The Applied Materials xRLEAP Ion Implanter for Ultra Shallow Junction Formation", J. England, L. Joyce, C. Burgess, S. Moffatt, M. Foad, Proc. 11$^{th}$ Int. Conf. Ion Imp. Tech., Austin, Texas, IEEE Cat No. 96$^{th}$8182, pp. 470–473 (1996).

"Introduction to Electron and Ion Optics", P. Dahl, Academic Press, p. 26 (1973).

Ion Implantation Techniques, Ed. H. Ryssel and G. Glawisching, Springer Verlag, D. Aitkin, p. 355, (1982).

"A New Approach to Ion Implanter Mass Analysis Optics", D. Aitken, Vacuum, vol. 36, pp. 953–960, (1986).

\* cited by examiner

Fig.1D
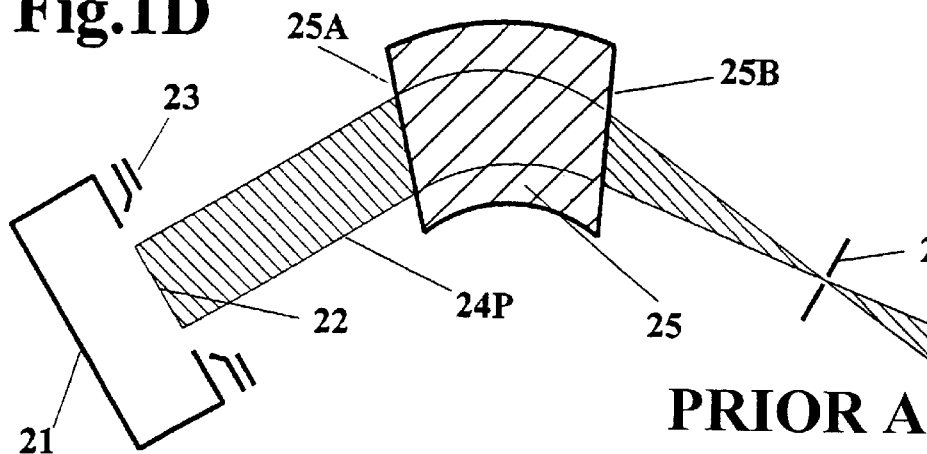
PRIOR ART
Fig.1E
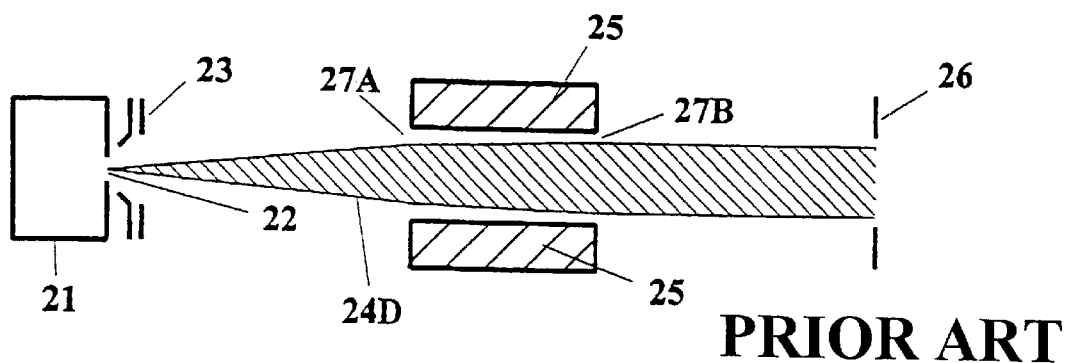
PRIOR ART
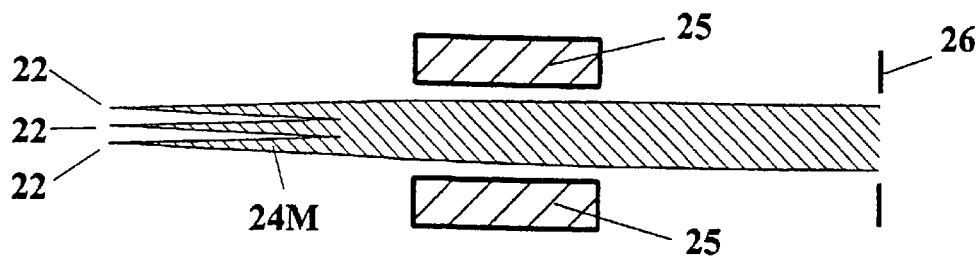
Fig.1F
PRIOR ART

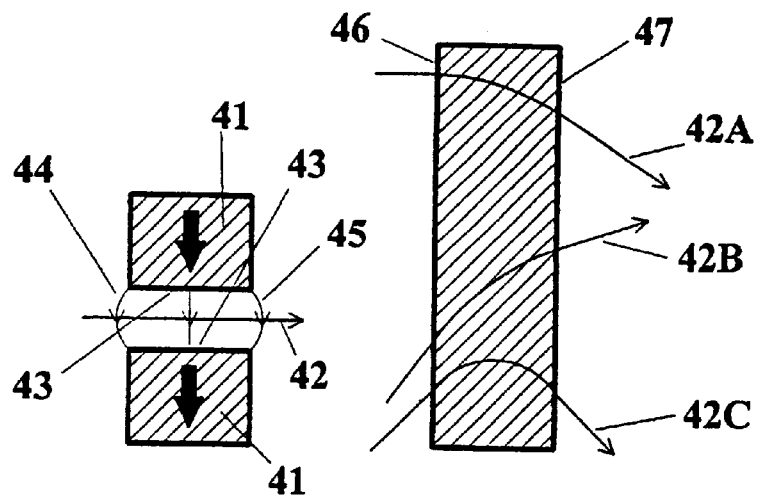
Fig.4A    Fig.4B
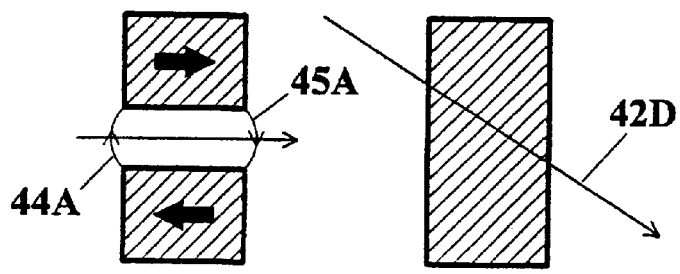
Fig.4C    Fig.4D
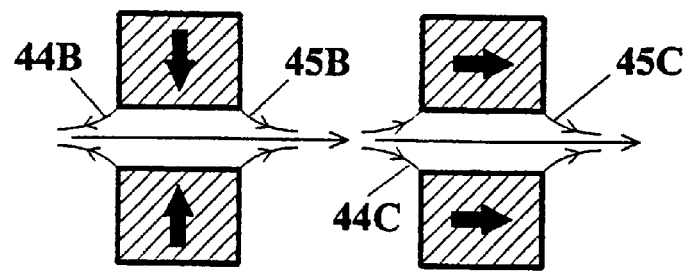
Fig.4E    Fig.4F

APPARATUS AND METHOD RELATING TO CHARGED PARTICLES

This is a Continuation of International Application. No. PCT/GB99/01879 filed Jun. 15,1999 which designated the U.S., and that International Application published under PCT Article 21(2) in English.

The present invention relates to apparatus and methods for acting on charged particles. The invention relates in particular, but not exclusively, to a charged particle focusing system using magnetic fields to achieve mass (and energy) dependent focusing of a charged particle beam, or series of charged particle beams, so that very high beam currents of mass analysed charged particles, typically positive ions, can be extracted from a multiple slot source and transmitted without any substantial change in particle current distribution in a plane containing the nominal beam direction and at right angles to the plane of mass dispersion. More specifically, a series of uniform ribbon ion beams can be extracted from a multiple slot ion source and mass analysed to achieve high beam purity without disturbing the uniformity or geometry of the ribbon beam. In other aspects the invention relates to means for using elements analogous to optical elements as part of a system to achieve optimum performance for particular requirements and circumstances; and to means for removing the particle masses not transmitted from the system where their continuous build up might lead to undesirable consequences; and to means for preventing the high currents produced from causing surface charging problems on semiconductor wafers or flat panel display substrates; and to means for achieving the required ion source and extraction conditions necessary for the successful application of this invention.

At the end of this specification there is set out a list of references which will be referred to in this specification to assist understanding of the invention, the contents being incorporated herein by reference. Ions are extracted from ion sources [1] and magnetically analysed to achieve mass separation [2] in order to produce a high purity, directed beam of ions (usually positive ions) which can be used to implant into various substrates, of which semiconductor wafers, solar cells and flat panel displays are important commercial examples. Existing technology predominantly uses a system of analysis which will be referred to as 'conventional mass separator' optics [3] which restricts the system to the production and analysis of a single ion beam with a significant constraint on the size (and beam current) of that single ion beam.

In U.S. Pat. No. 4,578,589 there is described firstly a conventional apparatus for producing a mass analysed ribbon beam of charged particles in which the ribbon beam is analysed by dispersion in a plane perpendicular to the slot producing the ribbon beam. This is followed by a description of the invention of that prior patent, in which a ribbon beam is mass analysed by dispersion in a plane parallel to the slot producing the ribbon beam. The first known system will now be described briefly with reference to FIGS. 1a to 1c of the present specification, followed by a description of the second form of known apparatus, described with reference to FIGS. 1d to 1e of the present specification.

FIG. 1a shows the dispersion plane (the plane in which there is dispersion of the ion beam into many directions according to their (mass)×(energy) product and charge state) of a conventional mass separator. The ion beam can be extracted from the ion source [4] as a circular beam, but where a high beam current is required it is usual to extract from a long slot (long in this context being typically a 10:1 aspect ratio or more). The ion source 11 produces ions which are extracted from the ion source aperture 12 (circular or long slot) using electrically biased extraction electrodes 13 to form an ion beam 14 (with an energy determined by the extraction voltage) which typically diverges from the ion source extraction region. The ion beam is then passed between the poles of an analysing magnet 15 as also shown in a side view in FIG. 1b, the beam in this case being a parallel ribbon beam 14A. This magnet has two functions, one being to achieve mass dispersion and the other being to focus the beam so that mass analysis can be achieved at the resolving slit 16. It is necessary to focus through a resolving slit so that slightly lower ion masses (deflected through a larger angle) or slightly higher masses (deflected through a smaller angle) are not transmitted. This analysis technique does not allow the use of multiple ion beams (as viewed in the dispersion plane of FIG. 1a) and the size of the beam in the extraction slot plane is limited by size of the magnet pole gap. The size and therefore the cost of the magnet, and its power consumption (for an electromagnet) are important commercial considerations. One technique that has been used to improve this situation is shown in FIG. 1c. The use of a curved extraction geometry [5] to produce a converging ribbon beam in the plane containing the axis of the long extraction slot (referred to as the 'ribbon plane') with a beam crossover in the magnet pole gap, increases the size of the beam which can be transmitted through a particular size pole gap. If, as is usually the case, a parallel beam is required, then an optical element 17 focusing in the ribbon plane is required to produce a parallel beam (such as a curved electrode acceleration system [5]) is required after the resolving slit. Referring again to FIG. 1a, the divergence in the dispersion plane, which is normally small (typically a half-angle of 1–3°), may be acceptable for ion implantation; if it is not then an optical element 18 in the dispersion plane can be used to create a parallel beam before arrival at the target 19. The optical components 17 and 18 may be separate or achieved in a single optical element.

In order to overcome the current limitations imposed by conventional mass separator optics, the previous invention [6] by the present inventor (in U.S. Pat. No. 4,578,589) achieved improvement by placing the long ion source slot in (or parallel to) the dispersion plane. This removed the practical correlation between the length of the slot and the pole gap required in the analysing magnet and made it possible to analyse beams from a series of long slots. FIG. 1d shows the dispersion plane of such a system with a parallel beam 24P (in the dispersion plane) leaving the ion source 21, from a long slot 22 and extraction electrodes 23 and entering the analysing magnet 25, the apparent object position being at infinity. The length of the slot is limited only by the acceptable divergence from the resolving slit 26 (from the point of view of the angular acceptance of the rest of the ion beam system) and the maximum acceptable length from the magnet exit to the resolving slit. Multiple slots, one above the other, see the same geometry in the dispersion plane. FIG. 1e shows a side view along the axis of the long slot, the beamline being unfolded into a single plane for convenience of illustration. A divergent beam 24D is shown leaving the ion source 21, its outlet aperture 22 and the beam forming extraction electrodes 23. The beam enters an angled entry analysing magnet field which (for this particular angle of entry) produces a convergent lens 27A (a well known technique for achieving useful converging or diverging focusing [7]), which significantly reduces the divergence of the beam, and then is focused more at the angled exit region 25B and 27B, ideally producing a near parallel beam. FIG.

1*f* shows a source-to-magnet view of a multiple (three) beamlet beam 24M from three outlet apertures 22. The direction of each of the beamlets in the extraction region is chosen for optimum transmission through the analysing magnet.

The two mass analysis techniques described above represent the known relevant prior art with regard to overall system design. Other relevant prior art includes the angled entry focusing [7] already mentioned, and magnetic multipole focusing.

Magnetic multipole focusing is commonly used in accelerator beamlines [8], the most commonly used being the quadrupole lens. This lens is shown in FIG. 2. A beam travelling in the direction of the z-axis 30 (normal to the x and y axes) will experience the action of two focusing planes yz 31 and xz 32. One of these planes will be a diverging lens and the other a converging lens, depending on direction of magnetisation, beam direction along the z-axis and particle charge polarity. When two quadrupole lenses are used in combination with alternate magnetic polarity, the overall focusing in both planes can be converging [9]. The important aspect of the prior art use of these lenses is that the general direction of charged particle beam propagation is along the axis 30 of the lens (the z-direction) and is a beam of circular symmetry.

The limitation of the existing prior art technology has always been the high cost associated with producing high beam currents and the situation is becoming increasingly severe as the result of the increasing demand for low energy ion beams. The requirement for low energy tends to lead either to a reduced extraction voltage with a consequent loss of beam current [10], the use of 'accel/decel' extraction as described in the present inventor's previous patent [6] or separate deceleration of the beam [11] after extraction and before or after magnetic analysis. These techniques are limited by space charge problem limitations and beam aberrations caused by trying to maximise the current density in the beam in order to maximise overall beam current.

These problems can be overcome either by not using analysis at all, or by conceiving an analysis geometry that does not limit the length of the outlet slot of the ion source or does not limit the number of slots. It is generally concluded that the first option (no mass analysis) is not a viable option for integrated circuit technology as the beam purity requirements are too severe. It has been considered to be viable for flat panel display implant, basically on grounds of cost rather than desirability.

The ideal solution to the beam current limitation problem is a mass analysis technique that can be used with any number of any length ion source outlet slots.

According to the present invention in a first main aspect there is provided apparatus for acting upon charged particles in dependence upon one or more parameters comprising mass and/or energy and/or charged state of the particles, comprising an array of elongate magnetic poles extending longitudinally in a direction of elongation of the array; the array having a reference surface extending in the direction of elongation of the array of magnetic poles and passing through the array with at least one magnetic pole on each side of the reference surface; means for providing charged particles entering into or originating in the field of the magnetic pole array; the magnetic poles having a configuration in a plane perpendicular to the said direction of elongation such as to give parameter dependent change of direction to charged particles moving in the magnetic pole array with a direction of movement in or substantially parallel to the reference surface and other than the direction of elongation of the magnetic pole array; whereby parameter dependent selection of charged particles may be achieved by parameter dependent dispersion in a plane transverse to the reference surface.

There may also be provided in accordance with this aspect of the invention apparatus for acting upon charged particles in dependence upon one or more parameters comprising mass and/or energy and/or charged state of the particles, comprising: an array of elongate magnetic poles extending longitudinally in the direction of a longitudinal axis of the array; the array having a reference surface containing or substantially parallel to the longitudinal axis and passing through the array with at least one magnetic pole on each side of the reference surface; means for providing charged particles entering into or originating in the field of the magnetic pole array at a position spaced from the said longitudinal axis; the magnetic poles having a configuration in a plane perpendicular to the said longitudinal axis such as to give parameter dependent change of direction to charged particles moving in the magnetic pole array with a direction of movement in or substantially parallel to the reference surface and other than the direction of the said longitudinal axis of the magnetic pole array; whereby parameter dependent selection of charged particles may be achieved by parameter dependent dispersion in a plane transverse to the reference surface.

In connection with this aspect of the invention, and all other aspects, it is to be appreciated that where features of the invention are set out herein with regard to apparatus according to the invention, such features may also be provided with regard to a method according to the invention, and vice a versa.

Also, it is to be appreciated that where preferred, or essential, features of the invention are set out with regard to the various aspects, any one or more of these features may be provided in accordance with the invention in combination with any one or more other features of that, or other, aspects of the invention.

In particular, in connection with the first aspect of the invention, there is also provided in accordance with the invention a method of acting upon charged particles in dependence upon one or more parameters comprising mass and/or energy and/or charge state of the particles, comprising: providing an array of elongate magnetic poles extending longitudinally in a direction of elongation of the array; the array having a reference surface extending in the direction of elongation of the array and passing through the array with at least one magnetic pole on each side of the reference surface; providing charged particles entering into, or originating in, the field of the magnetic pole array; moving the charged particles in the magnetic pole array with a direction of movement in or substantially parallel to the reference surface and other than the direction of the said direction of elongation of the magnetic pole array; producing a parameter dependent change of direction in the movement of the charged particles by virtue of the magnetic fields produced by the configuration of magnetic poles in a plane perpendicular to the said direction of elongation; and effecting parameter dependent selection of charged particles by parameter dependent dispersion in a plane transverse to the said reference surface.

It is to be appreciated that the reference surface consists of a virtual surface passing through the array of magnetic poles and defined for the purposes of setting out the features of the present invention. The said references surface is not limited to a surface of a physical object. In all aspect of the invention, it may be preferred to arrange that the array of elongate magnetic poles has a longitudinal axis defining the said direction of elongation of the array of magnetic poles. The said longitudinal axis of the array may be contained in the reference surface or may be spaced from but parallel to the reference surface.

Many variations of the invention in this aspect may be provided. The charged particles moving in the magnetic pole array may consist of a beam of charged particles passing through the magnetic pole array, or the magnetic particles may originate in an area within the magnetic pole array. The most usual use of the parameter dependent selection will be mass analysis for example for producing a selected ion beam for ion implantation, or for use in a mass spectrometer or mass separator.

The longitudinal axis of the magnetic pole array may be a rectilinear longitudinal axis, or a curved longitudinal axis. For example the elongate magnetic poles may be straight or curved. The longitudinal axis may constitute all or part of a circle, or other curve. Similarly, the reference surface may be a plane, that is to say a flat surface, or alternatively may be a curved surface for example a part spherical or cylindrical surface.

The configuration of magnetic poles in a plane perpendicular to the longitudinal axis may have a geometric symmetry on either side of the reference surface, that is to say the symmetry of the physical components may be symmetrical about the reference surface,. even though the magnetic orientation of the poles may or may not be symmetrical. In such a case the reference surface forms a reference surface of geometric symmetry of the array.

In particular preferred forms, the array of magnetic poles is such as to provide between opposed poles an extended region of magnetic field in which the charged magnetic particles pass with a curved motion imposed thereon by the field, together with entry and exit regions which provide curved magnetic fields giving focusing and/or divergence of a beam of charged particles, together with parameter dependent dispersion of the charged particles in the said plane transverse to the reference surface. By parameter dependent dispersion is meant the different changes of direction of movement produced by the magnetic pole array on particles having different parameters. Most usually in embodiments of the invention, it is arranged that the particles of a beam are focused by the effect of the magnetic pole array, and the parameter dependent dispersion produces focusing of the beam of particles at different focal points along the general direction of propagation of the beam. In such an arrangement, preferably one or more barriers are provided giving an analysis aperture or apertures at the focal point of a desired species in the particle beam, preferably the barrier or barriers be aligned along the general direction of propagation of the beam.

In particular preferred form, it may be arranged that the array of magnetic poles is such as to provide between opposed poles an extended region of magnetic field in which charged particles moving with a direction of movement in or substantially parallel to the reference surface have a curved motion imposed thereon by the field, together with entry and exit regions which provide curved magnetic fields, curved in a plane perpendicular to the reference surface, giving focusing or divergence of a beam of charged particles passing through the curved field at an angle to the normal to the entry or exit region. In some embodiments the extended region also has curved magnetic fields curved in a plane perpendicular to the reference surface.

Usually in embodiments of the invention the array of magnetic poles, also referred to as a multiple magnetic pole array, or multipole, comprises an array of magnetic poles distributed in a plane at right angles to the longitudinal axis (which may be an axis of symmetry), with a geometry appropriate to the focusing requirements and extended along the straight or curved axial direction of the magnets a distance determined by the focusing requirements, the geometry and strength of these poles being consistent along this multipole axis. There is therefore no dispersion in a plane containing the multipole axis. When a multipole is used in its traditional way, with the nominal beam direction along the axis, the arrangement of poles is usually one of poles of alternate polarity distributed around the arc of a circle. In preferred forms of this invention, a series of poles along two straight or curved lines with a plane of geometric symmetry between them will be the most common geometry (but not restricted to this geometry) with the nominal beam direction in this plane of geometric symmetry. Opposite poles across this plane of geometric symmetry can either be similar or opposite direction of magnetisation, giving a totally different kind of lens action. The simplest form of multipole lens action is a dipole with poles of similar direction of magnetisation and an extended region of magnetic field between them so that the beam is deflected as it passes through the dipole (angled entry and exit fringe field focusing). The prior art has its dispersion plane at the plane of geometric symmetry of a variable strength dipole (wedge shaped magnet); in preferred embodiments of this aspect of the invention there is no dispersion in this plane because the dipole has consistent properties along its length.

The magnetic poles can be produced electromagnetically or they can be permanent magnets.

The important aspect in preferred forms of the invention is that it is mass dependent and is used as a method of beam analysis. The term 'mass dependent' is a simplification of the true situation. The path of the charged particle is dependent not only on mass but also upon the energy and charge state of the particle. An ion beam extracted from an ion source will have an energy determined by the acceleration voltage and the charge state of the ion species.

According to the present invention in a second main aspect there is provided apparatus for selection of particles of a beam of charged particles in dependence upon one or more parameters comprising mass and/or energy and/or charged state of the particles, comprising an array of elongate magnetic poles extending longitudinally in a direction of elongation of the array; the array having a reference surface extending in the direction of elongation and passing through the array with at least one magnetic pole on each side of the reference surface; the magnetic poles having a configuration in a plane perpendicular to the said direction of elongation such as to give parameter dependent focusing of a charged particle beam or series of beams passing through the magnetic pole array with a general direction of propagation in or substantially parallel to the reference surface and other than the direction of elongation of the magnetic pole array; the said reference surface being a surface of geometric symmetry with regard to the array of magnetic poles, and the configuration of the magnetic poles being such as to achieve analysis by using parameter dependent dispersion and focusing in a plane at right angles to the surface of geometric symmetry.

Preferably the surface of geometric symmetry will be straight in the general direction of propagation of the charged particle beam but can be curved in a plane at right angles to this direction.

According to the present invention in a third main aspect there is provided apparatus for selection of particles of a beam of charged particles in dependence upon one or more parameters comprising mass and/or energy and/or charged state of the particles, comprising an array of elongate magnetic poles extending longitudinally in a direction of elongation of the array; the array having a reference surface extending in the direction of elongation of the array and passing through the array with at least one magnetic pole on each side of the reference surface; the magnetic poles having a configuration in a plane perpendicular to the said direction of elongation such as to give parameter dependent change of direction to charged particles moving in the magnetic pole array with a direction of movement in or substantially parallel to the reference surface and other than the direction of elongation of the magnetic pole array; the configuration being such as to permit passage through the array of a beam of charged particles having an elongate cross section perpendicular to the general direction or directions of propagation of the beam, the elongate cross section being elongate in a direction lying in or parallel to the said reference surface; whereby parameter dependent selection of charged particles may be achieved by parameter dependent dispersion in a plane transverse to the reference surface.

The elongate cross-section, charged particle beam, with substantial extension across the reference surface, may be provided by what is normally termed a 'ribbon' beam. The ribbon beam can be curved in a direction at right angles to the general direction of propagation of the beam (a curved ribbon). A uniform ribbon beam is propagated through the lens system as a uniform ribbon beam. The dispersion characteristics of this invention in this form differ from conventional mass separator optics in that the analysing magnetic fields do not have a predominant component parallel to the axis of the long extraction outlet slot (and this therefore avoids the conflict between slot length and magnet pole gap) and the dispersion plane is not parallel to the surface of geometric symmetry between the two poles but is similar in that the dispersion plane can be at right angles to the slot. The dispersion plane for this aspect of the invention is never in the plane containing the slot, and this distinguishes it from the other prior art analysis technique which is defined by the fact that the dispersion plane is in the plane of the extraction outlet slot.

According to the present invention in a fourth main aspect there is provided apparatus for acting upon charged particles in dependence upon one or more parameters comprising mass and/or energy and/or charged state of the particles, comprising an array of elongate magnetic poles extending longitudinally in the direction of a longitudinal axis of the array; the array having a reference surface containing the longitudinal axis and passing through the array with an equal number of magnetic poles on each side of the reference surface the opposing poles having a common direction of magnetisation perpendicular to the reference surface; the array of magnetic poles being such as to provide between opposed poles extended regions of magnetic field in which the charged particles pass with a curved motion imposed thereon by the magnetic field, together with entry and exit regions which provide curved magnetic fields giving parameter dependent dispersion of the charged particles in a plane transverse to the reference surface; the magnetic pole array having an initial extended region of magnetic field, one or more intermediate regions, and a final extended region of magnetic field; and the apparatus having means for providing charged particles entering into, or originating in, the initial extended region; the magnetic poles having a configuration in a plane perpendicular to the said direction of elongation such as to give parameter dependent change of direction to charged particles moving from the initial extended region of magnetic field with directions of movement in or substantially parallel to the reference surface and other than the direction of elongation of the magnetic pole array, leaving this extended region of magnetic field at an angle to the normal from the longitudinal axis of the array, passing through the intermediate regions of the array, and moving into the final extended region of magnetic field of opposite magnetic polarity to the initial region; whereby parameter dependent selection of charged particles may be achieved by parameter dependent dispersion in a plane transverse to the reference surface.

The significant feature of this aspect of the invention when the particles originate in the initial extended region of uniform magnetic field, is that the general direction of the charged particle beam is continually changing direction as it passes through the extended regions of magnetic field and, to a lesser extent, as it passes through the multipole region. The concept of a singular 'general direction' for the beam as a whole is therefore not appropriate. The condition that the beam passes through the pole array 'at an angle to the normal from the straight or curved axis of the pole array' is a necessary condition for strong focusing in the same way that angled entry into a fringe field (as will be explained hereinafter) is a necessary condition for convergent or divergent focusing. Some weak second order focusing will occur even for beams not at an angle to the normal from the multipole axis simply because the beam is continuously changing direction.

The concept of a 'general direction of propagation' for the beam is appropriate when the beam starts in magnetic field free space. Thus in accordance with this fourth aspect, the charged particles may, for example, enter into the initial extended region as a beam of particles, or the particles may be generated in the initial extended region of field. Also, the particles moving in the final extended region may exit the region and then pass to other components, or the particles may be used within the final extended region, for example for ion implantation in a target in the final extended region.

The significance of the extended field regions between the first set of poles (the entry poles) is that it creates the direction of travel through the multiple magnetic pole array that is necessary to create strong focusing (assuming that the beam entering this extended field region did not originally have this direction of travel) and determines, together with magnetic field strength in the multipole region, the strength of the lens action (for a charged particle with a particular mass, energy and charge state) The exit extended field determines the angle of the beam when it leaves the magnetic field region.

A preferred feature for use with the fourth aspect of the invention, is that the initial and final extended regions of magnetic field are substantially symmetrical about a plane perpendicular to the reference surface. This plane is preferably positioned equidistant between the initial and final extended regions.

This special case is important because a uniform, parallel ribbon beam entering the mass analysing system leaves as a uniform, parallel, analysed beam travelling in the same direction. The condition that the entry and exit fields are equal in magnitude can mean either equal flux, or in a desirable special case equal in flux density distribution and geometry (exit field is a mirror image of the entry field). The latter condition allows the use of complex pole shapes and magnetic fields that are near to saturating the magnetic material of the poles and, because of the intrinsic symmetry of the system, maintains the parallel in/parallel out characteristic. This magnetic field arrangement is intrinsically balanced and this has a number of practical advantages.

The main aspects of the invention not only include the facility of mass analysis but also the facilities of energy analysis and charge state analysis. The initial charge state of the particle determines the energy for a given acceleration voltage. The charge state can change during transmission (by interaction with neutral gas molecules, for example), the change from singly charged to neutral being particularly important for ions. This can lead to a number of different particle energies in the beam after subsequent electrostatic acceleration. For low energy semiconductor implant, for example, deceleration of the beam may be desirable, Any neutrals in the beam will not be decelerated and the high energy ion impurity in the beam are extremely undesirable. Magnetic analysis is sensitive to mass, energy and charge state according to the equation:

$$R=143.95 SQR(MV/e)/B$$

where R is the radius of the circular movement of the ion in the magnetic field, B is the magnetic flux density in gauss, M is the ion mass in amu, V is the acceleration voltage and e is the charge state.

It is thus possible to use a multipole lens before or after an acceleration or deceleration stage to filter out ions with unwanted charge states (particularly before acceleration or deceleration) or unwanted energies (particularly after acceleration or deceleration)

According to the present invention in a fifth main aspect there is provided apparatus for acting upon charged particles in dependence upon one or more parameters comprising mass and/or energy and/or charged state of the particles, comprising an array of four elongate magnetic poles extending longitudinally in the direction of a longitudinal axis of the array; the array having a reference surface containing the longitudinal axis and passing through the array with two magnetic poles on each side of the reference surface; the magnetic poles having a configuration in a plane perpendicular to the said longitudinal axis to give a first extended region of substantially uniform magnetic field between a first pair of opposing poles with a direction of magnetisation perpendicular to the reference plane, and a second extended region of substantially uniform magnetic field between the other two opposing poles with an opposite direction of magnetisation, the region between these two sets of poles forming a quadrupole magnetic field region; the magnetic poles having a configuration in a plane perpendicular to the said longitudinal axis such as to give parameter dependent change of direction to charged particles moving in the magnetic pole array with a direction of movement in or substantially parallel to the reference surface and other than the direction of the said longitudinal axis of the magnetic pole array; the charged particles moving in a parameter dependent curved trajectory in the first magnetic field, high curvature trajectories not reaching the quadrupole field region, low curvature trajectories passing through the quadrupole field region and a particular parameter dependent trajectory passing into and along the quadrupole field region; whereby parameter dependent collection of charged particles may be achieved by placing collector means on the quadrupole axis.

This fifth aspect is a very high resolution technique for collecting a particular mass species for mass separation or mass spectrometry. It would not be suitable for beam formation for ion implantation because of the uncertain optics of the beam as it travels along the quadrupole axis. It can be part (or all) of an ion beam system, the lens being used to analyse and deliver an ion beam to target but with the added facility to analyse the content of the beam passing through this lens.

It is possible to have a situation where the bean is 'deflected from' the multipole. This only applies when the entry poles are of similar direction of magnetisation and this entry pole field is strong enough and extensive enough to turn a beam of a particular mass, energy and charge state parallel to the multipole axis before it reaches a field direction in the multipole that changes the deflection direction. In the limiting case a beam can reach a condition where it travels along the multipole axial direction. A very small increase in mass would lead to the beam being transmitted into the multipole region and a small decrease would cause the particle to approach and then turn away from the multipole region, experiencing some mass dependent focusing while in the multipole region.

According to the present invention in a sixth main aspect there is provided apparatus for acting upon charged particles in dependence upon one or more parameters comprising mass and/or energy and/or charged state of the particles, comprising an array of elongate magnetic poles extending longitudinally in a direction of elongation of the array; the array having a reference surface extending in the direction of elongation of the array of magnetic poles and passing through the array with at least one magnetic pole on each side of the reference surface; the array of magnetic poles being such as to provide between opposed poles extended regions of magnetic field in which the charged particles pass with a curved motion imposed thereon by the magnetic field, together with entry and exit regions which provide curved magnetic fields giving parameter dependent dispersion of the charged particles in a plane transverse to the reference surface; the magnetic poles having a configuration in a plane perpendicular to the said direction of elongation to give a extended region of magnetic field between two poles with a direction of magnetisation perpendicular to the reference surface; the magnetic poles having a configuration in a plane perpendicular to the said direction of elongation such as to give parameter dependent change of direction to charged particles moving in the magnetic pole array with a direction of movement in or substantially parallel to the reference surface and other than the direction of elongation of the magnetic pole array; the beam or beams moving in a parameter dependent curved trajectory in the extended magnetic field, high curvature trajectories staying within the extended field region, low curvature trajectories passing through the extended field region, whereby parameter dependent separation of beams by reflection of high curvature beam trajectories and transmission or collection of low curvature beam trajectories, the extended field region acting as a selective reflection mirror.

The most useful application of this aspect is for a beam entering the multipole extended entry region at an angle, say 45°, and reflecting out to give a reflection angle of 90°. This reflects masses lower than a certain value and transmits or collects higher masses. If the beam geometry allows, it may be possible to use the mass dependent focusing of reflected beams to achieve analysis. For the reflection application, the multipole need only be a dipole (or quadrupole).

The optics described in the aspects above provide the required mass dependent properties necessary to achieve a mass analysed beam which can be delivered to a target with the required characteristics. The techniques necessary to utilise the invention include removal of unwanted mass species and beam formation with the required optics. The invention has been described as a single multipole lens structure; the number of poles in the multipole is an important consideration as is the number of lenses that might be used to achieve optimum characteristics.

Preferably, the array of magnetic poles is positioned to act on an ion implantation beam entering the array in a non vertical direction, and arranged to deflect the beam so as to exit the said field in a substantially vertical direction, for ion implantation into a subsequent substantially horizontal target. This arrangement finds particular use for ion implantation into a horizontal or approximately horizontal target, for example being moved on a horizontal or substantially horizontal conveyor, where it is desired to implant by a vertical or near vertical particle beam. When this is arranged conventionally, it is normally necessary to provide components for generating the vertical beam, positioned directly above the moving conveyor belt of targets. This gives the disadvantage of particulates falling onto the wafers with consequent contamination. The embodiment that the invention allows generation of the implantation beam in a horizontal or near horizontal plane, and the reflection or deflection of the beam through a required angle to emerge substantially vertical.

According to the present invention in a seventh main aspect there is provided apparatus for selection of particles of a beam of charged particles in dependence upon one or more parameters comprising mass and/or energy and/or charged state of the particles, comprising an array of elongate magnetic poles extending longitudinally in a direction of elongation of the array; the array having a reference surface extending in the direction of elongation of the array of magnetic poles and passing through the array with at least one magnetic pole on each side of the reference surface; the magnetic poles having a configuration in a plane perpendicular to the said direction of elongation such as to give parameter dependent focusing of a charged particle beam or series of beams passing through the magnetic pole array with a general direction of propagation in or substantially parallel to the reference surface and other than the direction of elongation of the magnetic pole array; the configuration of the magnetic pole array being such as to produce focusing to a cross-over the position of which is parameter dependent, and there being provided a resolving structure allowing transmission of particles of a required species through an aperture positioned at the cross-over.

This aspect of the invention covers the general case of a beam which has a general direction of propagation parallel to, but not necessarily along, the plane of geometric symmetry, and coming to a crossover (focus) at a position not necessarily in the plane of geometric symmetry.

According to a preferred feature for use in the seventh main aspect of the invention, the said reference surface is a surface of geometric symmetry with regard to the array of magnetic poles, and the aperture of the resolving structure lies on the plane of geometric symmetry.

This aspect covers the important practical embodiment where a beam diverging from a source extraction region has an axis of symmetry regarded as the general direction of propagation which coincides with the plane of symmetry of the lens structure (the central plane), or a parallel beam (not necessarily symmetrical about the central plane or, in an important practical embodiment, completely to one side of it) which comes from an object position at infinity. The crossover (focus) occurs in the lens plane. The first of these two geometries has the resolving structure in the middle of the beam and therefore the central part of the beam is lost. The structure therefore needs to be as thin as possible, relying on techniques such as tensioning to keep these structures straight. The presence of the resolving structure as an electrode can be an advantage for high perveance (high space charge) beams as it creates a central region of zero (ground) potential and allows the injection of secondary electrons (to reduce space charge) into the centre of the beam in the extraction region (see a later aspect of this invention). It is important to note that space charge is, in general, not a problem in this invention because the beams are space charge neutralised because there are no electric fields in the lens region and because the invention allows the use of relatively low current density beams. This is due to the lack of restriction on the size and number of beams transmitted from source to target.

The resolving structure allows transmission of the beam that passes through the aperture, usually a slit, and removes any beams which have crossovers at other positions along the resolving structure. Very high mass beams may have crossovers a considerable distance along the lens plane, or no crossover at all (the diverging beam from the extraction region remaining diverging or becoming, in the limiting case, parallel. These high mass beams must be removed without impeding the transmission of the required mass beam.

According to a preferred feature there is provided a transmission limiting structure positioned in a plane transverse to the general direction of propagation of a focused beam through the resolving structure, for preventing transmission of particles following trajectories beyond the range obstructed by the said resolving structure.

This technique would not appear to remove diverging high mass beams that can pass through the second aperture. It will be shown that, provided the geometry of the resolving structure relative to the second aperture is correctly chosen, complete removal of high mass beams can be achieved. In certain circumstances, particularly when beams are narrow (low divergence), the second transmission limiting aperture is used without the resolving structure. Examples of this are the use of a narrow slit to improve the quality of the beam transmitted to further lenses by removal of poor quality beam that is not focused through the slit and the reduction of the maximum divergence of unwanted beams which helps with subsequent mass resolution.

It has been mentioned that part of the resolving structure can be extended along the central axis of the beam towards the source into a magnetic field free region away from the lens entry region, where secondary electrons can be transmitted up through the centre of the beam towards the extraction region, reducing the space charge potential at the centre of the beam. This will reduce the divergence of high perveance (high space charge) beams, particularly important for low energy implantation.

According to the present invention in an eighth main aspect there is provided an extraction assembly for extracting positively charged particles from an elongate charged particle source which is elongate in a direction transverse to the general direction of extraction of the particles, the extraction assembly having an accelerating region followed by a decelerating region to produce a charged particle beam the optics of which are significantly influenced by the space charge of the extracted charged particles; the assembly including an elongate element of conducting material at a floating or a controlled potential, situated at the centre of the beam and parallel to the elongate axis of the source region, and positioned in the electrostatically decelerating field for positive ions or in a field free region; the arrangement being such that the presence of secondary electrons produced by charged particles striking the elongate element, and the presence of the element acting as an electrode, combine to reduce the space charge at the centre of the beam, thus increasing the beam current that can be usefully extracted.

The wire or strip in this aspect could be tensioned to keep it straight, particularly when, in order to minimise beam loss, the wire or strip are very thin. This raises the problem of erosion due to sputtering. In other aspects of this invention, surfaces are struck by unwanted charged particles, particularly in the form of atomic and molecular ions, which can result in undesirable erosion, build up of surface layers and flake formation for example. It would be desirable, particularly when, as in this invention, these regions are very close to the required beam, for the material being struck by these particles to be continuously, and preferably automatically, replaced.

According to the present invention in a ninth main aspect there is provided apparatus for producing or acting upon a beam of charged particles having an elongate cross-section perpendicular to the general direction or directions of propagation of the beam, in which the apparatus includes an elongate element aligned along the elongate axis of the beam which is used to intercept charged particle beams, either to remove those beams or to otherwise influence the behaviour of the charged particle beam, and which is thereby subject to deterioration by contact with the charged particles, including means for moving the elongate element in the direction of its elongate axis to replace the parts thereof which have deteriorated due to contact with the charged particles. The apparatus may comprise a moving wire or strip, which is used to intercept charged particle beams, either to remove those beams or to otherwise influence the behaviour of the charged particle beam, the removal process preventing excessive erosion, that might lead to breakage or ineffectiveness, or preventing surface material build up or flake formation which might lead to undesirable effects on the beam or any process carried out elsewhere in the system.

This aspect can be extended to include tensioning of the wire to keep it straight. The tensioning of components such as resolving and transmission slit components can be regarded as an inventive aspect in itself, this being particularly important when dealing with large ribbon beams.

According to the present invention in a tenth main aspect there is provided apparatus for producing or acting upon a beam of charged particles having an elongate cross-section perpendicular to the general direction or directions of propagation of the beam, in which the apparatus includes an elongate element aligned along the elongate axis of the beam which is used to intercept or otherwise influence the behaviour of the charged particle beam, the apparatus including means for tensioning the elongate element to keep it straight.

The moving and tensioning of a wire or wires or a strip or strips are a further inventive combination.

The important aspects of the invention considered so far are concerned with analysis rather than beam formation. These multipole lenses are multipurpose line lenses for use in an optical system and can be used to focus or make parallel beams for entry into another optical element or for delivery to a target. As the focusing is always mass dependent there is a desirable tendency for successive focusing operations to increase the resolving power of the system. The resolving power of the individual lens/resolving slit combinations is a variable depending on geometric factors.

The simplest example of combined mass analysis and beam formation is the use of a strong multipole lens. A lens can be used, for example, to focus a divergent beam to a converging beam or a parallel beam. In the former case, the focus to a crossover can be used for mass analysis at a resolving slit but the resulting divergent beam after analysis is probably not the ultimate requirement. For most ion implantation processes the ideal beam is a parallel beam.

For simplicity, multipole lenses of the type described in previous aspects of this invention are now going to be simply described as 'line lenses'.

A strong line lens is regarded as a lens where a crossover is achieved within the lens region and the beam continues to be focused in the same lens after the crossover. This means it is possible to analyse and then focus to parallel using a single line lens. There is therefore an important specific further aspect of the previously mentioned tenth main aspect.

According to a preferred feature, the position of the crossover is chosen so that subsequent further focusing of the beam transmitted through the resolving slit in the multiple magnetic pole array leads to the production of a beam with required optical characteristics.

The most likely 'required optical characteristic' is a parallel beam. This is a particularly useful line lens geometry when the parallel beam is delivered directly to the target. The quality of the beam leaving the lens is not as good as a 'normal' lens but the mass dispersion is superior. This must be taken into consideration when using a strong lens in a multiple lens optical system.

The two types of line lens from the point of view of the pole arrangement across the plane of geometric symmetry will be called:

'transverse-field' line lenses where the magnetic field between two geometrically opposed poles crosses the plane of geometric symmetry.

'axial-field' line lenses where the magnetic field between two geometrically opposed poles passes along the plane of geometric symmetry.

Transverse-field line lenses are strong lenses because the closeness to the reflection condition produces a strong interaction with the multipole fields and creates an enhanced mass dispersion. Transverse-field lenses are in general much stronger than axial-field lenses for a given electrical conductor power consumption.

The aspects of the invention considered have now included both mass analysis and beam optics from a single line lens. There are many reasons for using more than one lens:

a) the quality of the beam (measured by its emittance [1]) determines the resolving power [12] that can be achieved. The emittance can be improved by passing the beam through a narrow transmission limiting aperture or, even better, a combination of both transmission limiting and resolving apertures. A second stage of focusing can then exhibit enhanced resolving power due to the improved quality of the input beam and the cumulative effect of double focusing;

b) a two lens optical system allows multiple crossovers which lead to very good 'no-line-of-sight' characteristics between the extraction region and the first lens mass analysis region, both of which create a significant amount of sputtered material produced by ion bombardment, and the target. Mass analysis is required because of semiconductor sensitivity to impurities and it is therefore necessary to take equally stringent precautions to prevent other forms of contamination from reaching the target;

c) the output optics from the magnetic line lenses may be determined by the needs of subsequent acceleration or deceleration stages. Acceleration is a naturally convergent focusing process so therefore a diverging beam is desirable. Deceleration of high perveance beams is dominated by space charge beam blow-up considerations, and a converging input may be required. If channelling issues are important in a single crystal silicon implant, then an accurately parallel beam may be needed. This may favour the use of 'normal' lenses;

d) when an ion beam contains a substantial fraction of an atomic or molecular species which is considerably lighter than the required species which is to be transmitted through the analysing system, it may be desirable for the first lens to be a weak lens dedicated to the removal of this species. This issue is only significant for transverse field line lenses where such a light ion may be reflected back to the extraction region.

According to a preferred feature there is provided, one or more further arrays of elongate magnetic poles and associated resolving structures arranged to produce parameter dependent focusing of the beam exiting the first array, whereby a combination of components of the arrays obscures line of sight through the combined system for contamination particles due to sputtering or otherwise.

There are a wide variety of ways of using two or more line lenses to produce particular optical requirements. In general, the first lens needs to be independently controllable (because the object position is determined by the extraction conditions) adjusted to focus the required beam through the first aperture. Subsequent lenses do not have to be independently controlled. Doublet and triplet lenses can simplify power supply requirements by using a common power supply, reducing the number of electrical conductors needed and reducing the length of the lens system.

An example of the use of a three lens system consisting of a independent first lens followed by a doublet, introduces another aspect of the use of multiple lenses where the axis of the first lens does not coincide with the axis of the following doublet. The advantage of this asymmetric approach is that it can avoid the need for a resolving plane in the centre of the beam. This is particularly important for low perveance beams, where there is not an extraction divergence problem caused by space charge beam blow-up, which may lead to very low divergence beams. The simplest example is for beam focused to a parallel beam by the first lens; this parallel beam passing into the first lens of the doublet off-centre with the lens power selected to give a parallel beam-crossover-parallel beam geometry with the beam now off-centre on the other side of the doublet plane of geometric symmetry; followed by a repeat process to return the parallel output beam to the first side of the plane of geometric symmetry. This beam geometry gives good resolving power and excellent line-of-sight characteristics.

According to the present invention in an eleventh main aspect there is provided apparatus for selection of particles of a beam of charged particles in dependence upon one or more parameters comprising mass and/or energy and/or charged state of the particles, comprising a first array of elongate magnetic poles extending longitudinally in a first direction of elongation of the array, the array having a first reference surface extending in the first direction of elongation and passing through the array with at least two magnetic poles on each side of the reference surface; the magnetic poles having a configuration in a plane perpendicular to the said first direction of elongation such as to give parameter dependent focusing of a charged particle beam or series of beams passing through the magnetic pole array with a general direction of propagation in or substantially parallel to the reference surface and other than the direction of the said first direction of elongation of the magnetic pole array; the said first reference surface being a surface of geometric symmetry with regard to the first array of magnetic poles, and the configuration of the magnetic poles being such as to produce focusing to a parallel beam exiting the first array; a second array of elongate magnetic poles extending longitudinally in a second direction of elongation of the second array, the array having a second reference surface extending in the second direction of elongation and passing through the array with at least two magnetic poles on each side of the reference surface, the second reference surface being parallel to and spaced from the first reference surface, and the said parallel beam exiting the first array being introduced into the second array off set from the second reference plane; the magnetic poles of the second array having a configuration in a plane perpendicular to the second direction of elongation such as to give parameter dependent focusing of the parallel beam passing through the second magnetic pole array with a general direction of propagation in or substantially parallel to the second reference surface and other than the direction of the said second direction of elongation of the second magnetic pole array; the said second reference surface being a surface of geometric symmetry with regard to the second array of magnetic poles, and the configuration of the second magnetic pole array being such as to produce focusing to a parameter dependent cross-over with the beam emerging from the cross-over on the opposite side of the second reference surface; there being provided a resolving structure at the cross-over defining a resolving aperture by components positioned before and after the cross-over and off set from the second reference surface to the side thereof opposite to the beam.

There may be provided apparatus comprising two or more multiple magnetic pole array line lenses with different, but parallel, planes of symmetry, giving mass dependent focusing of a charged particle beam or series of beams, or a beam with substantial extension across the plane of symmetry, with a general direction of propagation parallel to the planes of symmetry through the multiple magnetic pole line lenses, enabling mass analysis to be achieved by first focusing to a parallel beam, this parallel beam then being introduced off-centre on one side of the plane of symmetry of the next lens or lenses, and then focusing to one or more crossovers in this plane of symmetry, and there being a resolving structure on the opposite side of the plane of symmetry to the beam, allowing transmission of a beam with crossovers at the positions of one or more apertures in this structure.

One characteristic of this technique is that the resolving structure can be 'infinitely thin' because the resolving structure is either on one side or the other of the plane of geometric symmetry.

The next, and most important, general aspect of this invention is the fact that, as the ribbon beam travels along the plane of symmetry of the analysing system, there can be as many beams as is necessary to achieve required beam current. The magnetic circuits will be in series for transverse-field lenses and will have an alternate parallel/anti-parallel structure for axial-field lenses.

According to a preferred feature of the present invention there may be provided a plurality of beam systems with regularly spaced respective reference surfaces each sharing at least part of a common magnetic circuit with neighbouring systems.

The combination of this aspect of the invention with previous aspects results in a fully analysed beamline system where there is effectively no practical limit to the beam current available.

According to the present invention in a twelfth main aspect there is provided apparatus comprising: means for producing an ion beam which enters a target region for ion implantation or other reaction with a target element; wherein the target region is surrounded by a multipole magnetic containment which retains charged particles formed within the target region by reaction with the target, or reaction with background gas or vapour or by other plasma generation means, and allows the beam to pass through the regions between or through parallel sets of cusps; the arrangement being such that an electrically neutral gaseous plasma can be formed or retained in the target region for the neutralisation of surface charge of either positive or negative polarity on the surface of the target element situated in, passing through or being mechanically scanned in the target region.

The previous main aspects of the invention allow very large ion beam currents to be delivered to a target such as a semiconductor wafer or flat panel display substrate which are likely to give rise to surface charging problems. It is very important to this invention that a means of preventing surface charging should be available.

According to the present invention in a thirteenth main aspect there is provided apparatus for extracting charged particles from an elongate charged particle source which is elongate in a direction transverse to the general direction of extraction of the particles, the apparatus including: means for providing an electric extraction field formed from two electric field components produced by electrode structures positioned one on each side of a plane containing the elongate axis of the elongate source; means for moving the electric extraction field towards and away from the elongate source; and means for producing relative movement between the two electric field components of the extraction field.

This aspect of the invention relates to the need for the extraction field geometry to optimised for a wide range of extraction voltages. The conventional way to achieve this is simply to move the extraction electrodes away from the source region at extraction high voltages in order to prevent electrical breakdown across excessively high field gradient extraction gaps, and to move the extraction electrode assembly closer to the source at low extraction voltages in order to maintain as high a field as possible in order to maximise the extracted beam current. This simple electrode movement is not ideal; the width of the aperture in the extraction electrode should ideally decrease as the electrode moves closer to the source and increase as the electrode is moved further away.

There are two ways of achieving this. The first is the individual mechanical movement of two independent halves of the electrode structure for both extraction optics control and beam alignment (correcting for small unintentional misalignment which causes the beam the be extracted in other than the required direction). The other technique is to have an array of stationary electrodes and to move the electric potential distribution along these electrodes to create a variable extraction field geometry and to vary the field across these electrodes (i.e. on either side of the beam) in order to achieve an alignment correction function.

Embodiments of the invention will now be described by way of example with reference to the accompanying drawings some of which illustrate known apparatus, and in which:

FIG. 1d is a view of the central plane of the ion beam mass analysis system for the alternative prior art; and FIGS. 1e and 1f are side views along this plane showing one and three diverging beams leaving the ion source extraction region;

FIGS. 4a and 4c show the end view and FIG. 4b the plan view with particle trajectories of a dipole which creates a magnetic field across the central plane of the dipole; and FIGS. 4e and 4f show the end views and FIG. 4d the plan view with a particle trajectory of dipoles which create a magnetic field along the central axis of the dipole;

Figure 1A:
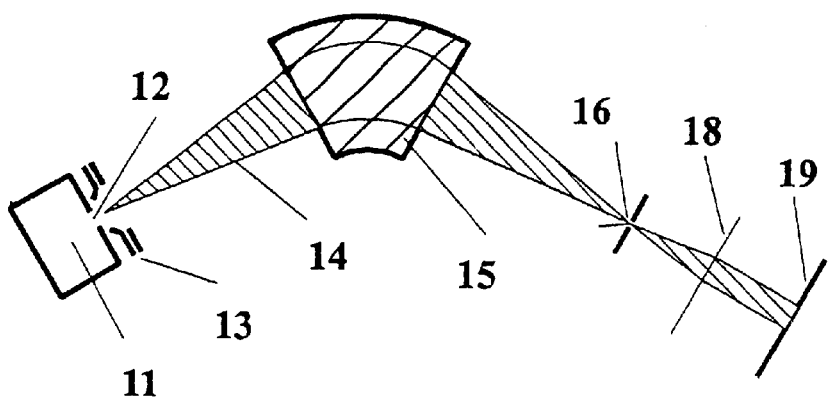
FIG. 1a is a view of the central plane of the ion beam mass analysis system for the prior art known as conventional mass separator optics.
Figure 1B:
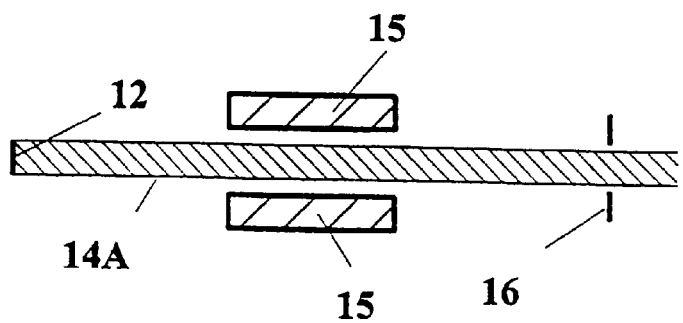
FIGS. 1b and 1c are side views along this plane showing a parallel beam and a converging beam leaving the source extraction region.
Figure 1C:
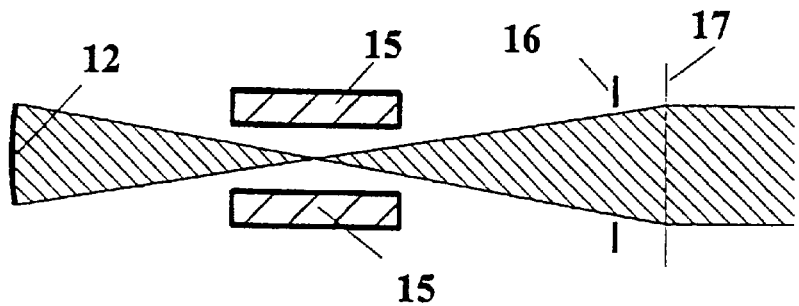
Figure 2:
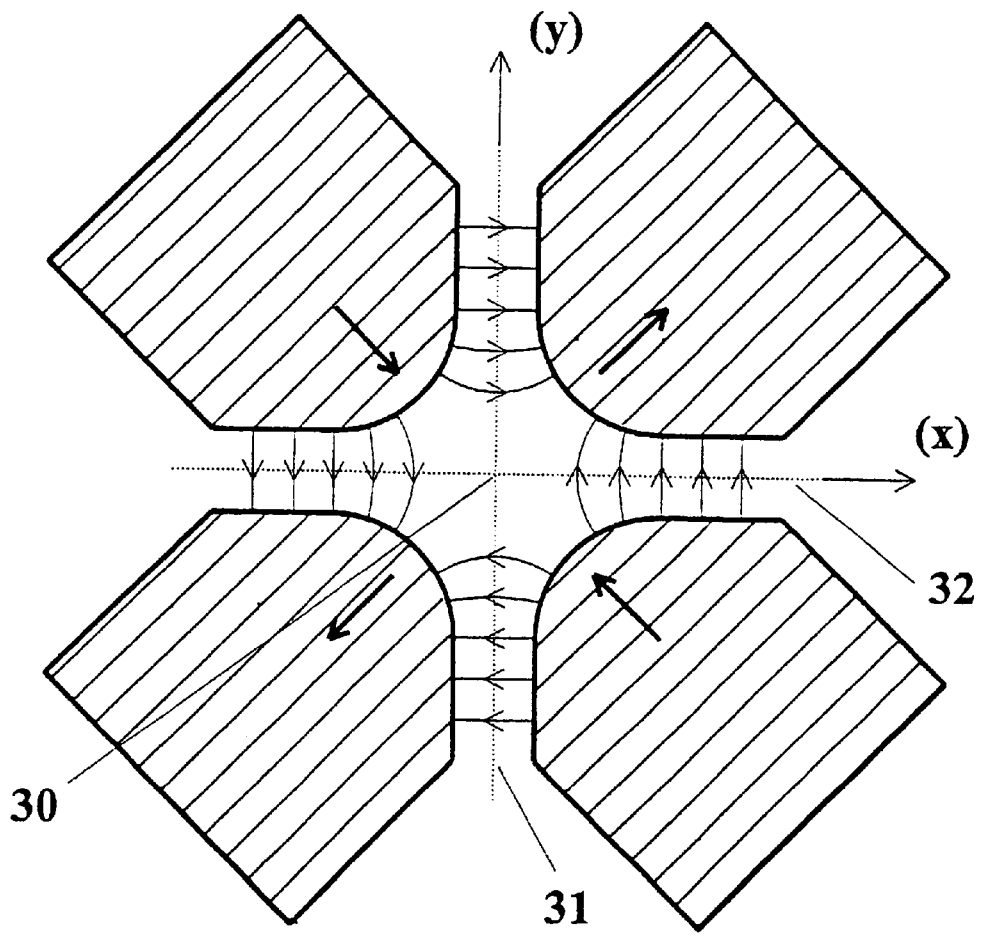
FIG. 2 shows a view along the axis and in the direction of propagation of the beam for the prior art use of a magnetic quadrupole for the focusing of charged particle beams.

As has been set out above, conventional and more recent mass analysis prior art for ion implanter and particle accelerators are shown in FIGS. 1a to 1f. The inclined boundary fringing field focusing mentioned with respect to the focusing action at both entry and exit poles in FIG. 1e and the quadrupole lens shown in FIG. 2 represent the relevant magnetic focusing prior art.

The invention in a first aspect is based on the concept of focusing an ion beam using long (parallel to a straight or curved axis) multipole arrays which can achieve mass dependent focusing of a charged particle beam, and in particular an ion beam. Although the concept is not restricted to ions, but can apply to any type of charged particle of positive or negative polarity, this description will refer to the beam as an ion beam, as this represents the immediate important application. An ion, passing through shaped magnetic fields caused by an array of magnetic poles, will experience mass dependent (and energy and charge state dependence) deflection from its original path which can be used to achieve mass analysis by selectively transmitting the required mass ion beam while allowing unwanted beams to be lost at intercepting surfaces.

As the entry into the multipole region will be through the space between the first two poles to be encountered by the ion beam, it is convenient to regard the multipole array as a series of dipoles between which the beam passes. In the general case of the first aspect, these dipoles are arranged with no particular symmetry. A dipole is, in itself, the simplest form of a multipole, and a multipole can be considered as one or more sets of dipoles which are close enough to each other for their magnetic fields to interact. As the dipole separation is increased the interaction decreases until a point is reached at which it is more appropriate to regard them as independent dipoles. The important aspects of this invention are evident from the behaviour of a single dipole and the simplest practical embodiment is best constructed from two dipoles or a single quadrupole.

The overall invention will first be described with reference to a single specific embodiment shown in FIGS. 3a to 3f. Basic concepts of the invention will then be described with reference to FIGS. 4a to 5b. Further aspects will then be described with reference to the remaining FIGS.

Figure 3A:
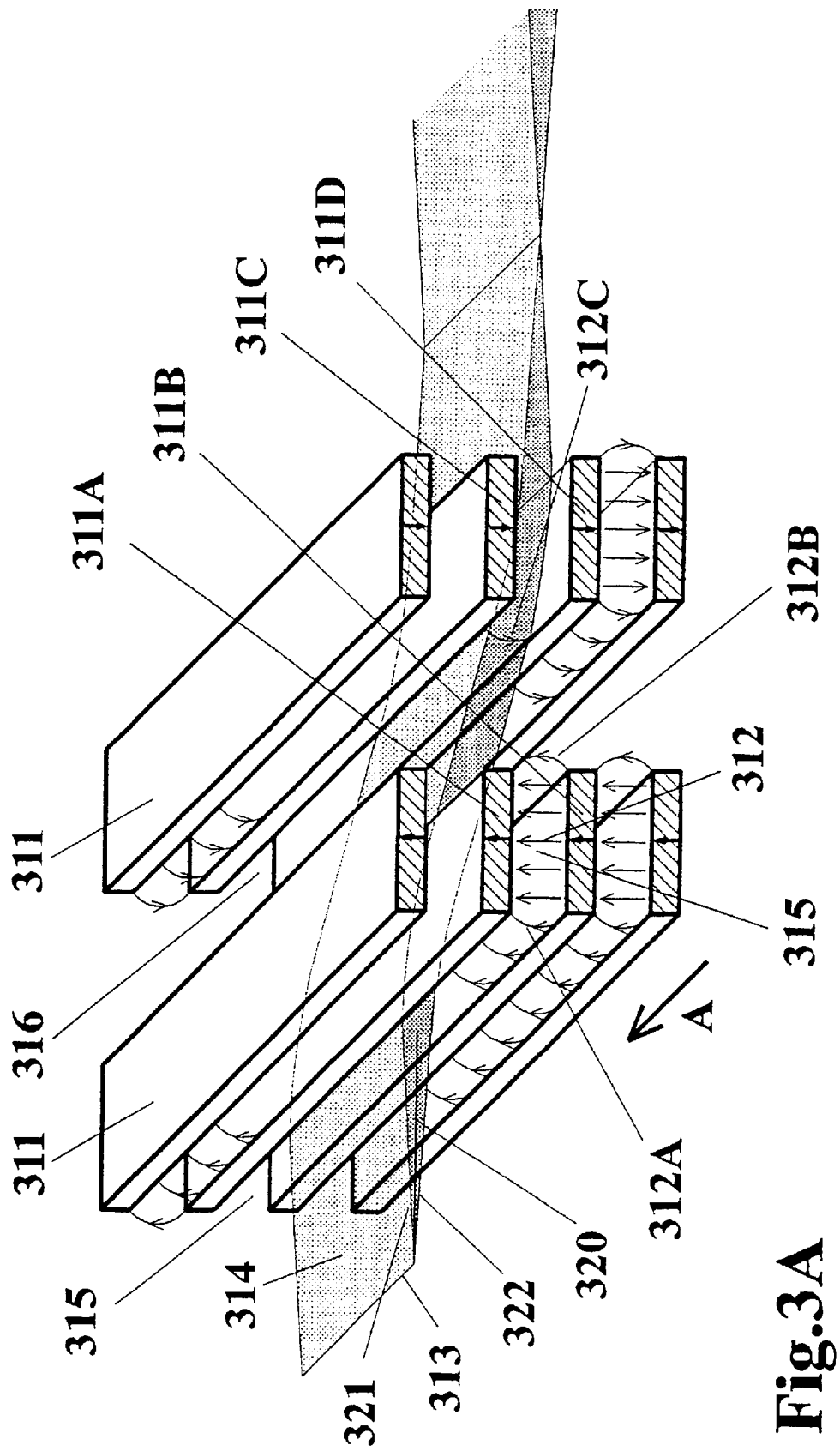
FIG. 3a is a three dimensional diagrammatic representation of an embodiment of the invention for the mass analysis of multiple ribbon beams.
Figure 3B:
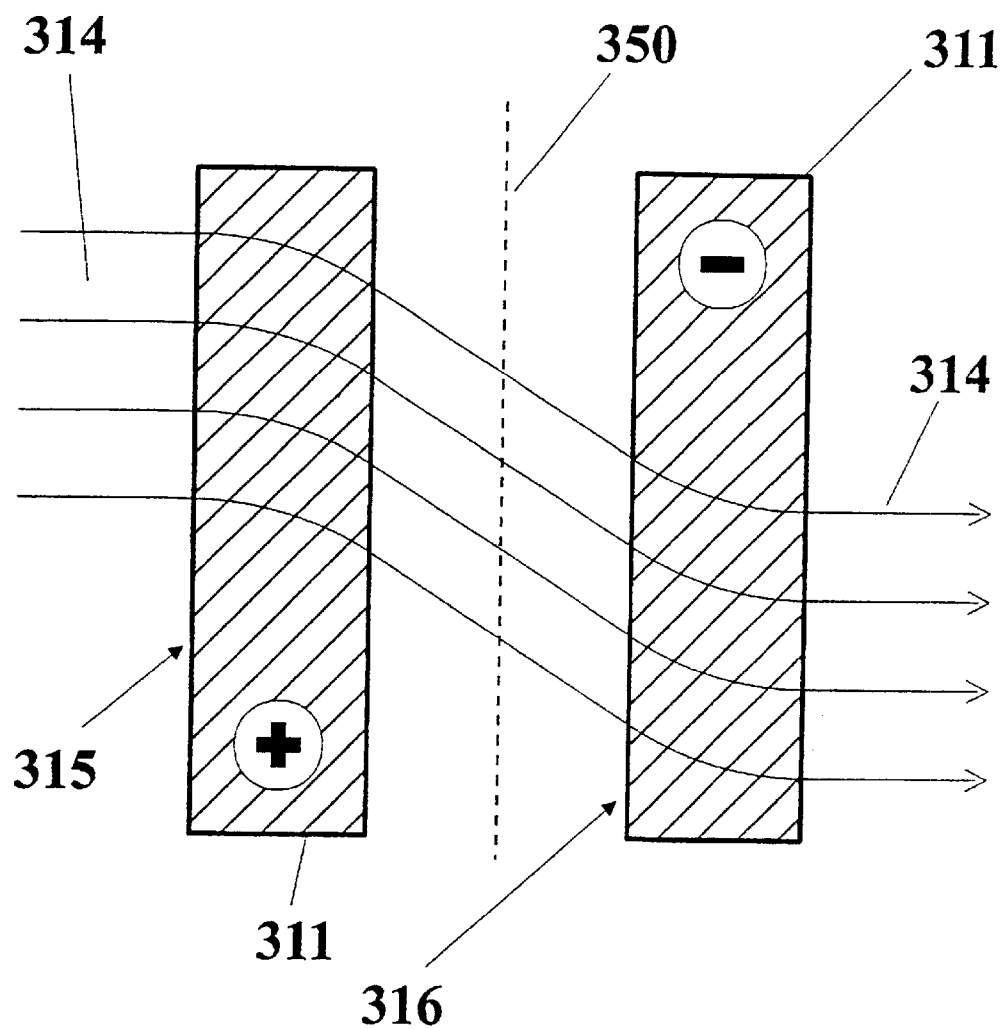
FIG. 3b is a plan view of the apparatus in FIG. 3a taken in a plane extending between two of the pairs of analysis magnets.
Figure 3C:
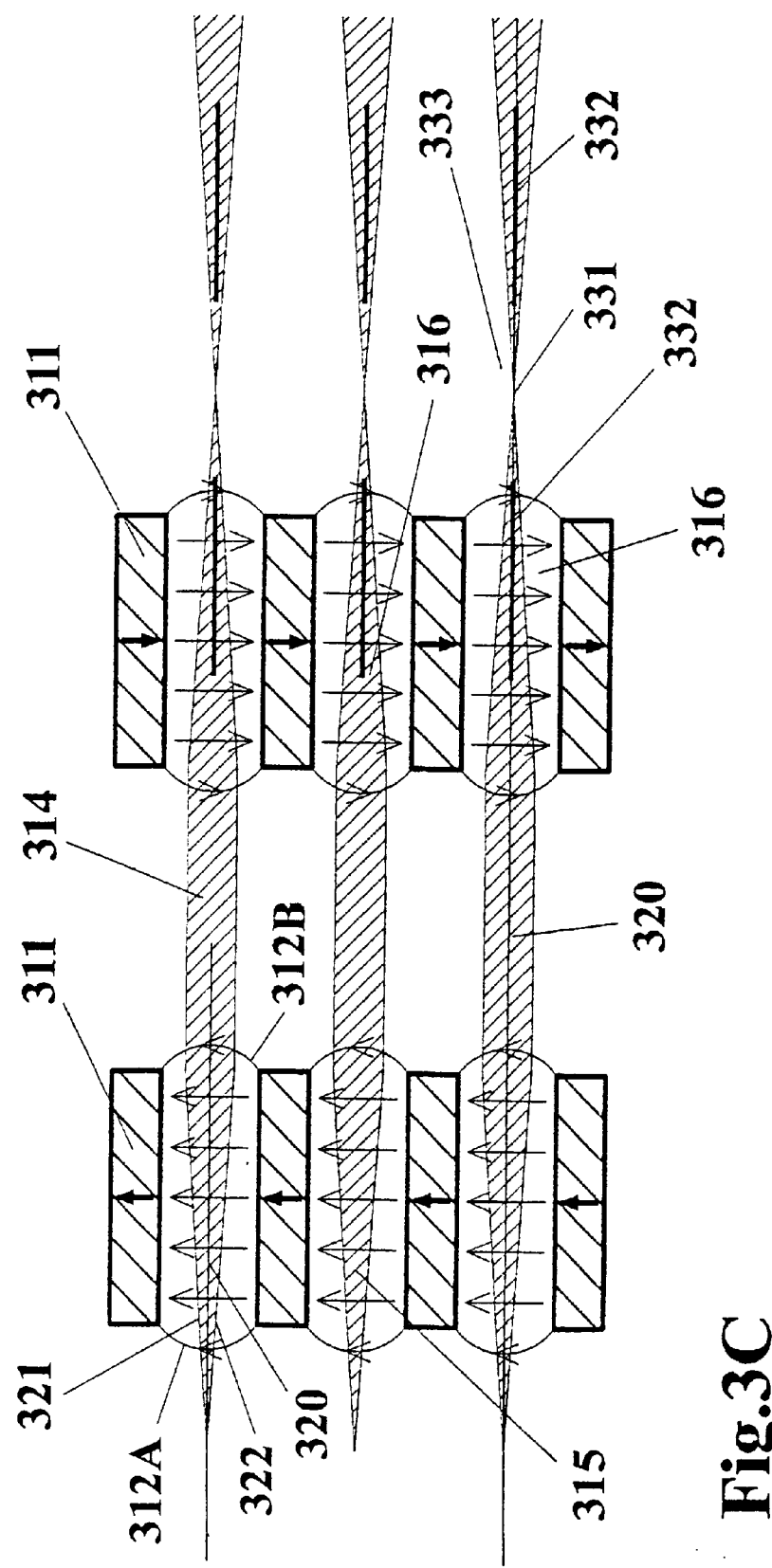
FIG. 3c is an end view of the apparatus of FIG. 3a, taken in a direction parallel to the source.

FIG. 3a is a three dimensional diagrammatic representation of an embodiment of the invention for mass analysis of a ribbon charged particle beam. FIG. 3b is a plan view of the apparatus of FIG. 3a taken in a plane extending between two of the pairs of analysis magnets. FIG. 3c is an end view of the apparatus of FIG. 3a, taken in the direction of the arrow A which is parallel to the source.

Figure 3D:
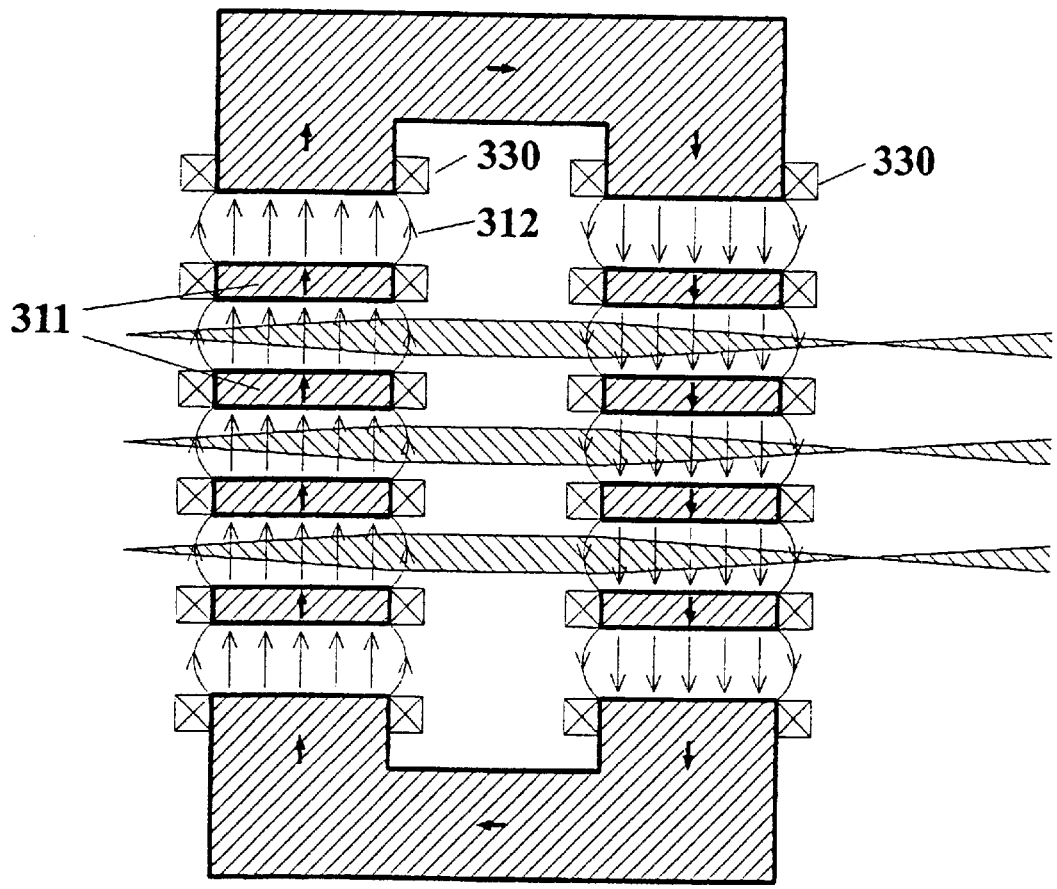
FIG. 3d shows details of the magnetic circuit viewed in a direction parallel to the source.

As shown in FIG. 3a an array of elongate magnetic poles 311 is energised by electromagnetic coils 330 shown in FIG. 3d and arranged to produce a mass analysis magnetic field directed upwardly through the magnetic poles to the left of the drawing and downwardly through the magnetic poles to the right of the drawing as indicated by notional magnetic field lines 312. The array of elongate magnetic poles extends in the direction of a longitudinal axis 350 shown in FIG. 3b. The array has a reference plane indicated at 320 in FIG. 3c.

A source 313 of a substantially parallel ribbon beam 314 of charged particles, for example boron ions produced from a gaseous plasma discharge source, is directed to a gap 315 between a pair of adjacent magnetic poles 311A and 311B and thereafter through a gap 316 between a pair of magnetic poles 311C and 311D. The beam is repeated above and below this pair from a series of stacked source slots, shown in FIG. 3C but omitted for clarity from FIG. 3a.

The magnetic field between poles 311A and 311B is substantially perpendicular to the poles 311A and 311B throughout the major portion of the gap 315, but is curved at the boundary fringe fields indicated at 312A and 312B. Similarly the magnetic field between the poles 311C and 311D has curved boundary fringe fields at the edges of the gap 316.

Although the ribbon beam 314 is substantially uniform there is slight divergence of the beam between the source slot 313 and the first pair of poles 311A and 311B. In the FIGS. the central plane of the beam 314 is indicated at 320, which constitutes a virtual reference surface, and the divergence of the beam is indicated diagrammatically by edge portions 321 and 322 of the beam 314.

When the beam 314 enters the gap 315 the beam 314 is bent in a curved path to the right in the plan view of FIG. 3b due to the effect of the magnetic field 312 on the charged particle beam. The beam 314 is arranged to enter the entry region of the gap 315 perpendicular to the front faces of the magnetic poles 311A and 311B which is a special condition in this embodiment. As a result, the curved entry fringe field 312A has no significant effect upon the divergence of the ribbon beam 314 from the central plane 320, and the divergence 321, 322 of the beam 314 continues as the beam moves through the gap 315 while being bent in a curved path to the right as shown in FIG. 3b.

However, when the beam 314 exits from the gap 315 the effect of the curved boundary fringe magnetic field 312B because of the oblique-exit angle of the beam, is to focus the divergence 321, 322 of the beam 314 with the effect, in this example, of a convergent lens. In the practical embodiment, the dimensions and field strengths are arranged to be such that the beam 314 emerging from the gap 315 has the divergence angle rendered into a parallel sided ribbon beam. This is also dependent upon the energy and mass and charge state of the particles in the beam. Thus for a given energy and charge of particles in the beam, heavier particles will experience a less converging effect, and lighter ions will experience a more converging effect. The parameters are arranged in a practical embodiment such that the required species exits from the gap 315 as a parallel sided ribbon beam.

Referring to FIG. 3b, the ribbon beam 314 exiting from the gap 315 follows a non-curved path, viewed in the plan view of the plane 320. At this region between the two sets of magnetic poles 311 there is no magnetic field acting upon the beam, so that the beam follows a straight line path. In practice, the two sets of magnetic poles 311 are placed close together, so that this portion of the beam part is as small as practical, but in other arrangements the path could be longer if required.

When the beam reaches the second set of magnetic poles 311, the effects of the curved boundary fringe magnetic field 312C, combined with the oblique angle at which the parallel ribbon beam enters the second gap 316, produces a converging lens focusing effect upon the beam, as shown in FIG. 3c. In addition, the effect of the downwardly directed magnetic field in the gap 316 is to produce a curved path of movement of the beam 314 in the central plane 320, as viewed in plan view in FIG. 3b. The focusing effect of the fringe magnetic field at the entry to the gap 316 takes place only at the entry boundary. The curved path of the beam shown in plan view in FIG. 3b is effected throughout the movement of the beam through the gap 316.

The parameters of the beam and analysing magnets are arranged to be such that for the required species of charged particle, the beam emerges when viewed in plan view in the same direction of propagation as the direction of propagation at the entry to the first gap 315.

However, considered in the vertical plane of the three dimensional drawing of FIG. 3a, as shown in side view in FIG. 3c, the ribbon beam emerging from the second gap 316 is convergent due to the effect of the curved magnetic boundary field. The convergence of the exiting beam 314 will be focused at a focal point, indicated in FIG. 3c at 331, which will be different for different species in the original beam 314 leaving the source 313. Heavier charged particles within the original beam will be focused at a greater distance from the analysing magnets and charged particles (for the same energy of particle) of a lighter mass will be focused closer to the source.

In order to allow the final exit of only the required species in the beam 314, a mass analysis aperture is provided at the focal point 331 for the required species. This may be achieved in two main forms. In the form shown in FIG. 3c, there is provided a thin barrier 332 which is placed along the central plane 320 of the beam 314 exiting from the magnetic assembly 311. An aperture 333 is provided in the barrier 332, at the required focal point 331 to allow passage of the required species. The aperture 333 shown in FIG. 3c is diagrammatic, and is shown much greater than is required in a practical embodiment. All dimensions shown in these explanatory FIGS. 3a, to 3f are purely diagrammatic and do not represent actual dimensions of an analysis apparatus. Unwanted species of the exiting beam 314 will focus earlier or later than the focal point 331 and will strike the barrier 332 and be lost. An alternative form of barrier can be provided by siting barrier components one on either side of the central plane 320, as will be described hereinafter for example in FIG. 14.

Figure 3E:
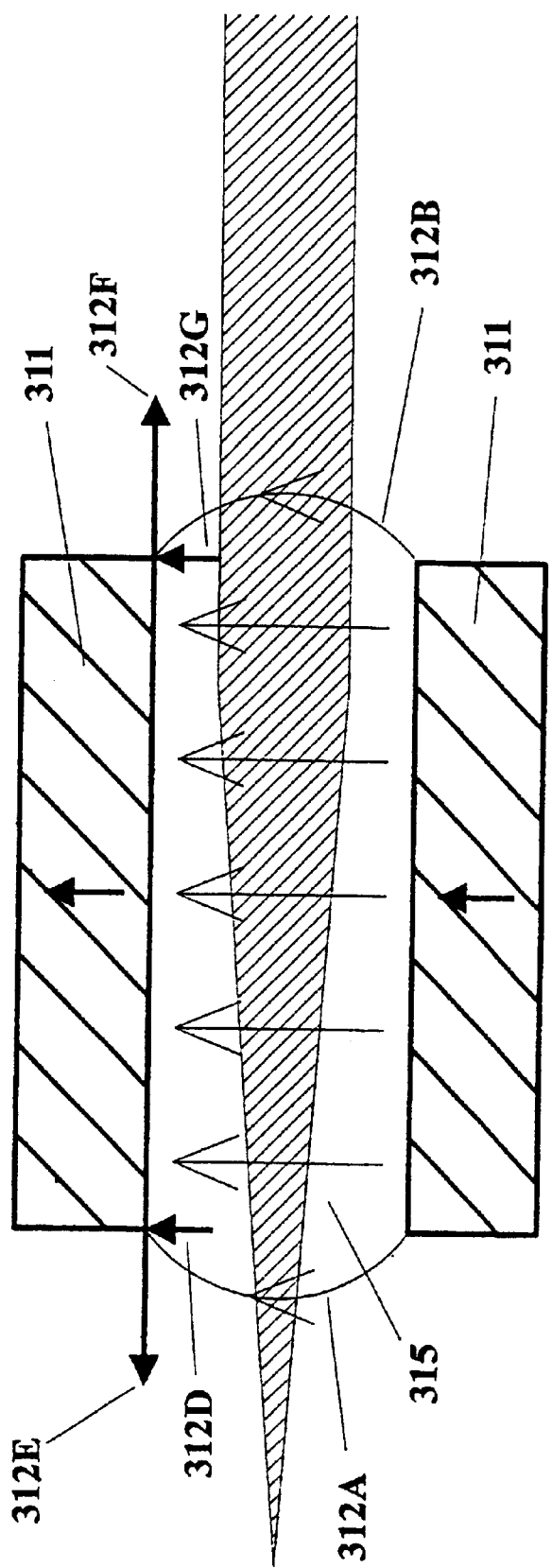
FIG. 3e shows the components of fringe field responsible for the focusing action viewed in a direction parallel to the source.
Figure 3F:
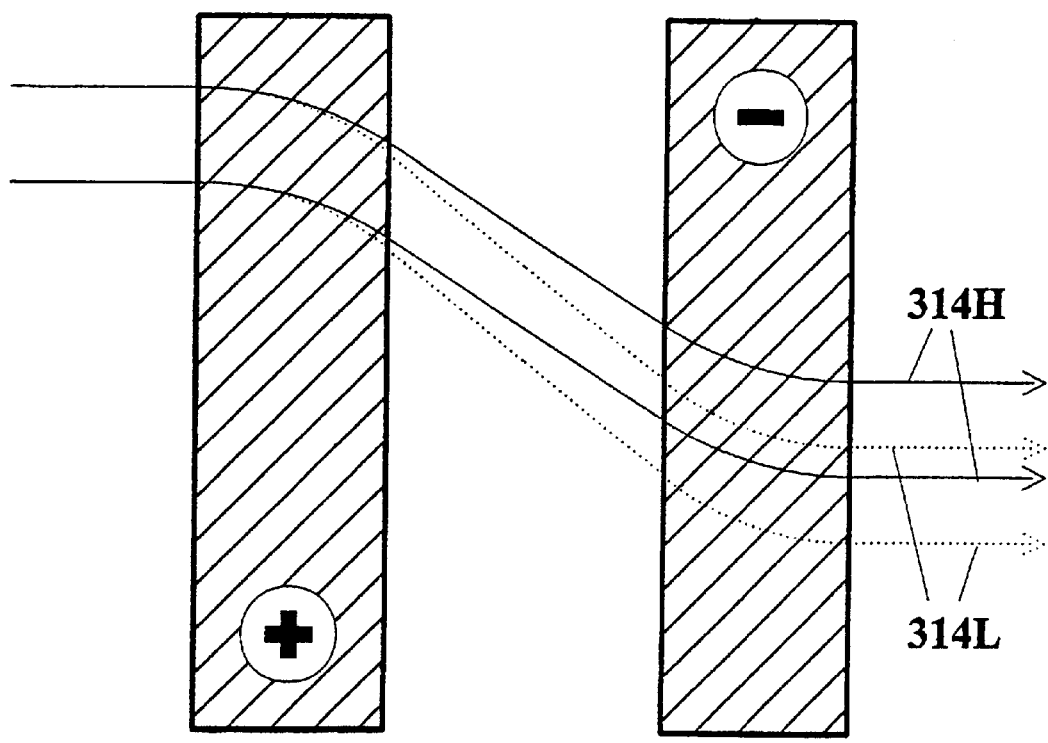
FIG. 3f shows the different trajectories followed by different masses as seen in the plan view.

Returning to consideration of the effects of the boundary fringe magnetic field 312A, 312B and so on, the reason that no focusing effect occurs when the ribbon beam enters at right angles to the faces of the magnetic poles is explained in further more detailed explanatory FIGS. 3e and 3f. FIG. 3e is an enlargement of the side view of gap 315 shown in FIG. 3c. Considering the notional magnetic field lines 312A at the entry to the gap 315, the magnetic field 312A can be regarded as having components 312D and 312E. The component 312D provides the bending effects of the ribbon beam 314 as shown in plan view in FIG. 3b. The component 312E has no effect upon the incoming beam 314, because the beam is travelling in the same direction as the component of magnetic field 312E. (In this explanation second order effects are ignored, and will be described more fully hereinafter). Thus, no significant focusing is produced by the component 312e on the incoming beam 314.

However at the exit region of the gap 315 the curved magnetic fringe field 312B can be regarded as having components 312F and 312G. The component 312G is responsible for some bending of the beam in plan view as shown in FIG. 3b as the beam exits. The component 312F is now not parallel to the exiting beam, which exits at an oblique angle to the pole boundary. Thus a bending effect is imposed on the beam by the reaction between the charged particles in the diverging beam and the magnetic field component 312F. This effect will vary according to the angle in plan view between the beam 314 and the component 312F, and dependent upon the charged mass and energy of the particles. The parameters are chosen in the particular embodiment described to be such that the effect of the component 312F on the diverging regions of the beam 314 in FIG. 3e, is to converge the beam to be a parallel faced ribbon beam, for the required species. At the central plane 320 of the beam 314, the magnetic field 312B is perpendicular to the plane of the ribbon beam, so that there is no component equivalent to the component 312F. The focusing effect occurs only at the divergent regions of the ribbon beam, as for an optical lens, portions of the beam at the centre of the lens merely pass through without deflection.

Thus a summary of the apparatus shown in FIGS. 3a to 3f is as follows. Apparatus for acting upon charged particles has particular application in a mass analysis apparatus. An array of elongate magnetic poles 311 extends longitudinally in the direction of a longitudinal axis 350 of the array, the array having a symmetrical reference surface 320 containing the longitudinal axis and passing through the array with magnetic poles 311 on each side of the reference surface. Charged particles 314 enter into, or originate in, the field of the magnetic pole array at a position spaced from the said longitudinal axis 350. The array of magnetic poles is such as to provide between opposed poles 311A, 311B, an extended region of magnetic field in which the charged magnetic particles pass with a curved motion imposed thereon by the field, together with entry and exit regions 312A and 312B which provide curved fringe magnetic fields 312A, 312B, giving focusing or divergence of the beam of charged particles passing through the fringe field at an angle to the normal to the entry or exit region. The apparatus includes resolving means 332 for selecting a required species of particle from the beam by parameter dependent dispersion in a plane transverse to the reference surface 320, by focusing of the beam of particles at different focal points 331 along the general direction of propagation of the beam 314.

Returning now to the consideration of secondary effects, some small amount of bending will occur at the entry of the beam 314 into the gap 315 because divergent portions of the beam 314 will interact at a slight angle with the components 312B of magnetic field. Similarly some small bending of the main beam 314 will occur even in the curved boundary fringe magnetic field 312A, so that as soon as the beam has entered the beam will have some angle in plan to the component 312E. However these second order effects are very small compared with the focusing achieved at the exit region of the gap 315 due to the much greater oblique angle of exit of the main beam in this region.

In considering these diagrammatic Figures for explanation purposes, it is to be appreciated that in other embodiments of the invention numerous other bending and focusing effects may be achieved beyond the simple form shown in FIGS. 3a to 3e. For example if required the beam may enter the magnetic analysing system at an oblique angle, or may be allowed to exit at an oblique angle. In the embodiments shown, if the beam enters at an oblique plan view angle, it will always exit at the same oblique plan view angle. However in other embodiments the magnetic field systems may be designed differently so that different angles of entry and exit may be achieved. Similarly focusing effects by the boundary fields may be such as to produce the effects of converging or diverging lenses, as required.

Finally in considering the paths following by components of the beam, reference is made to FIG. 3f which is a detail of the plan view of FIG. 3b. In FIG. 3f there are shown the paths of notional beam components 314H and 314L as they pass through the magnetic system. The beam components 314H represent the paths of heavier charged particles within the beam and the components 314L represent lighter components within the beam. It will be seen that some dispersion of the beam takes place in the plane of the paper in FIG. 3f, since the lighter components 314L of the beam pass along more curved paths through the gaps between the magnetic poles than the heavier components 314H, with the end result that for the lighter components 314L the ribbon beam is displaced side ways to a greater extent than for the heavier components. However this dispersion is not a useful dispersion so far as mass analysis is concerned because there is afforded no means of providing an aperture to permit passage of required species, and blanking out of unwanted species. In the system shown in FIGS. 3a to 3f, the only useful dispersion which occurs is that shown in FIGS. 3a and 3c, in the plane of the paper for those Figures. Only this dispersion, in a plane perpendicular to the slot of the beam, is it practicable to position analysis apertures for mass analysis.

Various further embodiments of the invention, and technical effects thereof, will now be described.

FIG. 4a shows the simplest case of a transverse field dipole with a section through two long poles 41 with parallel magnetisation and with an ion beam 42 passing along the plane of geometric symmetry (central plane) between the parallel pole faces 43, the magnetic field crossing this central plane at right angles. The entry fringe field 44 and the exit fringe field 45 have a curved geometry which gives a focusing action which is dependent on the angle that the ion beam passes though the fringing field (and also the direction of the field and the electrical charge on the ion). As it is the component of the fringe field parallel to the central plane which gives rise to the focusing action, it is necessary for the ion beam to be travelling at an angle to this direction for their to be a strong focusing action on the beam. FIG. 4b is a view along the direction of magnetisation showing a number of ion beams passing across the central plane between the pole faces. Beam 42A enters the entry field at right angles and there will be no focusing action. As it passes across the magnetic field it is deflected so that it exits at an angle which gives convergent focusing action. The focusing action on beam 42B is convergent at entry and divergent at exit and the focusing action on beam 42C, like that in FIG. 1e is convergent at entry and exit. Unlike the situation in FIG. ID, the entry boundary 46 and exit boundary 47 are parallel and therefore no focusing action occurs in the central plane. FIG. 4c is structurally a dipole but the field geometry is that of a double dipole or, for a short pole width (between the entry and exit boundaries), a quadrupole. The focusing effect for an angled entry beam 42D is generally converging but the situation becomes complex for low energy beams which are substantially deflected producing powerful convergent focusing action of a type which will be discussed in the next section. FIGS. 4e & 4f show dipoles of an axial field type where the direction of the magnetic field in the central plane is along that plane in directions perpendicular to the entry and exit boundaries. The fringe fields 44B and 45B are in opposite general directions and fields 44C and 45C are parallel when the dipoles are considered in isolation but the detailed behaviour is dependent on the nature of the rest of the magnetic circuit. The focusing action is generally weakly convergent for a beam entering normal to the entry boundary. Oblique entry results in a displacement of the beam axis out of the central plane.

The second and third main aspects of this invention use any combination of these dipoles to produce the desired overall focusing effect. The magnetisation in the pole region can be produced electromagnetically; the pole can be (and normally would be) be a magnetic material of substantial magnetic permeability to enhance or control this electromagnetically produced magnetic field or the poles can be permanent magnets. The directions of magnetisation are shown in FIG. 4 in orthogonal directions for simplicity but they may advantageously be at intermediate orientations. The position of conductors relative to the poles will influence the shape of the magnetic field.

In the third aspect the multipole array is long and the beam is a wide ribbon beam extending across the central plane.

In the fourth main aspect of this invention the entry and exit dipoles are the transverse-field type shown in FIG. 4a and the pole width is chosen so as to produce substantial deflection of the beam. In the fourth aspect the beam starts or is introduced by appropriate means into an extended magnetic field region between these transverse-field dipoles and passes through the multipole into another region. If the field is uniform, the charged particle path would be circular in both of these regions, and the particle path may repeatedly cross through the multipole region, being focused appropriately for the particular requirements. The position of crossing through the multipole will tend to drift in one direction; if the multipole axis is curved then this can be made into a closed loop with particles of opposite charge deflecting and drifting in opposite directions. In the fifth main aspect the beam starts and finishes in field free space.

Figure 5A:
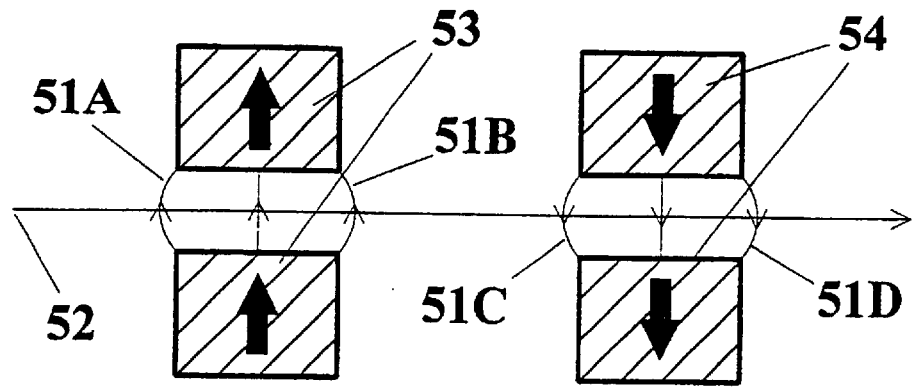
FIG. 5a shows an end view and FIG. 5b the plan view with particle trajectories of a pair of well separated, magnetically opposed dipoles.
Figure 5B:
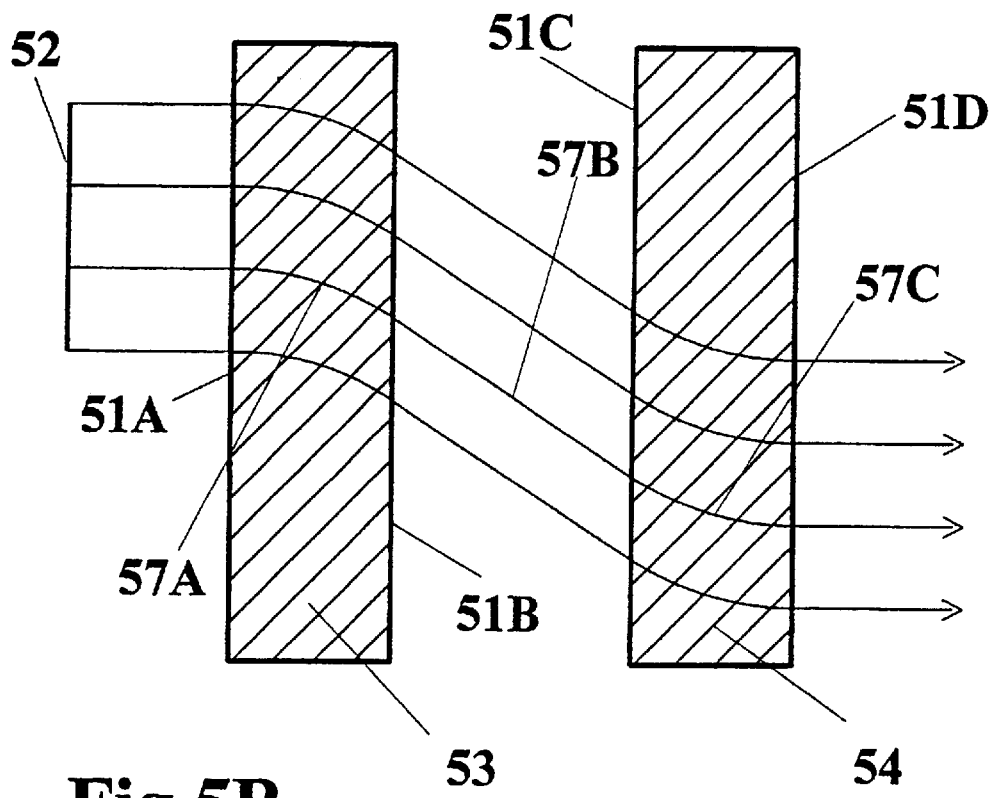
Figure 6:
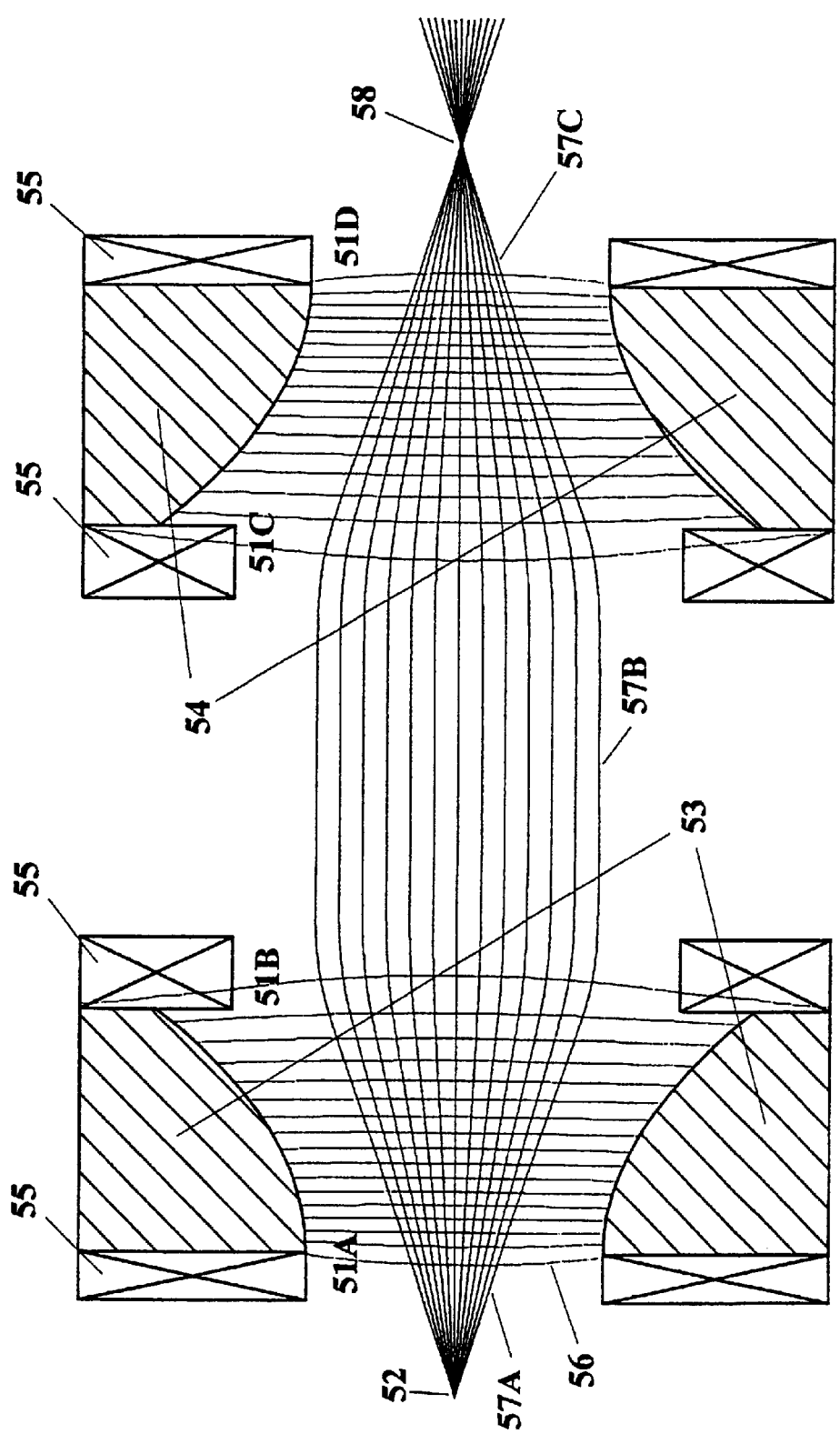
FIG. 6 shows a computer generated end view of particle trajectories through a pair of well spaced, magnetically opposed dipoles.

One aspect is the important case of the entry and exit extended field regions being equal and opposite in magnitude, the example of a double dipole line lens of this type being shown schematically in FIGS. 5a&b (which can be regarded as a wide quadrupole or as two separate dipole line lenses). A parallel ribbon beam entering the lens along the central plane at any angle to the entry boundary will leave the lens as a parallel beam which is parallel to entry beam. The lens system therefore does not disturb the geometry of the beam so that a uniform beam entering the line lens remains a uniform beam as it passes through and exits from the lens. The beam will experience convergent focusing in a plane at right angles to the ribbon plane which can be very strong. FIGS. 5a&b show a ribbon bean from a line source 52 entering at normal incidence into the entry boundary 51A. FIG. 6 shows the same view as FIG. 5a showing the focusing action in a plane parallel to the beam direction and at right angles to the central plane of the multipole for a computer modelled geometry with shaped electromagnetic poles 53 and 54, conductor coils 55 producing magnetic flux lines 56. There is no significant focusing at entry boundary 51A because of the normal incidence (there is slight divergent focusing due to the deflection of the beam in the fringe field but this is a weak second order effect); the beam is deflected as it passes through the pole gap between poles 53 resulting in an oblique exit trajectory through boundary 51B giving convergent focusing which focuses the divergent beam 57A to a parallel beam 57B, the mass energy, energy and charge state of the beam and the field strength (determined by the current in conductors 55) being chosen to give this condition. The beam 57B travels in a straight line through the field free space between the two dipoles, experiences convergent focusing upon oblique entry into boundary 51C to give a convergent beam 57C and no further significant focusing upon normal exit from the final boundary 51D. The position of the focus crossover 58 in FIG. 6 is mass dependent and is the basis for the mass analysis technique of this invention.

Figure 7A:
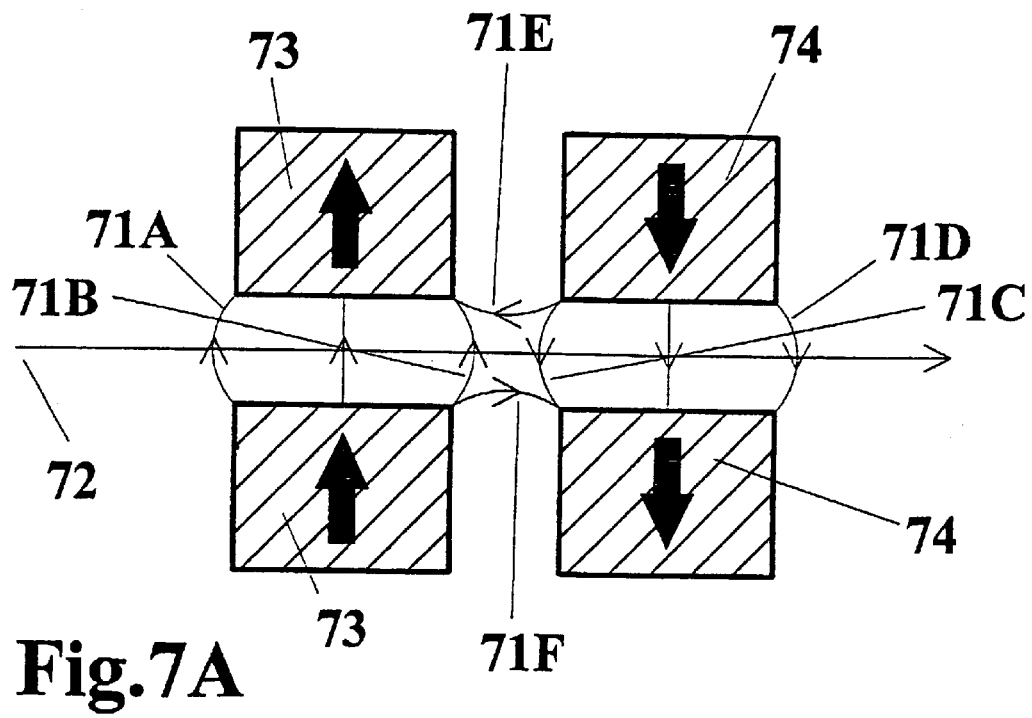
FIG. 7a shows an end view of a quadrupole array and FIG. 7b a plan view with particle trajectories.
Figure 7B:
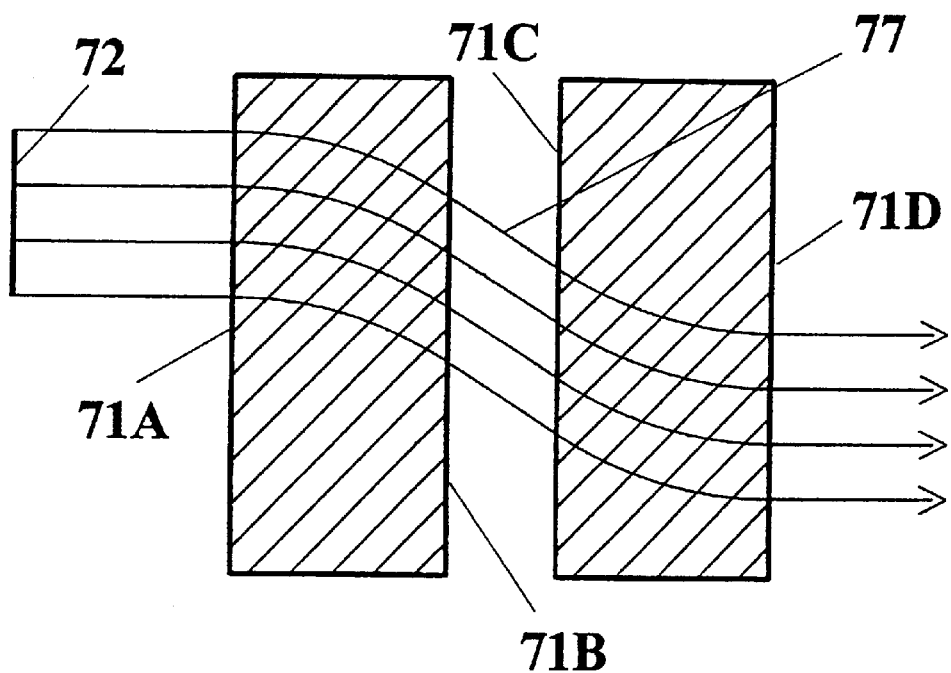
Figure 8:
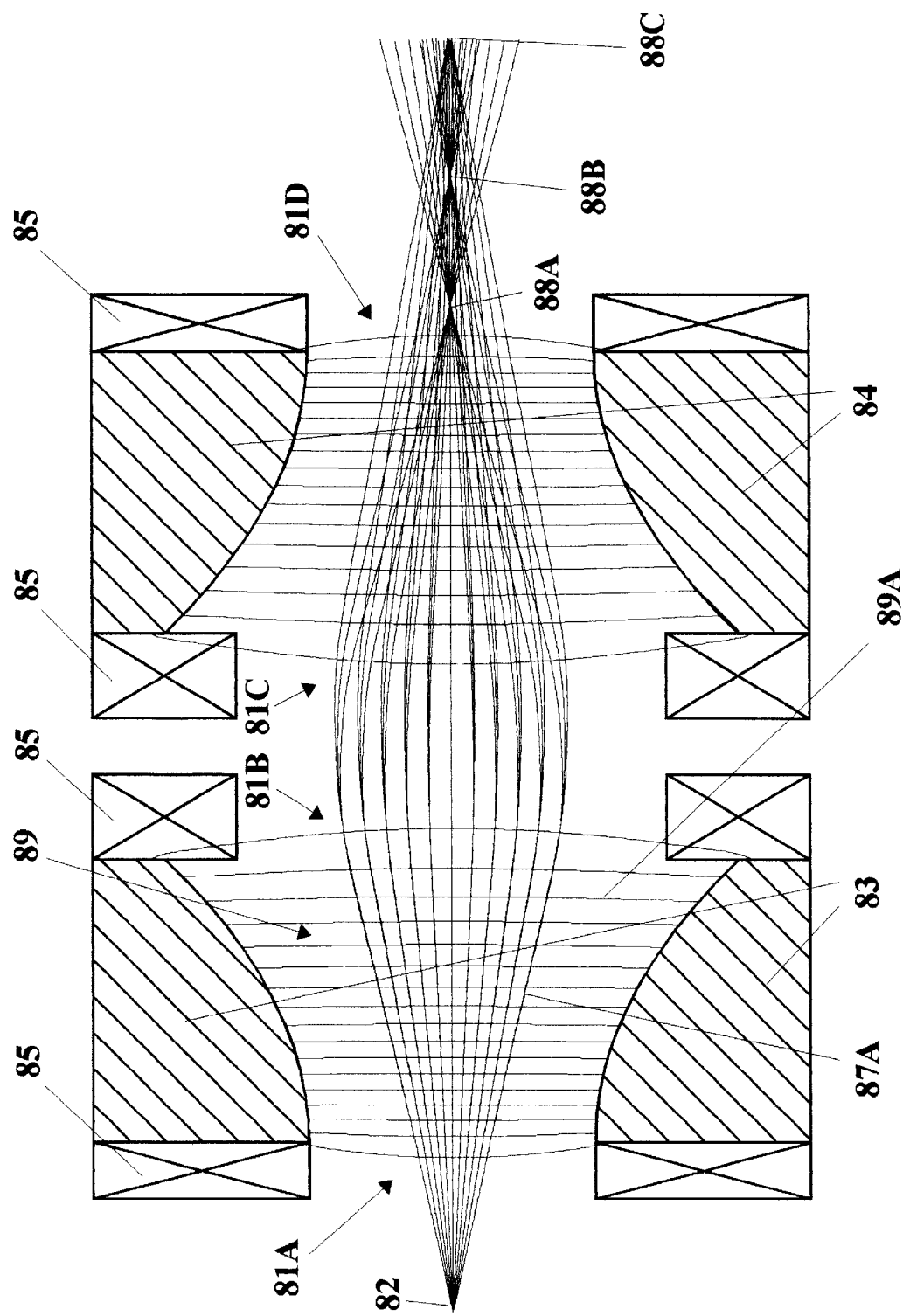
FIG. 8 shows a computer generated end view of three particle trajectories through a quadrupole array.

FIG. 7a shows the view along the axis of a quadrupole lens formed by bringing the two dipoles of FIG. 5 together so that there is significant field interaction leading to substantial quadrupole field components 71E and 71F between dipoles 73 and 74, in addition to the four boundary fringe fields 71A,B,C&D. FIG. 7b shows a view of the central plane with beams 77 from line source 72 passing through the quadrupole and being continuously deflected in the quadrupole. FIG. 8 is equivalent to FIG. 7a but is a practical computer modelled geometry with shaped poles 83 and 84 with opposite directions of magnetisation produced by electrical conductors 85. The beam 87A from line source 82 passes through boundary fringe fields 81A,B,C&D leading to mass dependent focusing to crossovers at 88A,B&C for masses of ratio 10:11:12. FIG. 8 also shows transverse field regions of magnetic field 89 with curved field lines 89A produced by the inhomogenous field between the non-parallel pole faces of poles 83.

Figure 9A:
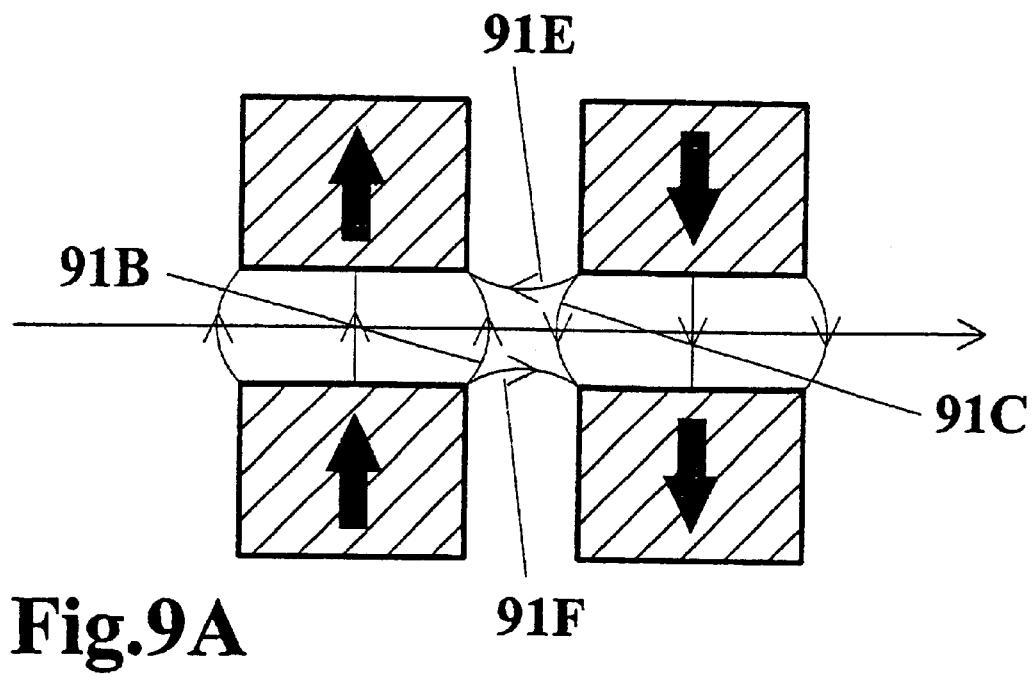
FIGS. 9a and 9b show the end view and plan view of a quadrupole array with collection means for particles travelling along the quadrupole axis.
Figure 9B:
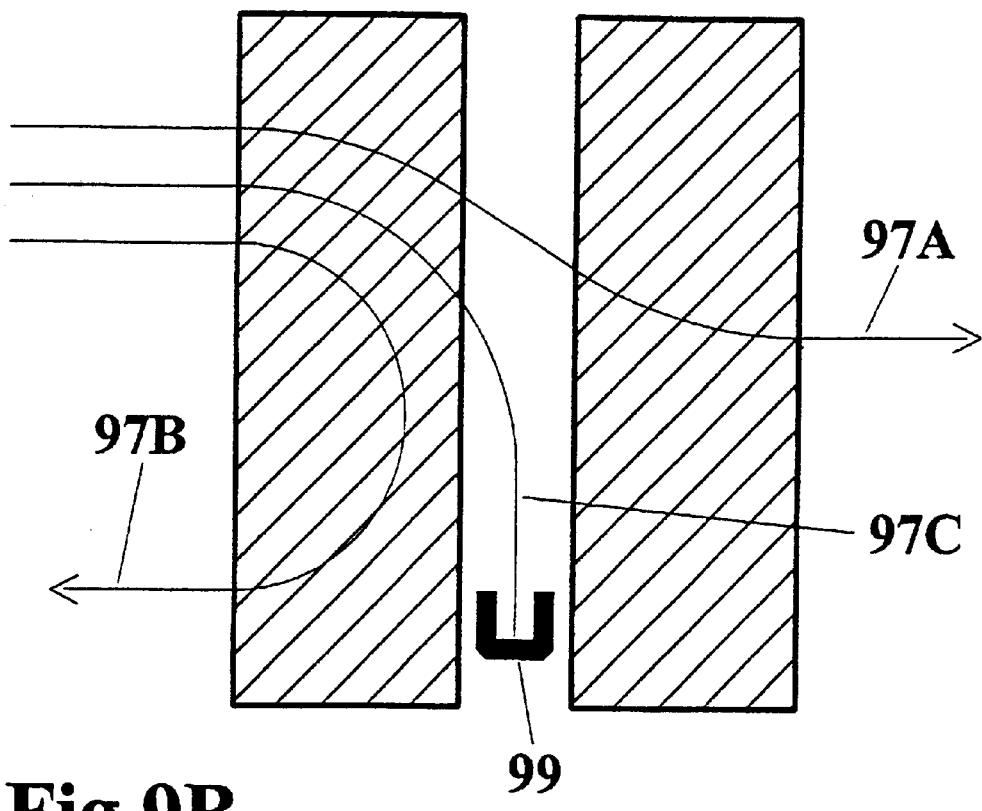

As the power of the lens is increased or the ion mass decreased the crossover position approaches the centre of the lens, leading to a situation, to be described later, where the crossover occurs in the lens with further focusing action occurring after the crossover. Eventually, with increasing lens power, a stage is reached where the focusing action, as viewed in the plane perpendicular to the direction of elongation, appears to be infinitely powerful (a zero length focal length). This corresponds with the situation shown in FIGS. 9a&b where the beam 97A in FIG. 9b is transmitted, beam 97B is deflected (reflected as viewed in the plane perpendicular to the direction of elongation) through 180° before reaching the quadrupole region and there is a limiting case where the beam travels along the quadrupole axis. The invention in its fifth aspect makes use of this by placing a collector cup 99 some way along this axis, leading to very high mass selectivity and making it an ideal geometry for a very high resolution mass spectrometer or mass separator. The quadrupole focusing action produced by fringe fields 91B,C,E&F contains the beam along this axis leading to efficient collection at the cup 99.

Figure 10A:
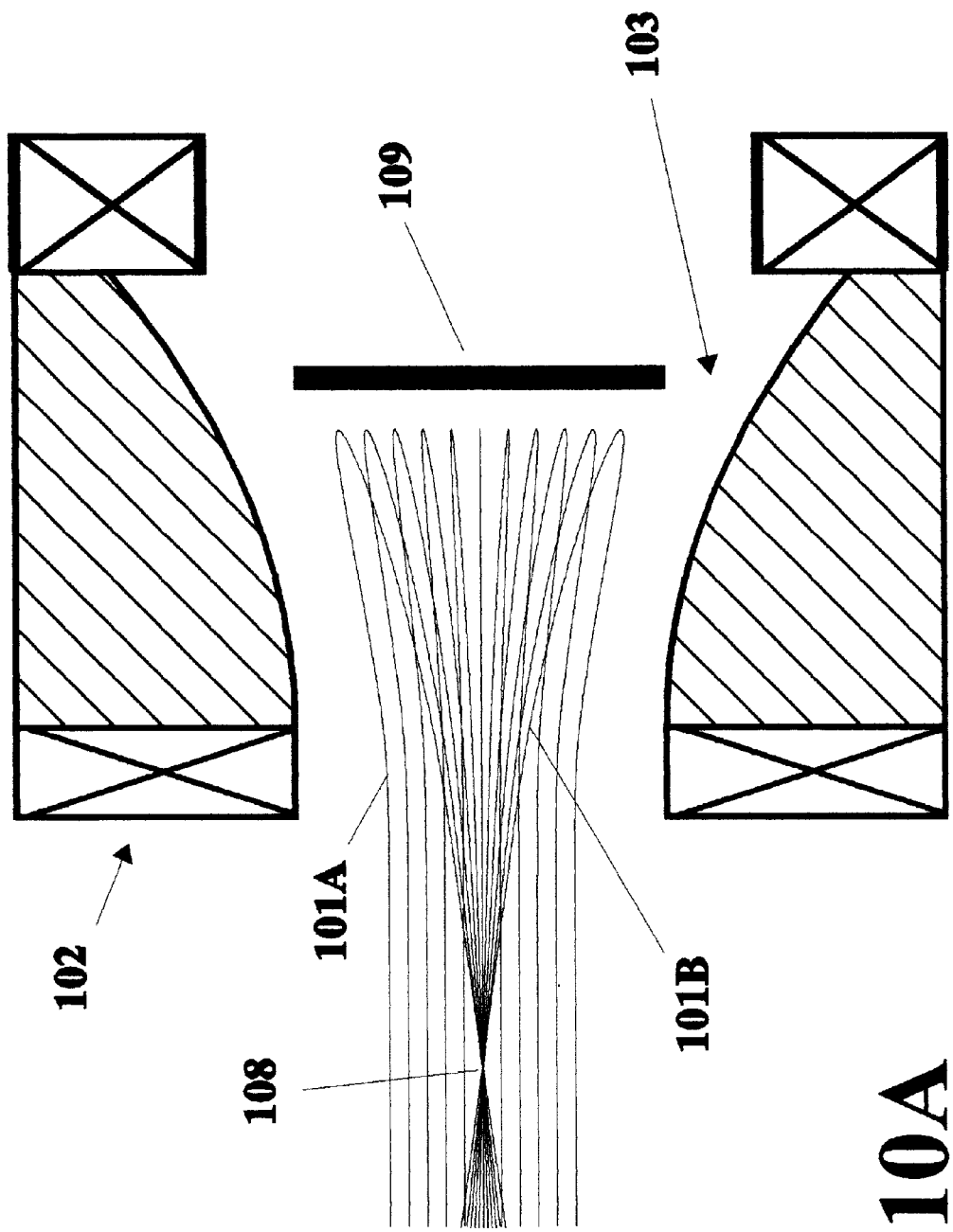
FIGS. 10a and 10b show end views and plan views of a dipole used as a magnetic mirror.
Figure 10B:
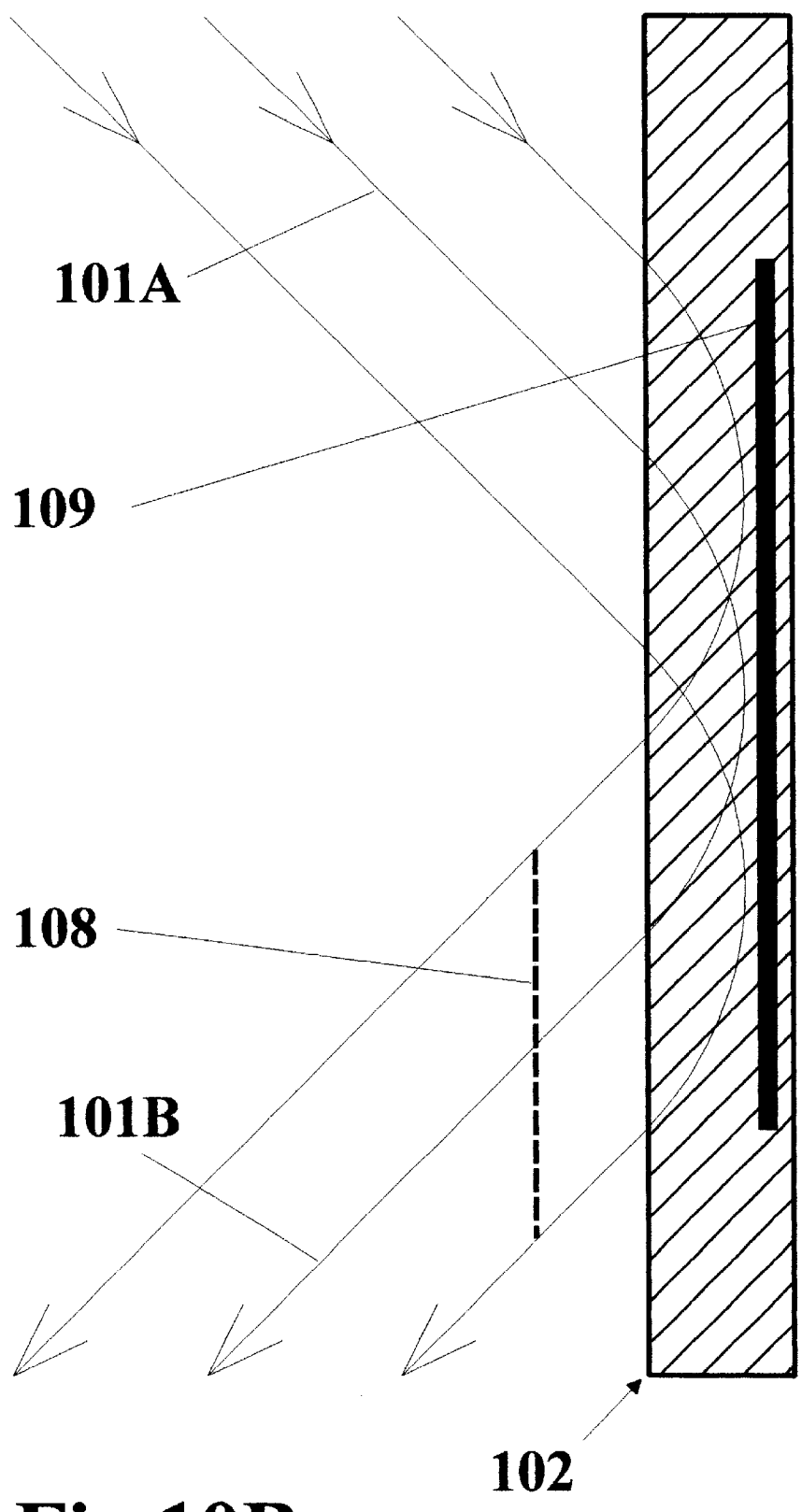

The invention in its sixth aspect makes use of 'reflected' beams to create a useful ion mirror. The focusing action of a reflected beam is shown in FIG. 10a for a dipole (all that is necessary when dealing with the reflection situation), the beam in this case a parallel beam 101A entering at 45° incidence being focused to a crossover 108 of an exit beam 101B after 'reflection' through 90°, as shown in FIG. 10b. A more useful situation is the parallel input beam being reflected out as a parallel beam which will occur at a slightly lower lens power. The reflect/transmit criterion or a collector plate 109 can be used to limit the maximum mass reflected. The term 'reflected'is used because the optics obeys an 'angle of incidence=angle of reflection' criterion. Reflection from a dipole is a useful technique for deflecting a wide beam through a large angle such as would be required when there must not be line of sight between the ion source and the target. When the beam is narrow enough for the entry and exit beams to not overlap, then the focus crossover 108 can be used for mass analysis.

Figure 11:
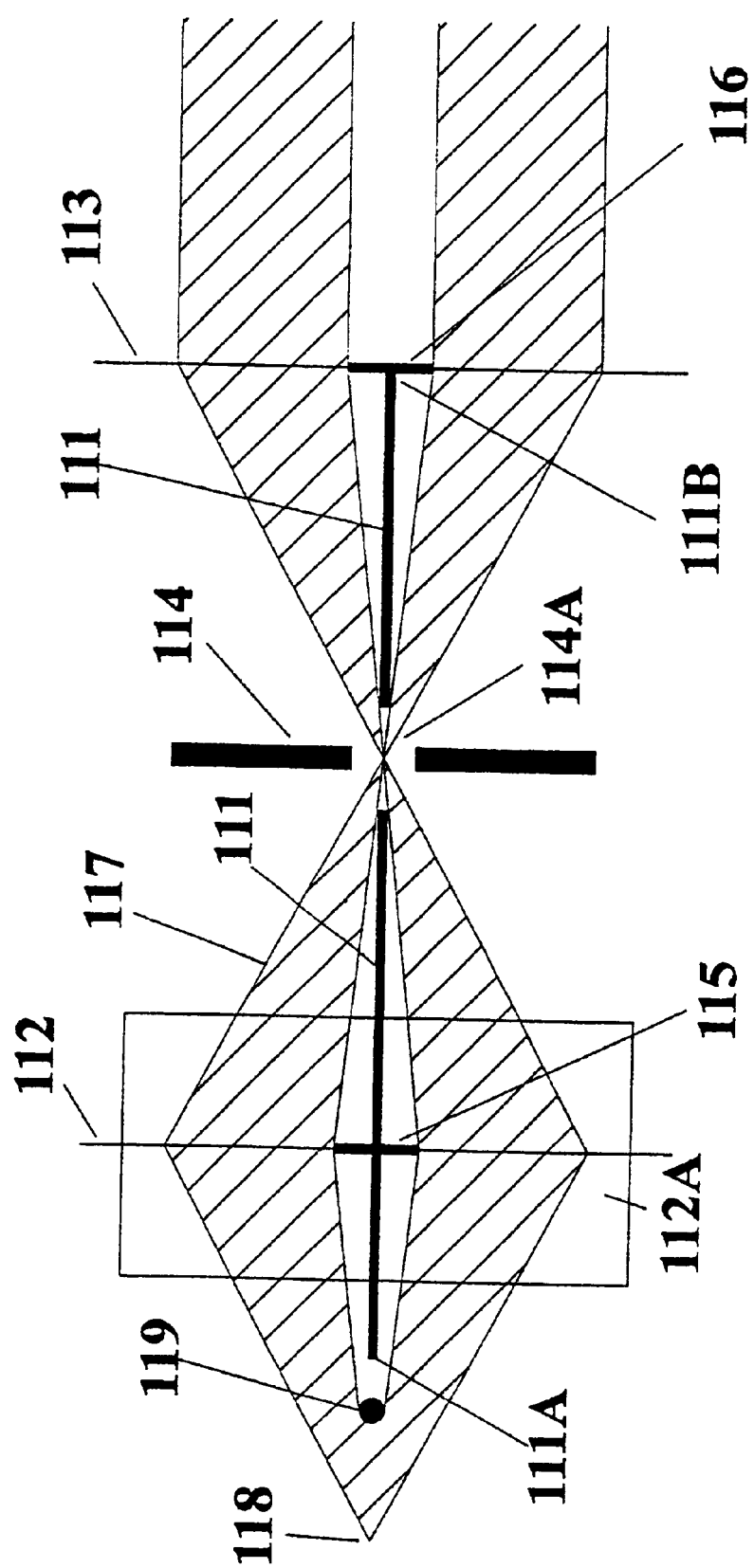
FIG. 11 shows the resolving and transmission limiting structures applied to a two lens system producing a parallel output beam in the dispersion plane.

The invention in its seventh aspect consists of a structure which allows only the required beam to be transmitted by focusing at and through an aperture in this structure but for all other beams to be intercepted. The invention in one aspect is the particular important case of this structure having an aperture in the position of the crossover at the central plane of the required species. The invention in another aspect consists of an additional structure which prevents the transmission of high mass species which either focus to a crossover at some inconveniently long distance along the central plane or do not crossover at all. FIG. 11 shows an example of this mass analysing structure. The resolving structure 111 consists of a thin structure on the central plane with an aperture at the position chosen for the crossover focus for the required beam 117 as a result of the action of the line lens 112 acting on a beam diverging from an object position 118. This structure extends to the position 111A in the source direction sufficiently to intercept all beams which cross the central axis after reflection. The distance that the resolving structure extends towards the target is dependent on the subsequent optics of the beam. If the resolving structure were to stop at position 111B, means must be available to prevent transmission of beams not blocked by this structure. This means consists of a transmission limiting structure 114 with an aperture 114A at the central plane crossover position combined with beam stops at positions 115 and 116 which determine how much of the centre of the beam is removed and prevent the transmission of any beam focusing to a crossover beyond position 111B, the limiting case being where the aperture 114 width is the same as the beam stop (115 and 116) width. These beam stops are best placed where the beam is widest i.e. at lens 112 and at the position of any subsequent lens 113 used to create a parallel beam for transmission to the target. Beam stop 115 combined with aperture 114A also limits line of sight to the extraction region in the vicinity of the object position 118.

The resolving structure described is most appropriate for high perveance, low energy beams which will have a high divergence. This is partially because the fraction of the beam removed by the beam stops is less for a beam with substantial divergence (a half angle of 3°, for example, with the beam stop removing the centre half angle of 0.25°). The invention in an eighth main aspect takes advantage of the need for a beam centre structure for mass resolution by providing means for reducing the space charge potential in the centre of the beam in the extraction region where electrostatic fields prevent the formation of a beam which is space charge neutralised by the presence of low energy secondary electrons (as occurs throughout the multipole lens region where electrostatic fields are absent). The wire 119 (or thin strip) has a number of functions:

a) it controls the potential at that position and influences the potential along the geometric axis of the beam;

b) it allows secondary electrons caused by ions striking this wire to move along the centre of the beam towards the extraction region thus reducing the space charge in the beam. The electron mobility is not constrained by the lens magnetic field as this wire is outside the magnetic field region 112A of the lens 112;

c) it removes any very low mass ions (such as protons) from the centre of the beam which would reflect back from lens 112 directly into the extraction region (the more divergent light ions will be reflected back sufficiently off-axis to not cause a potential problem.

This wire can either be at a controlled potential or it can float and allow the potential to be determined by the effect of the secondary electrons. There are now two problems to be considered; this wire will be eroded (and may suffer undesirable surface changes) and its position needs to be accurately controlled. This leads to the invention in the ninth main aspect whereby wires and strips (such as the resolving and transmission limiting structures) are moved slowly along their axial direction in order to continually replenish the surface exposed to the beams (both the required and the removed beams) in order to prevent excessive removal of material (leading to breakage) or excessive build up of surface layers. In many ion implant situations these precautions will not be necessary; the rate of erosion of the wire 119 in FIG. 11 compared with the time interval for other maintenance procedures will determine the need for this wire to be renewed on a continuous basis; the need for continuous replacement of other components will be determined by beam chemistry. One particular example for the need for component renewal is for the case of oxygen ion beams; if atomic oxygen is transmitted through the aperture 114A in component 114 in FIG. 11, then molecular oxygen will strike component 114, and, assuming that this is a metallic component, oxide formation could lead to surface charging which would lead to beam degradation.

These renewable components would probably be delivered from a drum or coil and would most conveniently be made of thin flexible material. The part of the resolving structure close to the aperture needs to be as thin as possible in order to minimise the width of the resolving aperture required to transmit the required beam. The wire 119 will most effective as a small diameter wire close to the extraction region. The use of thin wires and strips leads to the invention in the tenth main aspect which is to tension these components in order to keep them straight so that they are always exactly at the required position.

Figure 12:
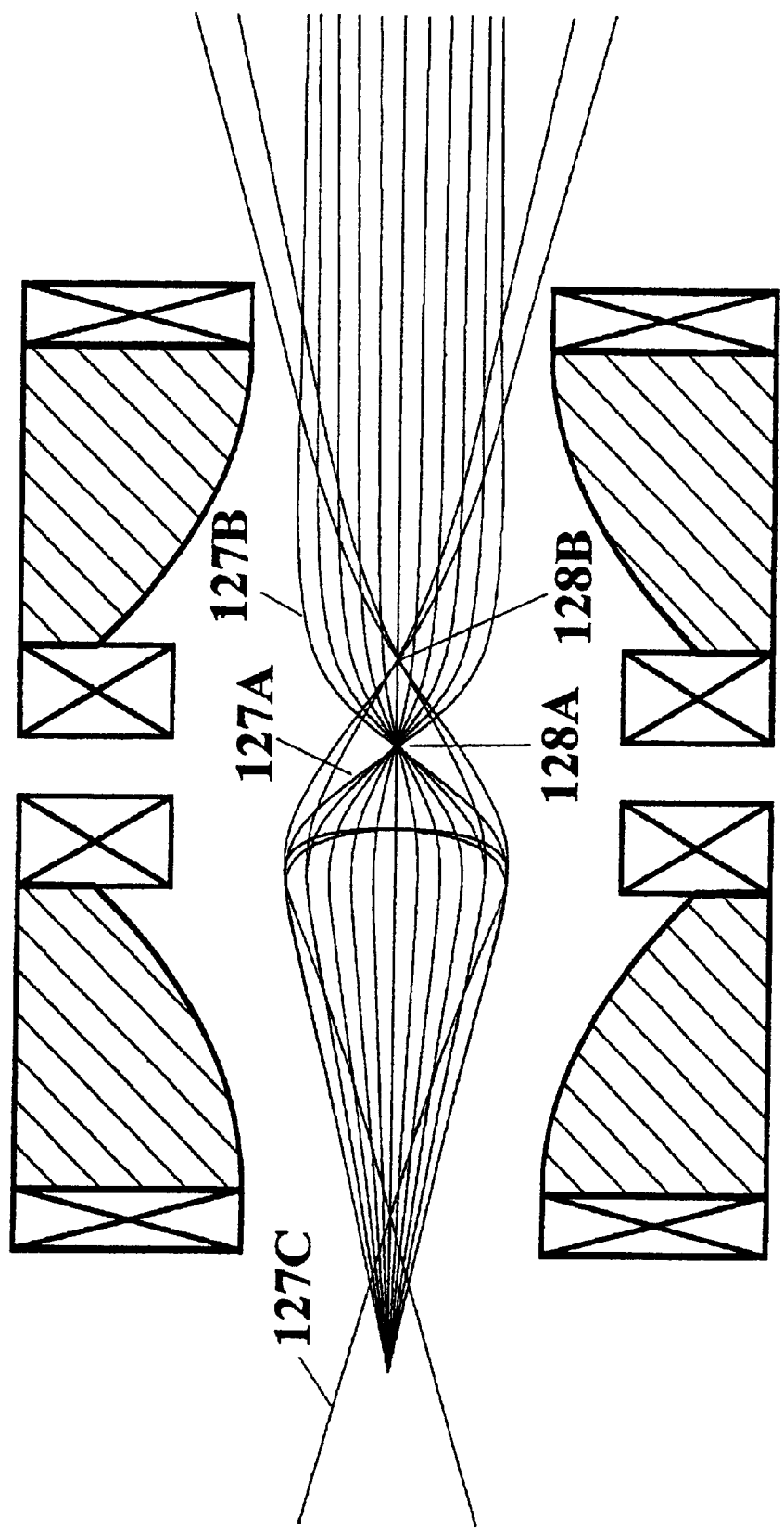
FIG. 12 shows a computer generated end view of particle trajectories through a quadrupole lens in strong lens mode with a parallel exit beam of the required species.

The invention in one aspect is concerned not only with mass analysis but also beam formation. In general, ion implantation for semiconductor materials requires the beam to be a parallel beam (in the ribbon plane and the dispersion plane). FIG. 12 shows the beam optics when the quadrupole lens of the type shown in FIG. 8 is used in a 'strong lens' mode. This is where the required beam 127A passes through a crossover at 128A and the required beam 127B is then focused into a parallel beam using a single quadrupole lens. If the required beam were boron (mass 11 atomic mass units), focusing at position 128A then the next lighter mass position at mass 10 amu is in a beam 127C which reflects (the outer beam only is shown) and mass 12 amu focuses at position 128B which is well clear of the resolving aperture position.

The invention in another aspect is concerned with the use of two or more lenses to achieve mass analysis, enhanced mass analysis due to multiple crossovers, line of sight protection (against sputtered contamination reaching the target) and focusing of the beam to the final required optics. The final required beam optics leaving the magnetic line lenses will generally be a parallel beam unless subsequent acceleration or deceleration of the beam is required.

Figure 13:
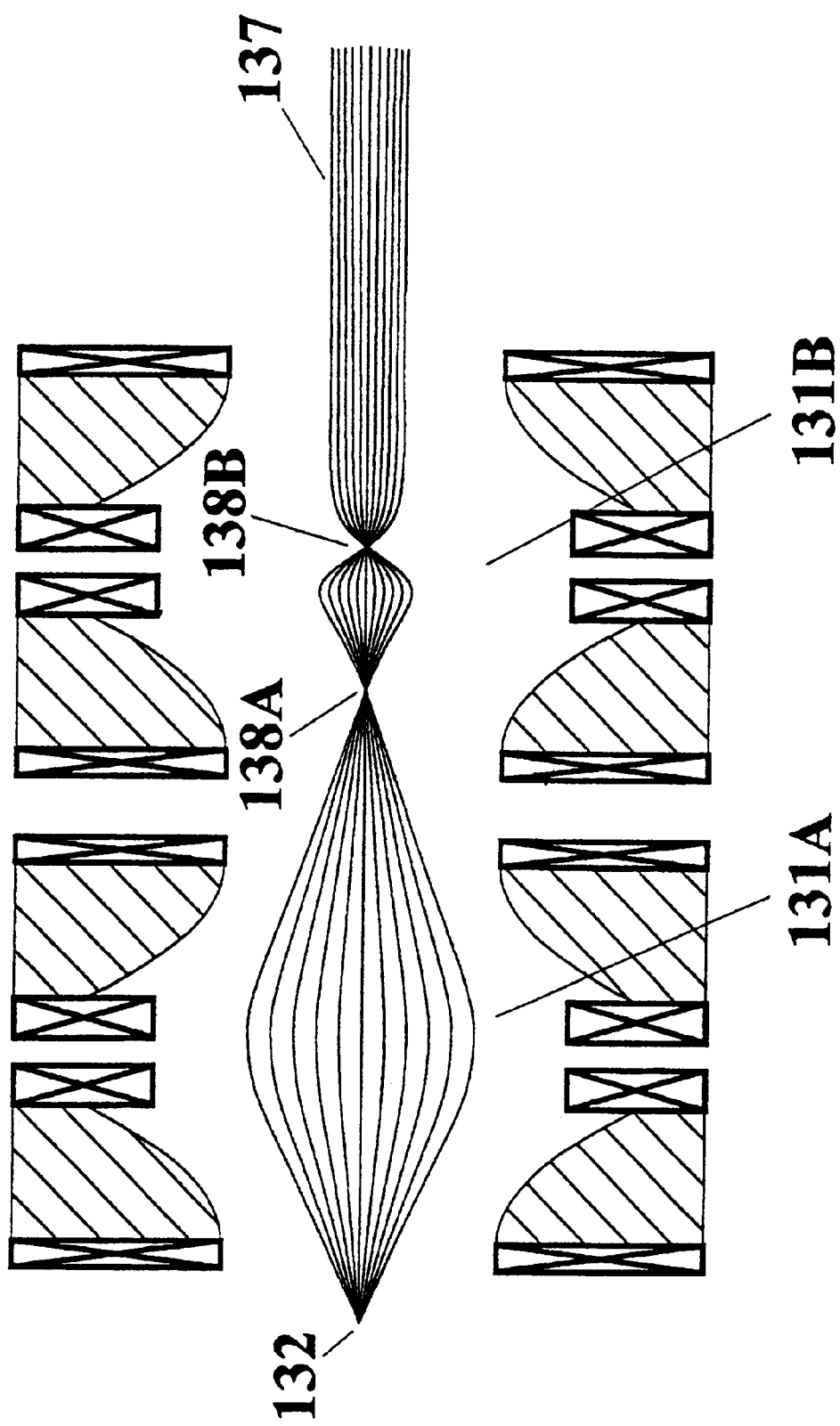
FIG. 13 shows a computer generated end view of particle trajectories through a two lens system with two crossovers and a parallel exit beam.

FIG. 13 shows a system consisting of two lenses 131A and 131B (with a common central plane—a useful special case) producing crossovers at positions 138A and 138B for a ribbon beam diverging from object position 132, the final output beam 137 being nominally parallel in the dispersion plane. Provided the ribbon beam is uniform and parallel in the ribbon plane when it leaves the source 132 then the beam arriving at target is parallel. If the line source is curved to produce a converging or diverging beam in the ribbon plane, then the lens system is curved concentrically to maintain this geometry.

Figure 14:
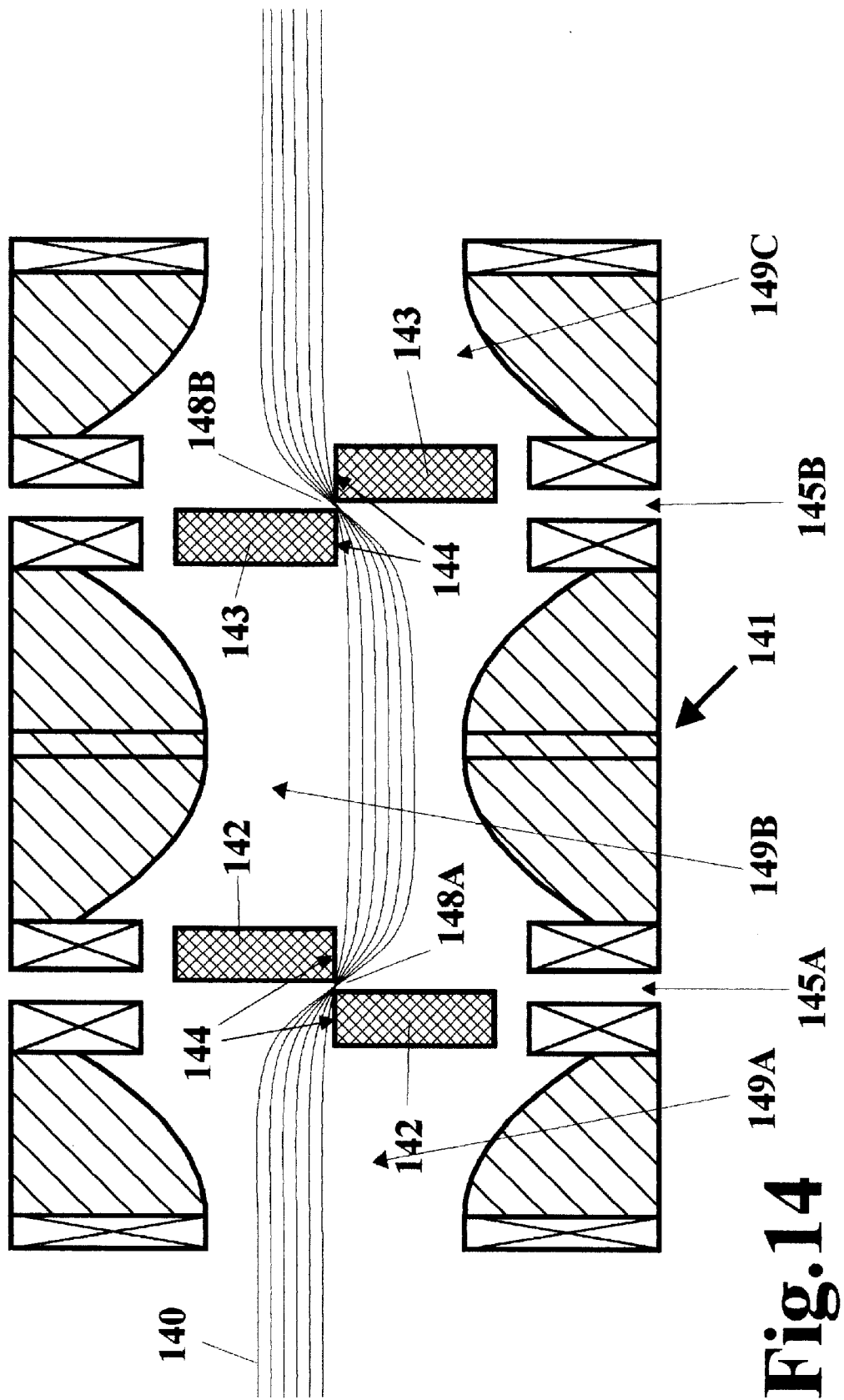
FIG. 14 shows a computer generated end view of an example of asymmetric mass analysis.

The two lenses can have similar or opposite magnetic polarity. It is best for the first lens to be variable independently of the second so that variations in the object position due to variations in extraction conditions can be accommodated. In situations where the lenses can be used as a matching pair, with the same current passing through all conductors, and when the magnetic polarity is opposite in the two lenses, it is possible to create a doublet lens with the two adjacent conductors removed (as they will have equal and opposite electrical polarity as shown in FIG. 14. The same applies to combinations of more than two lenses.

FIG. 14 is concerned with dealing with (but not restricted to) low perveance beams which leave the source extraction region with a low divergence so that a central resolving structure is not an attractive proposition. The first part of the optical system (not shown in FIG. 14) is used to create a narrow parallel beam. The beam is then passed into a parallel-in/parallel-out lens system consisting of one or more line lenses, where the beam is always on one side or other of the central plane of these lenses. The parallel beam condition is unusual in that an off-centre beam has an object position which is apparently on the centre plane because it is at infinity. This means that beam crossovers are on the central plane. The use of such asymmetric lens combinations is not restricted to parallel beam conditions.

FIG. 14 shows an example of a doublet line lens 141 with two quadrupole fields indicated by regions 145A and 145B between three regions of transverse field (inhomogenous) 149A, 149B and 149C producing two crossovers at positions 148A and 148B from a parallel entry beam. The resolving structure consists of components 142 and 143 which, if surfaces 144 are on the central plane, creates an infinitely thin resolving structure. There is no line of sight through this structure. The beam entering this lens system can be from a lens system with or without a resolving structure.

Figure 15A:
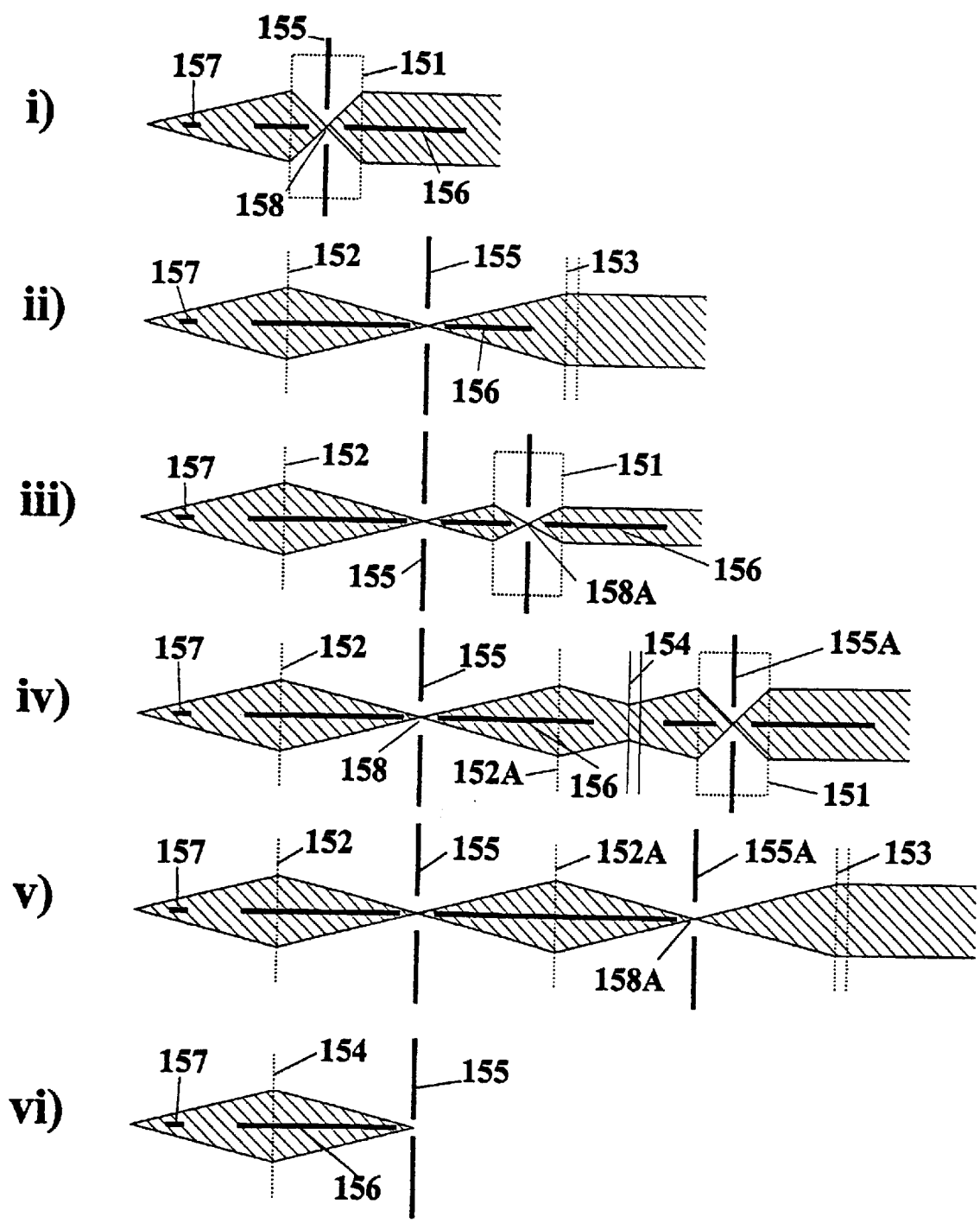
FIG. 15a show a number of beamline configurations employing symmetric analysis.
Figure 15B:
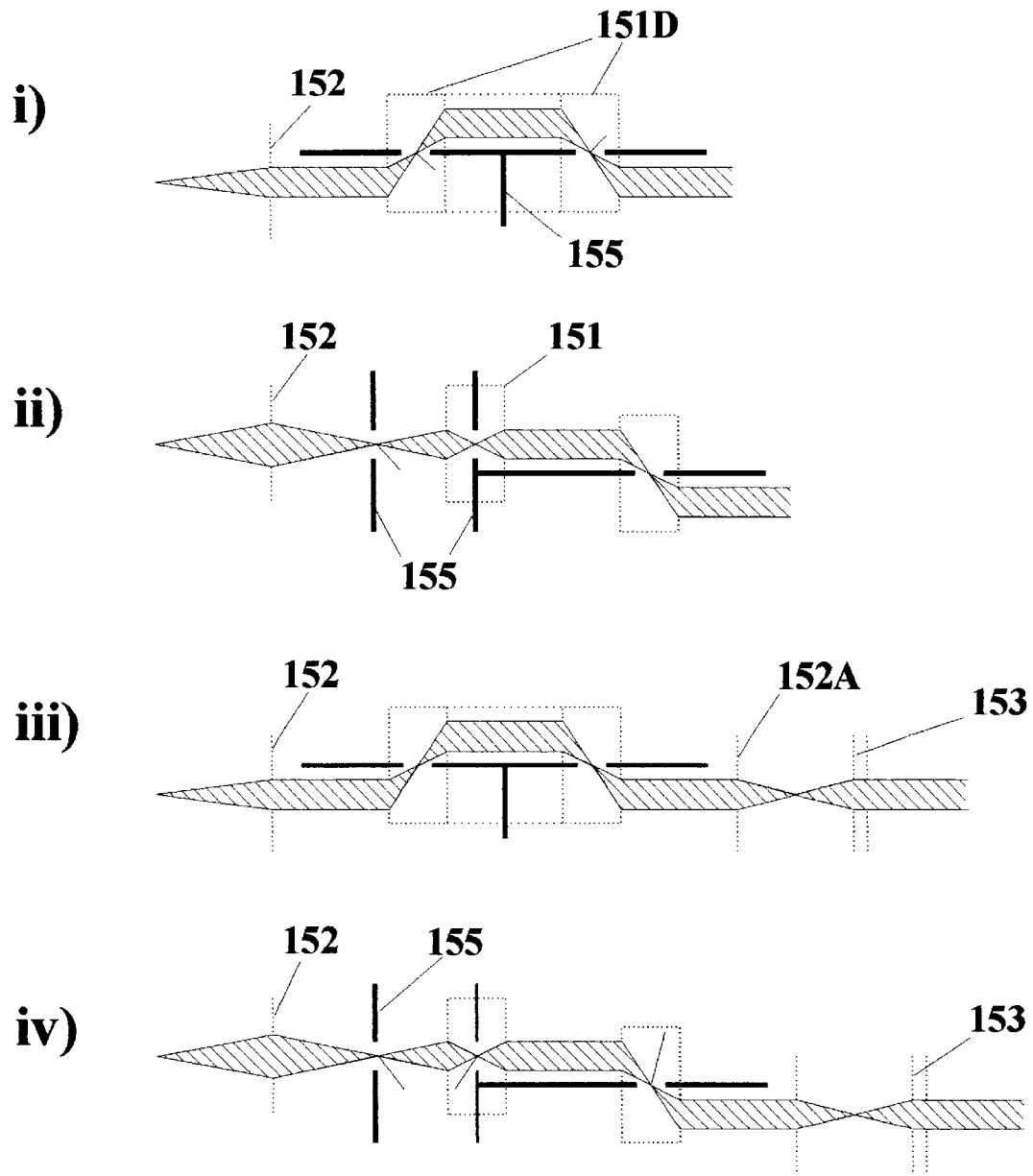
FIG. 15b show a number of beamline configurations employing asymmetric analysis.

Examples of the way these line lenses can be combined are shown in FIGS. 15a and 15b, FIG. 15a showing examples of symmetric systems and FIG. 15b asymmetric systems, the views being along the axis of the extraction slot. The important components are the 'strong' lenses 151, 'normal' lenses 152, post-acceleration systems 153 which accelerate the beams to a higher energy, post-deceleration systems 154 for decreasing beam energy, transmission limiting structures 155, resolving structures 156, space charge electrode in the form of a wire or strip 157. The beam is brought to one or more crossovers 158.

FIG. 15a(i) shows the simplest case of a single lens 151 used in the strong lens mode providing the crossover 158 at the aperture position in resolving structure 156 and transmission limiting structure 155 necessary for analysis and also producing a parallel beam for transmission to the target. The main consideration when using any system with a single crossover is the transmission of sputtered material to the target caused by reflected beams hitting surfaces in the region between the source and the crossover position. The detailed geometry of the system will determine the line-of-sight situation. This will not be a problem for the case of boron ions produced from boron trifluoride, as there will be no significant impurity beams at lower ion masses. If boron implantation is carried out using diborane or decaborane feeds, then there are reflected hydrogen ions and others, depending upon which species is required. There is the issue of material sputtered from the resolving structure on the target side of the crossover which is also a feed dependent issue (most of these heavier ions do not get past the transmission limiting aperture). The issue of sputtered material transmission disappears if a magnetic mirror is used to deflect the beam through 90° onto the target.

FIG. 15a(ii) shows a single magnetic lens 152 used in 'normal' lens mode where the post-acceleration system 153 is used to create a parallel beam and in FIG. 15a(iii) a second strong lens 151 produces the parallel beam and provides a second crossover 158A which will be very effective in preventing sputtered contamination transmission.

FIG. 15a(iv) shows a deceleration system. The first lens 152 focuses the beam to a crossover 158 for mass resolution; the second lens 152A provides a converging beam into the post-deceleration system 154 and the third lens 151, a strong lens, produces a parallel beam and acts as an energy filter.

FIG. 15a(v) is an example of a two magnetic lens system, lenses 152 and 152A, where the second lens is used to provide a variable crossover position 158A as the input to the post-acceleration system 153, enabling the optics of the final beam to be optimised.

FIG. 15a(vi) shows a lens stage that can be added to the front of any of the above beamlines. An initial lens of this type can have a number of functions; it can focus the beam through a narrow slit to improve the emittance of the beam passing through to the next stage and provide an extra crossover, which increases the mass resolution; an independently controlled first lens is always needed to cope with the variable object position (this position being a function of extraction conditions); and when there is a substantial hydrogen beam it may be desirable to prevent reflection of these light ions by making this first lens a hydrogen removal lens.

FIG. 15b(i) shows an example of an asymmetric system where a low divergence beam is extracted from the source and where the requirement for a central resolving structure would not be convenient. The first lens 152 produces a parallel beam which is introduced asymmetrically into lens 151D, a strong lens doublet, giving excellent line-of-sight characteristics. FIG. 15b(ii) shows an alternative asymmetric layout; lens 151 need not be a strong lens and lenses 152 and 151 could be replaced with a single lens to produce the parallel beam, the choice being determined by resolving power and line of sight issues. FIG. 15b(iii)&(iv) are similar systems with post-acceleration 153 preceded by an optional lens 152A controlling the input optics into the acceleration stage. The system shown in FIG. 15b(iv) is ideal for a very high current oxygen machine; when the required beam is atomic oxygen, most of the molecular beam will strike one component 155, the transmission limiting structure, and this structure can be a moving strip (to prevent oxide charging problems) or it can be carbon, the oxides being gaseous and therefore can be pumped away.

The invention in another aspect concerns the ability to combine line lens systems to mass analyse and focus many ribbon beams travelling in parallel planes from multiple slot ion sources. This aspect covers the general case for any mass analysis technique which retains the beam in the plane containing the long ion source slot and the twelfth aspect covers the specific case of magnetic line lenses.

Figure 16:
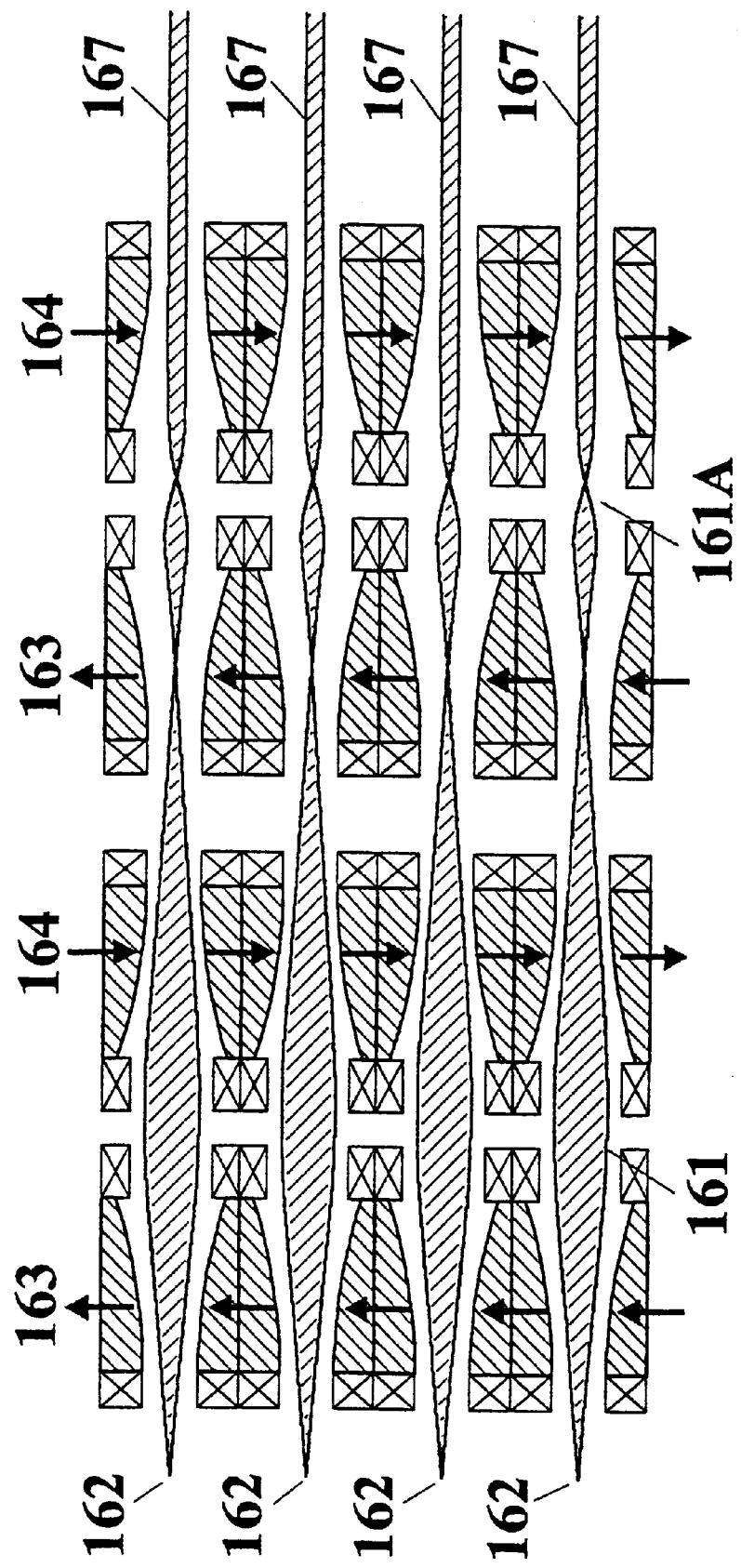
FIG. 16 illustrates an end view of multiple beam analysis.

FIG. 16 shows multiple two lens beamlines using multiple lenses 161 and 161A with parallel directions of magnetisation 163 and 164 producing common magnetic circuits. A series of beams 167 in parallel planes are produced from parallel line sources 162.

Figure 17:
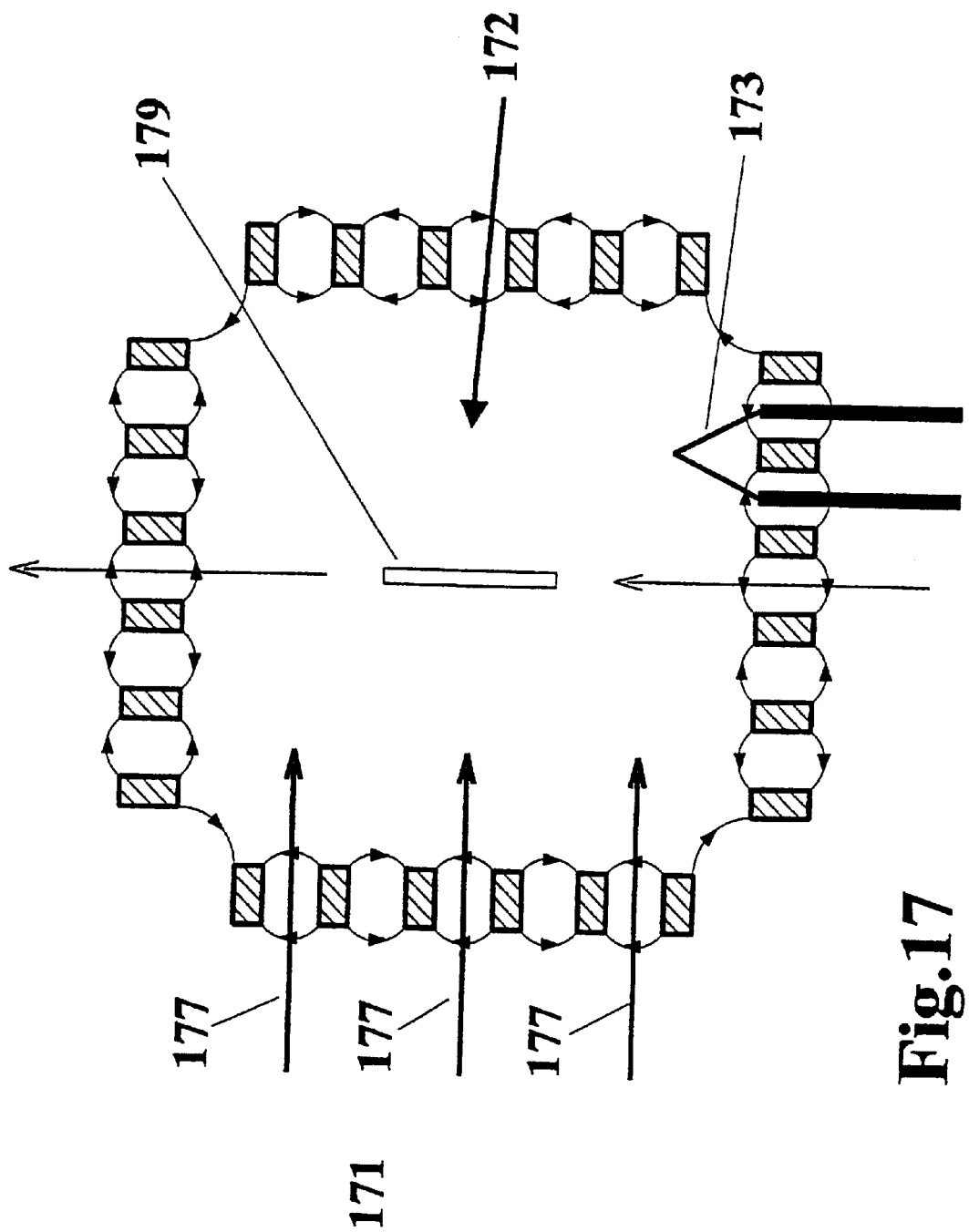
FIG. 17 shows the multicusp plasma containment system for the prevention of target surface charging by surrounding the target with a gaseous plasma.

FIG. 17 is concerned with the need to be able to implant the high beam currents made available by this invention without damage to the surface of the target caused by surface charging. FIG. 17 shows beams 177 leaving line lens mass analysis and focusing system beamlines 171 and entering the multicusp plasma region 172. Filaments 173 can be used to generate a gaseous plasma in the multicusp region and the target elements 179 ( a single target element shown for simplicity) can move into, through or mechanically scanned in the multicusp region 172, passing through the ion beams 177 in the process.

Figure 18:
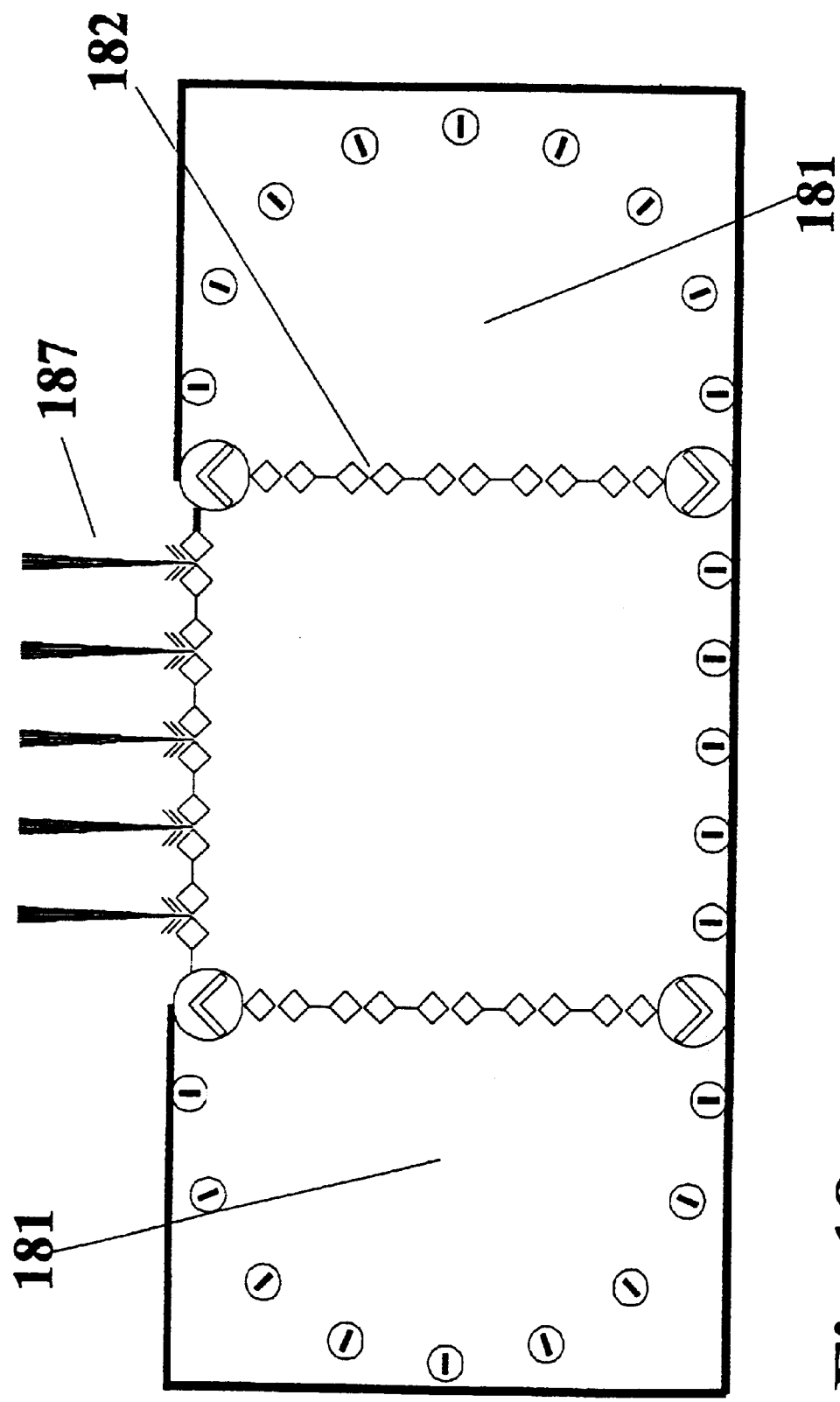
FIG. 18 shows a section through a 2-stage virtual pole ion source.

FIG. 18 is concerned with the need to provide uniform moderate and high intensity ion beams because the invention relies on the ability to achieve a uniform implant of the target by simply passing the target through a series of uniform ribbon beams, there being no beam scanning involved. A virtual pole source can provide such uniform beams but, for very high uniformity and/or high beam current densities, substantial improvement is possible by making the ionisation a two (or more) stage process. FIG. 18 shows two plasma generation regions 181 where plasma is produced by one of a number of mechanisms (not shown), hot filament arc discharge and microwave generation being two of the most important techniques. The plasma generated in region 181 is very uniform when the gas pressure is low enough for primary electrons formed by the generation technique to have a mean free path between ionising events which is large enough for the plasma not to be excessively concentrated close to the region of primary electron generation. This uniform plasma then extends through the virtual poles 182 into the plasma region 183 from which the ion beams 187 are extracted, producing a better uniformity plasma than would be possible if the primary electron generation means was situated in this region. This technique becomes critically important when high beam current densities are required that make it necessary to generate the plasma at a pressure where the uniformity becomes sensitive to the distribution of primary electron generation.

This aspect of the invention is important when very uniform intense plasmas are required for the production of very uniform, high current density ion beams. The requirement for both uniformity and high current creates a conflict in the ion source. The high current density requirement means the beam must be extracted from an intense plasma which can be best achieved at relatively high gas pressures in the plasma region; the requirement for good uniformity is best achieved in a low pressure environment where plasma particles are free to move rapidly throughout the plasma region in order that the plasma should be uniform. The best solution is to create the plasma initially in relatively high pressure regions (of the order of $10^{-3}$ torr) and then to feed this plasma through virtual poles into a lower pressure (pumped) region (with a pressure of the order of $10^{-4}$ torr) from which the ion beam is extracted. This is a good technique for producing extremely uniform moderate current density beams, the virtual poles acting as uniform sources of primary electrons and plasma in contrast to the localised sources created from an array of filaments, for example, in a single stage source.

FIG. 19 is concerned with the need to extract a uniform beam from the uniform plasma. This requires precise adjustment of precise geometry extraction electrodes. It is not possible, in practice, to achieve this by accurate fixed positioning. The extraction gap must be consistent along the length of the extraction slot because the beam current will, in general, depend on the electric gradient at the plasma surface in the extraction slot (the exception being when the beam current is limited by the source and when space charge considerations do not significantly affect extraction optics). The extraction electrode must be accurately aligned with the central plane of symmetry of the ribbon beam extraction system so that the beam axis and the geometric axis are accurately aligned. Again, fixed positioning will rarely achieve this requirement.

The most important issue with this aspect of the invention is to be able to maintain the optimum geometry for a wide range of extraction voltages. This is not possible with a fixed geometry extraction electrode system. The ideal would be a mechanical arrangement that allowed all apertures in the system to be of variable geometry. The extraction slot could be variable geometry but the practical difficulties of achieving this with the required slot width tolerance and with a reliable mechanism make this extremely difficult to achieve. This aspect of the invention therefore deals with creating a variable geometry extraction field by controlling the other electrodes involved in the extraction process.

Figure 19A:
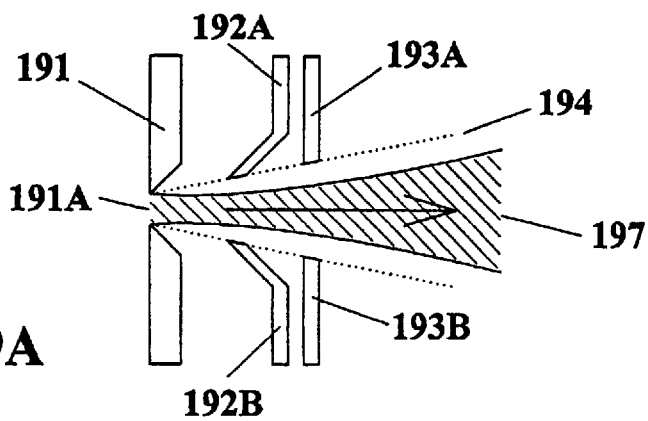
FIGS. 19a, 19b, 19c and 19d show the prior art and two embodiments of relative extraction field movement of the respectively.

FIG. 19a shows the outlet electrode 191 of the ion source, the extraction electrode assembly 192A and 192B (also called an accelerating or screening electrode) and the decelerating electrode assembly 193A and 193B (also called a ground electrode, as it is usually at ground potential when the subsequent beamline is at ground potential), producing an ion beam 197 from the plasma surface 191A. In a conventional extraction system, the structure containing electrodes 192A, 192B, 193A and 193B would be a fixed geometry assembly. This aspect of the invention allows some or all of these components to be individually moved.

The voltage difference between electrodes 192 and 193 is a way of providing an electric field which prevents low energy electrons, important for space charge neutralisation of the beam, from being accelerated towards the ion source and consequently lost from the beam. As this field generally has only a minor influence in determining the optics of the extraction field, it will generally be acceptable for the relative positions of electrodes 192A and 193A, and also 192B and 193B to be fixed. In known arrangements the position of the extraction electrode/deceleration electrode assembly 192A to 193B, can be moved as a fixed whole towards and away from the outlet electrode 191, along a direction perpendicular to the plane of the outlet electrode 191. However in accordance with the invention it has been appreciated that it would be advantageous if the extraction electrode assembly 192A and the decelerating electrode 193A, could be moved towards and away from the outlet electrode 191, along a converging path of movement shown at 194.

Figure 19B:
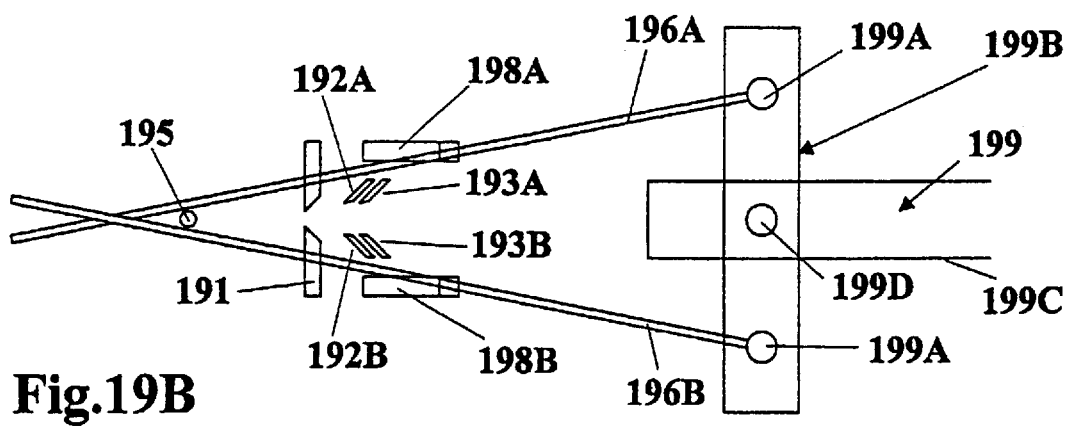

FIG. 19B is a plan view of an apparatus embodying the invention in this aspect, for achieving the path of movement 194. As shown in FIG. 19D, which is a side view of the apparatus, the outlet electrode 191, the extraction electrode assembly 192A and the decelerating electrode assembly 193A and B, are all elongate members which are elongate in a direction perpendicular to the plane of the paper in FIG. 19b. The electrode assemblies 192A and B and 193A and B are mounted on extraction electrode support structures 198A and B which are also elongate, and are attached at their upper and lower ends to a pair of inclined rods 196A and 196B. The rods 196A and B are pivotally connected at proximal ends thereof by swivel pins 199A to a support bar 199B which in turn is mounted on a shaft 199C. At the distal ends of the rods 196A and 196B, the rods contact pins 195 and are biased inwardly towards the pin 195 by resilient biasing means (not shown). The support bar 199B is slidably mounted on the shaft 199C to allow movement of the support bar 199B in a linear manner towards and away from the outlet electrode 191, and in a rotational manner by swivelling about the pin 199D.

FIG. 19b shows one of the many practical embodiments of this aspect of the invention. A pair of pins 195 (one at each end of the extraction electrode structure) are positioned behind the outlet electrode in line with the beamline axis. These pins can be on the source or above and below the source at ground potential. Two sets (top and bottom) of two rods or bars 196 are spring loaded against these pins; the extraction electrode support structures 198 are fixed to these rods and they carry tensioned electrodes 192A, 193A and 192B, 193B (tensioned to keep them accurately straight); the rods 196 are fixed to swivel pins 199A on support bar 1993 which can swivel about pin 199D on a general assembly 199. Movement of the shaft 199C along and across its axis combined with rotation about 199D can give a wide range of mechanical movements with convenient mechanical advantage for fine adjustment of the electrode assembly position (beam alignment by two techniques available—displacement or shear). Similar independent mechanisms at each end of the long extraction system give the adjustments necessary to achieve uniform extraction.

Figure 19C:
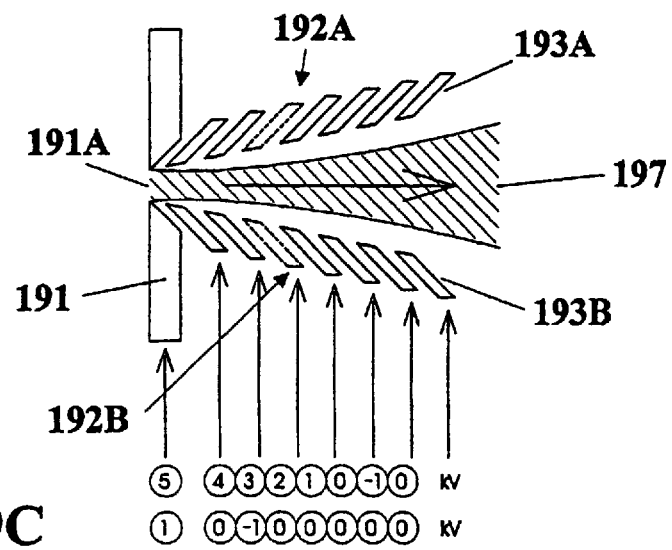
Figure 19D:
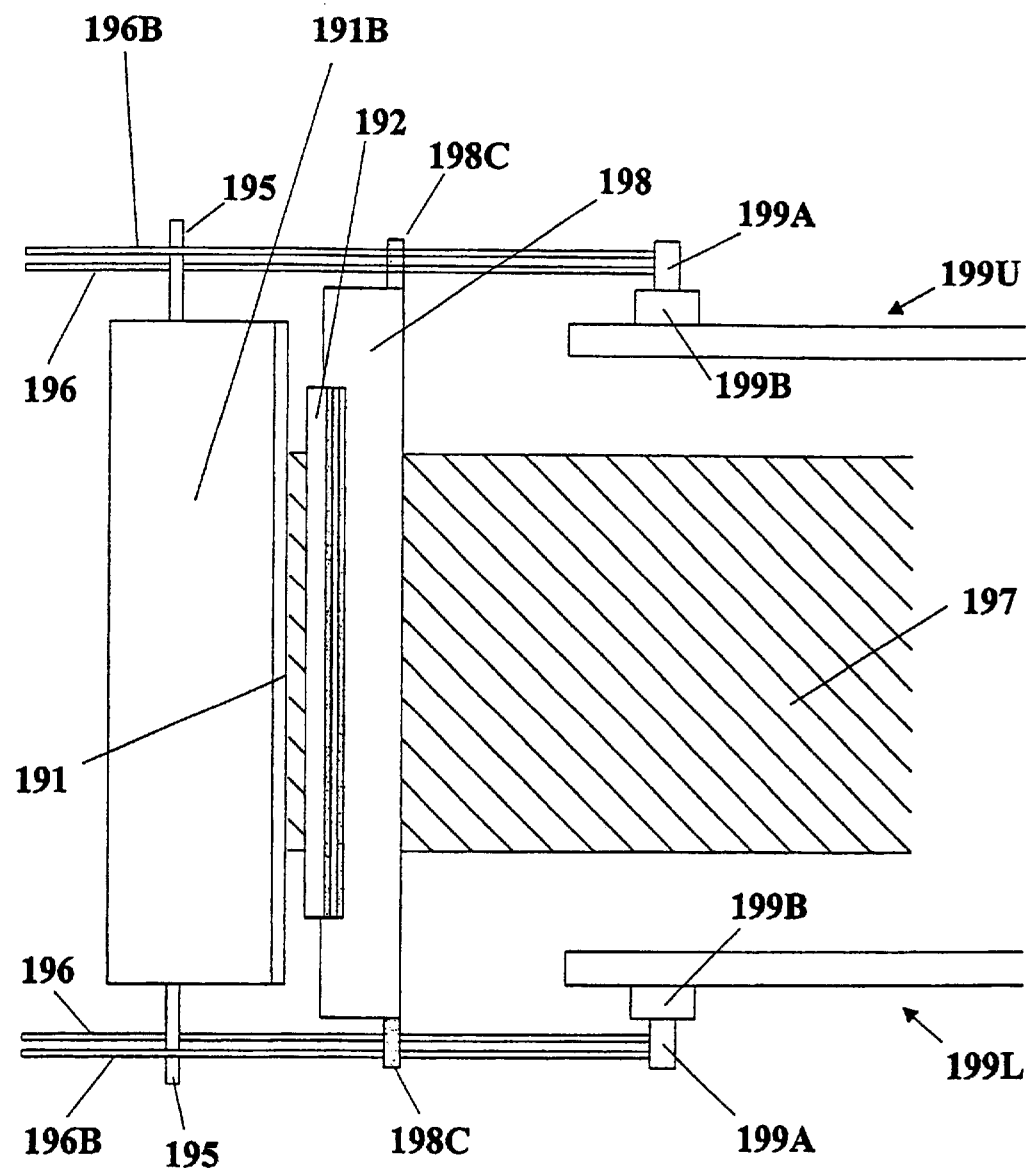

FIG. 19c shows the other technique where the movement of the extraction fields is achieved electrically. This is particularly suited to very low energy extraction where the extraction electrode needs to be very close to the ion source outlet electrode. Two sets of potential distributions are shown as examples, giving 5 kV and 1 kV beam acceleration respectively. In this case the spacing between electrodes is as small as the 1 kV potential between them reliably allows. Beam alignment is achieved by applying a bias potential across the beam on one or more electrodes. The electrodes are tensioned to keep them straight.

FIG. 19d shows a side view of the embodiment shown in FIG. 19b. The important aspect of the embodiment shown by this view is the ability to move the upper and lower components of assembly 199 (the upper component 199U and the lower component 199L) independently. This makes it possible to place the upper and lower ends of the extraction electrode assembly in exactly the position necessary to achieve a uniform beam (dependent upon the extraction gap between the extraction electrodes 192A and 1923 and the ion source outlet electrode 191)) travelling in the required direction (dependent upon correct positioning of extraction electrodes 192A and 192B relative to each other and relative to the central plane of the analysis system). The extraction electrode support structures 198A and 198B are connected to the support rods 196 and 196B by components 198C and the extraction electrodes 192A, 192B, 193A and 193B are kept straight by a tensioning system (not shown) based on the use of compression springs mounted on the support structures 198A and 198B. The pins 195 that provide positional location for the support rods 196 and 196B are mounted on the top and bottom of the ion source chamber 191B.

Figure 20:
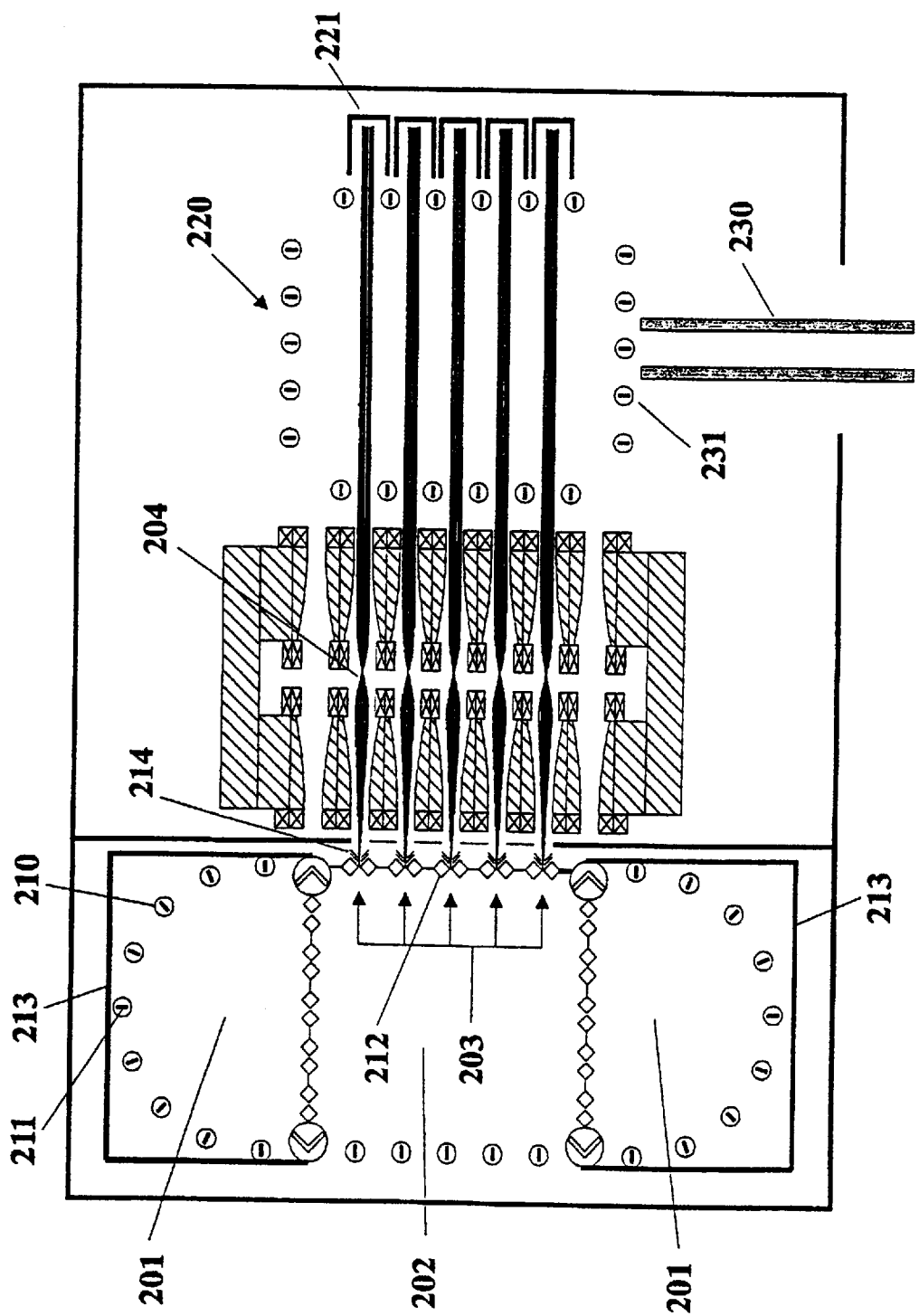
FIG. 20 shows in diagrammatic end view apparatus for generating and analysing a series of charged particle beams, embodying the present invention.

FIGS. 15a and 15b has indicated some of the beamline layouts possible for various requirements. Possibly the most important immediate application is for low energy (500 eV–5 keV) boron implantation of integrated circuit semiconductor wafers. FIG. 20 shows a preferred embodiment for this dedicated application.

FIG. 20 shows the plan view of a 5-beam implanter for the ion implantation of 300 mm wafers. The multicusp ion source consists of 23 circular aluminium tubes 210 containing 12 mm×3 mm section neodynium iron boron permanent magnets 211 which provide the real pole magnetic containment of the source plasma and 5 virtual poles formed by electrical conductors in square external section aluminium tubes 212 carrying a current of approximately 500A total, shared by any convenient number of conductors in series. Beam is extracted from 5 virtual poles 203. These square section tubes are held in tension by compression springs so that the 2 mm wide extraction slot can be held accurately parallel over the entire length of these virtual pole electrodes and particularly along the extraction length of 40 cm. The source plasma is created using a low voltage hot filament discharge or by utilising microwave ionisation in the source regions 201, and the beam is extracted from the central source region 202 through the virtual poles 203. The source gas or vapour is contained within a thin walled aluminium box 213. The end plates of the source contain a permanent magnet array to complete the multicusp containment. The magnets and conductors are cooled by flowing coolant in the tubes. This method of construction makes large sources of this type extremely straightforward to construct, there being virtually no limit to the size of source which can be made.

It would be a simple modification to make this source 'double sided', with two 5-beam extraction systems and beamlines on opposite sides of the source.

The ion beams are extracted by variable geometry, tensioned extraction electrodes 214 (to keep them straight) into the magnetic line lens system. A single line lens 204 in the strong focus mode analyses and transmits a parallel beam to the target region, which has a controlled plasma environment contained within a multicusp cage 220 (which provides confinement for surface charge neutralising plasma which can be generated by beam interaction with the target or by other means, such a hot filament discharge), constructed in a similar way to the ion source. On the other side of this cage are beam profile Faraday systems 221 which are used to set up the beam profile, the position of the extraction electrodes being the major variable affecting the uniformity of the beams arriving at the target region. The multiple beam nature of this system has the advantage that whatever small non-uniformities are present in the beam due to mechanical tolerance issues will tend to be averaged out over in a multi-beam implant. The schematic representation of the 300 mm wafer holders 230 gives an indication of scale. These holders carry 300 mm wafers through the target region, passing between the real pole tubes 231.

There is a significant time needed to load a wafer onto the wafer holder or holders and, from a commercial point of view, this leads to an undesirable loss of wafer throughput performance. It is important to be able to use the available beam current as efficiently as possible. In FIG. 3B, it can be seen that the analysis technique results in a displacement of the beam in the ribbon plane. For positively charged ions, and with the field direction in the first gap in the positive y-direction (upwards) and the field direction in the second gap in the negative y-direction, the displacement of the beam is to the right. If the field directions are reversed, this displacement will be to the left. If the beam displacement is more than half the ribbon beam width, then field reversal results in two separated beam trajectories. This allows a system geometry where there are two separated target regions. While the ion beam is directed into one of the target regions, the other target region can be involved with the unload/reload process. Provided that the loading process takes less time than the required 'beam-onto-target' time, then very efficient beam utilisation is possible, the only loss of beam utilisation being the short period of time necessary for mass selection optimisation after field reversal.

In a system with more than one line lens, the beam displacements can be arranged to either maximise or minimise the final resultant displacement or with more than two line lenses, useful intermediate displacements can lead to more than two positions being available. The polarity of one or more of these line lenses can be reversed to achieve the required separated beam trajectories.

REFERENCES

[1] The Physics and Technology of Ion Sources, Ed. Ian G Brown, John Wiley & Sons (1989), Chapter 3, Ion Extraction, R Keller.
[2] J H Freeman, Proc. Roy. Soc. A.311, 123–130 (1969)
[3] J H Freeman, Proc. Int. Mas Spectrosc. Conf., Kyoto, Japan (1969)
[4] Ref [1], p46.
[5] D Aitken, Ion Implantation Techniques, Ed. H Ryssel & H Glawischnig, Springer-Verlag (1982), p351.
[6] U.S. Pat. No. 4,578,589
[7] H A Enge, Rev. Sci. Instr., 15, 278 (1964)
[8] Introduction to Electron and Ion Optics, P Dahl, Academic Press (1973), p51
[9] Ref [8], p68
[10] H Ito & N Bryan, Proc. 11$^{th}$ Int. Conf. Ion Impl. Tech., USA, p323 (1996)
[11] J England et al., Proc. 11$^{th}$ Int. Conf. Ion Impl. Tech., USA, p470 (1996)
[12] Ref [8], p26.

What is claimed is:

1. Apparatus for acting upon charged particles differently in dependence upon different values of at least one parameter of the particles, said parameter being selected from the group comprising mass, energy, and charged state, of a particle, said apparatus comprising:

an array of magnetic poles constructed and arranged to give parameter dependent dispersion of charged particles moving in the magnetic pole array whereby parameter dependent selection of charged particles may be achieved;

said array of magnetic poles having a virtual reference surface providing a reference for the arrangement of components of the apparatus, said virtual reference surface passing through said array of magnetic poles with at least one magnetic pole on each side of said reference surface;

a beam source constructed and arranged to provide a beam of charged particles in the field of said magnetic pole array, said beam having at any given position across the beam an initial general direction of propagation of the beam and having an elongate cross-section perpendicular to said initial general direction of propagation;

said virtual reference surface being a virtual surface selected from the group comprising (I) a surface defined as extending in said direction of elongation of said beam cross-section and also containing said initial direction of propagation of said beam at any position across the beam, and (II) a surface defined as extending in said direction of elongation of said beam cross-section and also parallel to said initial general direction of propagation of the beam at any position across the beam; and resolving structure constructed and arranged to select required particles from said beam by said parameter dependent dispersion;

said magnetic poles being elongate poles extending in a direction of elongation which lies in said virtual reference surface and which is transverse to said initial general direction of propagation of said beam;

said beam source being constructed and arranged in such a manner that said charged particles of said beam moving in the field of the magnetic pole array have an initial general direction of movement which is selected from the group comprising (I) a direction which is in said reference surface and which is other than said direction of elongation of said magnetic pole array, and (II) a direction which is substantially parallel to said reference surface and which is other than said direction of elongation of said magnetic pole array, said initial direction being selected from the group comprising an initial direction of particles entering into the field of the magnetic pole array, and an initial direction of particles originating in the field of the magnetic pole array;

said magnetic poles being constructed and arranged in such a manner that, in a plane perpendicular to said direction of elongation of said array, said magnetic poles have a physical geometry which is constant along said direction of elongation of the array and have a magnetic field distribution which is constant along said direction of elongation of the array, and said magnetic poles being constructed and arranged to give parameter dependent focusing action in a plane perpendicular to said virtual reference surface to give selection of particles by parameter dependent dispersion and focusing of different particles of said beam in dependence upon different values of said parameters.

2. Apparatus according to claim 1 in which the virtual reference surface is a plane and the arrangement of magnetic poles on one side of the virtual reference surface has a physical geometric symmetry with the arrangement on the other side of the virtual reference surface.

3. Apparatus according to claim 1 in which the array of magnetic poles is such as to provide between physically opposed poles at least one transverse field region of magnetic field with a magnetic field direction transverse to the virtual reference surface, said at least one transverse field region of magnetic field having boundary regions comprising entry and exit regions associated with individual opposed poles in the array and leading to and exiting from the transverse field region of magnetic field respectively, the boundary regions providing curved magnetic fields which are curved in a plane perpendicular to the virtual reference surface, said regions of magnetic field being such that the charged particles of the beam moving in said transverse field region have a curved motion imposed thereon by the transverse field region of magnetic field, and pass through the curved field of at least one boundary region at an angle to the normal to the boundary region so as to provide parameter dependent focusing action of said beam of charged particles.

4. Apparatus according to claim 3 in which the transverse field of magnetic field region also has curved magnetic fields curved in a plane perpendicular to the virtual reference surface.

5. Apparatus according to claim 3 in which there are provided at least two transverse field regions, the said regions comprising at least an initial transverse field region of magnetic field and a final transverse field region of magnetic field and, where more than two transverse field regions are provided, also comprising at least one intermediate region, and the beam source is arranged to provide charged particles in the initial transverse field region;

the magnetic poles having a shape and interrelationship in a plane perpendicular to the said direction of elongation such as to give parameter dependent curved motion to charged particles of the beam moving in the initial transverse field region of magnetic field, said charged particles leaving this transverse field region of magnetic field at an angle to the normal to the direction of elongation of the array, passing through any intermediate transverse field regions of the array, and moving into the final transverse field region of magnetic field; successive of said transverse field regions being of alternate polarity.

6. Apparatus according to claim 5 in which the physical geometry of the magnetic poles and the magnitude of the magnetic fields are substantially symmetrical about a plane perpendicular to the reference surface.

7. Apparatus according to claim 5 in which the array of magnetic poles comprises a quadrupole having two magnetic poles on each side of the reference plane.

8. Apparatus according to claim 7 arranged in such a manner that parameter dependent collection of charged particles may be achieved by placing a collector on the quadrupole axis.

9. Apparatus according to claim 5 in which the magnetic pole array is constructed and arranged such as to produce multiple cross-overs of the beam through multiple apertures in the resolving structure for increased resolving power and improved line of sight characteristics.

10. Apparatus according to claim 3 in which the magnetic pole array is constructed and arranged in such a manner that the beam leaving the array of magnetic poles is substantially laterally displaced in the virtual reference surface such that reversing all magnetic field directions displaces the beam in the opposite direction, the width of the beam relative to these displacements being such that two separated beam trajectories are produced so as to allow the use of two separated target regions.

11. Apparatus according to claim 3 which the arrangement is such that said charged particles move in parameter dependent curved trajectories in the magnetic field of said at least one transverse field region with relatively high curvature trajectories staying within the transverse field region and being reflected from it, and relatively low curvature trajectories passing through the transverse field region, whereby parameter dependent dispersion of particles is achieved by a focusing action on reflected high curvature beam trajectories and a focusing action on transmitted or collected low curvature beam trajectories, the transverse field region acting as a selective reflection mirror.

12. Apparatus according to claim 11 including in the transverse field region an electrically conductive component providing a collecting surface defining the lowest curvature trajectory which can be reflected.

13. Apparatus according to claim 11 in which the array of magnetic poles is positioned to deflect an ion implantation beam entering the array in a non vertical direction, and arranged to deflect the beam so as to exit the said field in a substantially vertical direction for ion implantation into a subsequent substantially horizontal target.

14. Apparatus according to claim 1 in which the said direction of elongation of the array of magnetic poles is rectilinear.

15. Apparatus according to claim 1 in which the said direction of elongation of the array of magnetic poles lies along a circle.

16. Apparatus according to claims 1 in which the resolving structure is constructed and arranged to select a required particles from the beam by parameter dependent dispersion by focusing of different particles of the beam at different focal points in a plane perpendicular to the reference surface, in dependence upon different values of the said parameters.

17. Apparatus according to claim 1 in which the resolving structure includes at least one barrier for removal of undesired particles.

18. Apparatus according to claim 17 in which the said at least one barrier is placed in the virtual reference surface.

19. Apparatus according to claim 17 in which the apparatus includes an elongate element aligned along the elongate cross-section axis of the beam which is used to intercept charged particle beams, to influence the behavior of the charged particle beam, and which is thereby subject to deterioration by contact with the charged particles, including a device constructed and arranged to move the elongate element in the direction of its elongate axis to replace the parts thereof which have deteriorated due to contact with the charged particles.

20. Apparatus according to claim 17 in which the apparatus includes an elongate element which is used to influence the behavior of the charged particle beam, the apparatus including a tensioner to tension the elongate element to keep it straight.

21. Apparatus according to claim 1 in which the resolving structure includes an analysis aperture at a focal point of a desired particles in the particle beam (314).

22. Apparatus according to claim 1 including a transmission limiting structure positioned in at least one plane transverse to the general direction of propagation of a focused beam through the resolving structure, to prevent transmission of particles following trajectories beyond the range obstructed by the said resolving structure.

23. Apparatus according to claim 1 including an extraction assembly to extract positively charged particles from an elongate charged particle source which is elongate in a direction transverse to the general direction of extraction of the particles, the extraction assembly having an accelerating region followed by a decelerating region to produce a charged particle beam the optics of which are significantly influenced by the space charge of the extracted charged particles;

the assembly including an elongate element of conducting material at a selected potential, situated at the center of the beam and parallel to the elongate axis of the source region, and positioned in a region selected from the group comprising said electrostatically decelerating field region for positive ions, and a field free region;

the arrangement being such that the presence of secondary electrons produced by charged particles striking the elongate element, and the presence of the element acting as an electrode, combine to reduce the space charge at the center of the beam, thus increasing the beam current that can be usefully extracted.

24. Apparatus according to claim 1 in which the magnetic pole array is such that the beam of charged particles is focussed to at least one cross-over and the position of the cross-over of required particles is chosen to be within the magnetic field of the array so that subsequent further focusing action of the required particles is carried out after the said cross-over point by the effect of the magnetic field of the array.

25. Apparatus according to claim 1 including at least one further array of elongate magnetic poles and associated resolving structures arranged to produce parameter dependent focusing of the beam exiting the first array, whereby a combination of components of the arrays obscures line of sight through the combined system for contamination particles.

26. Apparatus according to claim 1 in which there are provided a plurality of beam systems with regularly spaced respective reference surfaces each sharing at least part of a common magnetic circuit with neighboring systems.

27. Apparatus according to claim 1 in which said beam of charged particles is a ribbon beam.

28. Apparatus according to claim 27 in which a cross-sectional shape of said magnetic poles along said direction of elongation of the array is not dependent on a width of the ribbon beam.

29. Apparatus according to claim 1 in which said resolving structure includes a substantially flat plate having a plane being substantially parallel to the virtual reference surface.

30. Apparatus according to claim 29 in which the substantially flat plate includes an aperture therein, wherein a plane of the aperture is contained substantially within or parallel to the virtual reference surface.

31. Apparatus according to claim 1 in which the beam of particles having a predetermined mass, energy and charge state is focused by lens action towards a substantially stable and constant position for subsequent processing.

32. A method of acting upon charged particles differently in dependence upon different values of at least one parameter of the particles, said parameter being selected from the group comprising mass, energy, and charged state, of a particle, said method comprising:

providing a beam of charged particles in the field of a magnetic pole array, the beam having at any given position across the beam an initial general direction of propagation of the beam and having an elongate cross-section perpendicular to the initial general direction of propagation of the beam;

the array of magnetic poles having a virtual reference surface for providing a reference for the steps of the method, said virtual reference surface being a virtual surface selected from the group comprising (I) a surface defined as extending in said direction of elongation of said beam cross-section and also containing said initial direction of propagation of said beam at any position across the beam, and (II) a surface defined as extending in said direction of elongation of said beam cross-section and also parallel to said initial general direction of propagation of the beam at any position across the beam; the virtual reference surface passing through the array with at least one magnetic pole on each side of the reference surface;

the magnetic poles being elongate poles extending in a direction of elongation of the array which lies in the virtual reference surface and which is transverse to the initial general direction of propagation of the beam, and said magnetic poles being constructed and arranged in such a manner that, in a plane perpendicular to said direction of elongation of said array, said magnetic poles have a physical geometry which is constant along said direction of elongation of the array and have a magnetic field distribution which is constant along said direction of elongation of the array;

arranging the said charged particles to move in the field of the magnetic pole array with an initial general direction of movement which is selected from the group comprising (I) a direction which is in said reference surface and which is other than said direction of elongation of said magnetic pole array, and (II) a direction which is substantially parallel to said reference surface and which is other than said direction of elongation of said magnetic pole array, said initial direction being selected from the group comprising an initial direction of particles entering into the field of the magnetic pole array, and an initial direction of particles originating in the field of the magnetic pole array;

producing parameter dependent dispersion of the charged particles moving in the magnetic pole array by producing parameter dependent focusing action in a plane perpendicular to the virtual reference surface by dispersing and focusing different particles of the beam in dependence upon different values of said parameters for different particles; and selecting required particles from the beam by the said parameter dependent focusing action.

33. A method according to claim 32 including:

providing between physically opposed poles of said array of magnetic poles at least one transverse field region of magnetic field with a magnetic field direction transverse to the virtual reference surface, said at least one transverse field region of magnetic field having boundary regions comprising entry and exit regions associated with individual opposed poles in the array and leading to and exiting from the transverse field region of magnetic field respectively, the entry and exit regions providing curved magnetic fields which are curved in a plane perpendicular to the virtual reference surface;

imposing on charged particles moving in said at least one transverse field region a curved motion imposed thereon by the transverse field region; and directing said charged particles to pass through the curved field of at least one boundary region at an angle to the normal to the boundary region in such a manner as to provide parameter dependent focusing action on said beam of charged particles.

34. A method according to claim 33 including:

in which the said regions comprise at least two transverse field regions, the said regions comprising an initial transverse field region of magnetic field and a final transverse field region of magnetic field and, where more than two transverse field regions are provided, also comprising at least one intermediate region;

the method including:

providing charged particles in the initial transverse field region;

imposing parameter dependent curved motion on charged particles moving in the initial transverse field region, the particles leaving this transverse field region of magnetic field at an angle to the normal to the direction of elongation of the array, passing through any intermediate transverse field regions of the array, and moving into the final transverse field region of magnetic field; and acting upon said particles by successive of said transverse field regions of alternate polarity.

35. A method according to claim 33 including:

moving said charged particles in parameter dependent curved trajectories in said at least one transverse field of magnetic field, and arranging that relatively high curvature trajectories stay within the said transverse field region and are reflected from it, whereby achieving parameter dependent separation of beams by reflection and focusing of relatively high curvature beam trajectories and transmission of relatively low curvature beam trajectories, the transverse field region acting as a selective reflection mirror.

36. A method according to claim 32 including:

selecting required particles from the beam by parameter dependent dispersion by focusing of different particles of the beam at different focal points in a plane perpendicular to the reference surface, in dependence upon different values of the said parameters.

37. A method according to claim 32 including:

focusing the beam of charged particles to at least one cross-over, the position of the cross-over of required particles being within the magnetic field of the array; and subsequently effecting further focusing action of the required particles after the said cross-over point, by the effect of the magnetic field of the array.

38. A method according to claim 32 in which the array of magnetic poles comprises a quadrupole having two magnetic poles on each side of the reference plane, and the method includes parameter dependent collection of charged particles in collector structure on the quadrupole axis.

39. A method according to claim 32 including producing, by at least one further array of elongate magnetic poles and associated resolving structures, parameter dependent focusing of the beam exiting the first array; and by a combination of components of the arrays, obscuring line of sight through the combined system for contamination particles.

40. Apparatus for acting upon charged particles differently in dependence upon different values of at least one parameter of the particles, said parameter being selected from the group comprising mass, energy, and charged state, of a particle, said apparatus comprising:

an array of magnetic poles constructed and arranged to give parameter dependent dispersion of charged particles moving in the magnetic pole array whereby parameter dependent selection of charged particles may be achieved;

said array of magnetic poles having a virtual reference surface providing a reference for the arrangement of components of the apparatus, said virtual reference surface passing through said array of magnetic poles with at least one magnetic pole on each side of said reference surface;

a beam source constructed and arranged to provide a beam of charged particles in the field of said magnetic pole array, said beam having at any given position across the beam an initial general direction of propagation of the beam and having an elongate cross-section perpendicular to said initial general direction of propagation;

said virtual reference surface being a virtual surface selected from the group comprising (I) a surface defined as extending in said direction of elongation of said beam cross-section and also containing said initial direction of propagation of said beam at any position across the beam, and (II) a surface defined as extending in said direction of elongation of said beam cross-section and also parallel to said initial general direction of propagation of the beam at any position across the beam; and resolving structure constructed and arranged to select required particles from said beam by said parameter dependent dispersion;

said magnetic poles being elongate poles extending in a rectilinear direction of elongation which lies in said virtual reference surface and which is transverse to said initial general direction of propagation of said beam;

said beam source being constructed and arranged in such a manner that said charged particles of said beam moving in the field of the magnetic pole array have an initial general direction of movement which is selected from the group comprising (I) a direction which is in said reference surface and which is other than said direction of elongation of said magnetic pole array, and (II) a direction which is substantially parallel to said reference surface and which is other than said direction of elongation of said magnetic pole array, said initial direction being selected from the group comprising an initial direction of particles entering into the field of the magnetic pole array, and an initial direction of particles originating in the field of the magnetic pole array;

said magnetic poles being constructed and arranged in such a manner that, in a plane perpendicular to said direction of elongation of said array, said magnetic poles have a physical geometry which is constant along said direction of elongation of the array and have a magnetic field distribution which is constant along said direction of elongation of the array, and said magnetic poles being constructed and arranged to give parameter dependent focusing action in a plane perpendicular to said reference surface to give selection of particles by parameter dependent dispersion and focusing of different particles of said beam in dependence upon different values of said parameters;

said array of magnetic poles being such as to provide between physically opposed poles at least one transverse field region of magnetic field with a magnetic field direction transverse to the virtual reference surface, said at least one transverse field region of magnetic field having boundary regions comprising entry and exit regions associated with individual opposed poles in the array and leading to and exiting from the transverse field region of magnetic field respectively, the boundary regions providing curved magnetic fields which are curved in a plane perpendicular to the virtual reference surface, said regions of magnetic field being such that the beams of charged particles of the beam moving in said transverse field region have a curved motion imposed thereon by the transverse field region of magnetic field, and pass through the curved field of at least one boundary region at an angle to the normal to the boundary region so as to provide parameter dependent focusing of said beam of charged particles.

41. Apparatus according to claim 40 in which there are provided at least two transverse field regions, the said regions comprising at least an initial transverse field region of magnetic field and a final transverse field region of magnetic field and, where more than two transverse field regions are provided, also comprising at least one intermediate region, and the beam source is arranged to provide charged particles in the initial transverse field region;

the magnetic poles having a shape and interrelationship in a plane perpendicular to the said direction of elongation such as to give parameter dependent curved motion to charged particles of the beam moving in the initial transverse field region of magnetic field, said charged particles leaving this transverse field region of magnetic field at an angle to the normal to the direction of elongation of the array, passing through any intermediate transverse field regions of the array, and moving into the final transverse field region of magnetic field; successive of said transverse field regions being of alternate polarity.

42. Apparatus according to claim 40 in which the magnetic pole array is such that the beam of charged particles is focussed to at least one cross-over and the position of the cross-over of required particles is chosen to be within the magnetic field of the array so that subsequent further focusing action of the required particles is carried out after the said cross-over point by the effect of the magnetic field of the array.

43. Apparatus for selection of particles of at least one beam of charged particles in dependence upon a parameter including at least one of mass, energy and charged state of the particles, the apparatus comprising:

an array of elongate magnetic poles extending longitudinally in a direction of elongation of the array, the array having a reference surface extending in the direction of elongation of the array of magnetic poles and passing through the array with at least one magnetic pole on each side of the reference surface, the magnetic poles having a configuration in a plane perpendicular to the direction of elongation such as to give parameter dependent focusing action of the at least one beam passing through the magnetic pole array with a general direction of propagation that is at least one of in and substantially parallel to the reference surface, and other than a direction of elongation of the magnetic pole array, the configuration of the magnetic pole array being such as to produce focusing action towards a cross-over point, the position of which is parameter dependent;

a resolving structure provided at or near the cross-over point, the resolving structure including an aperture through which selected particles may be transmitted; and a transmission limiting structure positioned in at least one plane transverse to the general direction of propagation of a focused beam through the resolving structure, to prevent transmission of particles following trajectories beyond a range obstructed by the resolving structure.

* * * * *